(12) United States Patent
Matsui

(10) Patent No.: US 6,307,410 B1
(45) Date of Patent: Oct. 23, 2001

(54) SEMICONDUCTOR INTEGRATED CIRCUIT DEVICE

(75) Inventor: Yoshinori Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/521,474

(22) Filed: Mar. 8, 2000

(30) Foreign Application Priority Data

Mar. 9, 1999 (JP) .................................................. 11-062393

(51) Int. Cl.[7] ...................................................... H03L 7/00
(52) U.S. Cl. ............................................ 327/154; 327/212
(58) Field of Search .................................. 327/141, 154, 327/199, 211, 212

(56) References Cited

U.S. PATENT DOCUMENTS 6,038,648 * 3/2000 Nakoaka ............................. 711/200
6,075,749 * 6/2000 Isa ....................................... 365/233

* cited by examiner

Primary Examiner—Toan Tran
Assistant Examiner—Cassandra Cox
(74) Attorney, Agent, or Firm—Sughrue, Mion, Zinn, Macpeak & Seas, PLLC

(57) ABSTRACT

The semiconductor integrated circuit device of the present invention for accepting an external signal synchronously with an external clock signal, comprises: an internal clock signal circuit for detecting a change in the external clock signal and generating an internal clock signal having a predetermined pulse width; a latch circuit for accepting the external signal in advance and latching the external signal for the period of time corresponding to the predetermined pulse width according to the internal clock signal; and an internal signal generating circuit for generating an internal signal which reflects the logic of the external signal and has the predetermined pulse width, according to the internal clock signal.

6 Claims, 69 Drawing Sheets

FIG. 4

PIN ARRANGEMENT

64M DRAM+16K SRAM (×8)

| | | | | |
|---|---|---|---|---|
| Vcc | 1 | | 54 | Vss |
| DQ0 | 2 | | 53 | DQ7 |
| VccQ | 3 | | 52 | VssQ |
| NC | 4 | | 51 | NC |
| DQ1 | 5 | | 50 | DQ6 |
| VssQ | 6 | | 49 | VccQ |
| NC | 7 | | 48 | NC |
| DQ2 | 8 | | 47 | DQ5 |
| VccQ | 9 | | 46 | VssQ |
| NC | 10 | | 45 | NC |
| DQ3 | 11 | 54pin | 44 | DQ4 |
| VssQ | 12 | 400mil x 875mil | 43 | VccQ |
| NC | 13 | 0.8mm Pitch | 42 | NC |
| Vcc | 14 | TSOP II | 41 | Vss |
| NC | 15 | | 40 | NC, VREF |
| /WE | 16 | | 39 | DQM |
| /CAS | 17 | | 38 | CLK |
| /RAS | 18 | | 37 | CKE |
| /CS | 19 | | 36 | NC |
| A13 (BA) | 20 | | 35 | A11 |
| A12 | 21 | | 34 | A9 |
| A10 (AP) | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

FIG. 5

CORRESPONDENCE BETWEEN COMMANDS AND INPUT TERMINAL STATES

| COMMAND | CKE n-1 | CKE n | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|
| READ | H | x | L | H | L | H | x | x | x | SRAM COLUMN SELECTION | | | | | | x | SRAM ROW SELECTION | | | |
| WRITE | H | x | L | H | L | L | x | x | x | SRAM COLUMN SELECTION | | | | | | x | SRAM ROW SELECTION | | | |
| PREFETCH | H | x | L | H | H | L | BANK SELECTION | x | x | L | L | x | x | DRAM COLUMN SELECTION | | x | SRAM ROW SELECTION | | | |
| PREFETCH (AUTO PRECHARGE) | H | x | L | H | H | L | BANK SELECTION | x | x | H | L | x | x | DRAM COLUMN SELECTION | | x | SRAM ROW SELECTION | | | |
| RESTORE | H | x | L | H | H | L | BANK SELECTION | x | x | L | H | x | x | DRAM COLUMN SELECTION | | x | SRAM ROW SELECTION | | | |
| RESTORE (AUTO PRECHARGE) | H | x | L | H | H | L | BANK SELECTION | x | x | H | H | x | x | DRAM COLUMN SELECTION | | x | SRAM ROW SELECTION | | | |
| ACTIVE | H | x | L | L | H | H | BANK SELECTION | x | x | DRAM ROW SELECTION | | | | | | | | | | |
| PRECHARGE | H | x | L | L | H | L | BANK SELECTION | x | x | L | x | x | x | x | x | x | x | x | x | x |
| ALL BANK PRECHARGE | H | x | L | L | H | L | x | x | x | H | x | x | x | x | x | x | x | x | x | x |
| CBR REFRESH | H | x | L | L | L | H | x | x | x | x | x | x | x | x | x | x | x | x | x | x |
| NON-OPERATION | H | x | L | H | H | H | x | x | x | x | x | x | x | x | x | x | x | x | x | x |
| DEVICE NON-SELECTION | H | x | H | x | x | x | x | x | x | x | x | x | x | x | x | x | x | x | x | x |
| REGISTER SETTING (1) | H | x | L | L | L | L | L | L | L | L | L | L | L | REGISTER SETTING | | | | | | |
| REGISTER SETTING (2) | H | x | L | L | L | L | L | L | L | L | L | L | L | REGISTER SETTING | | REGISTER SETTING | | | | |

H: HIGH LEVEL   L: LOW LEVEL   x: HIGH OR LOW (DON'T CARE)

FIG. 15 [CBR REFRESH COMMAND]
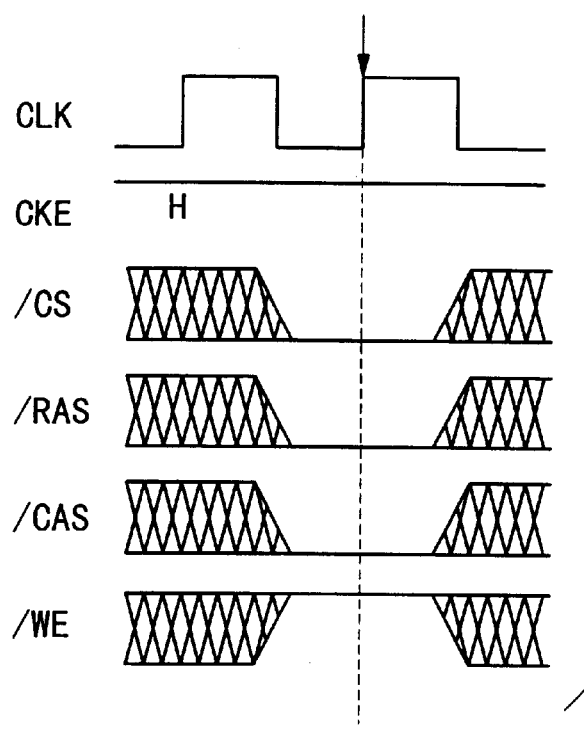
FIG. 16 NON-OPERATION COMMAND
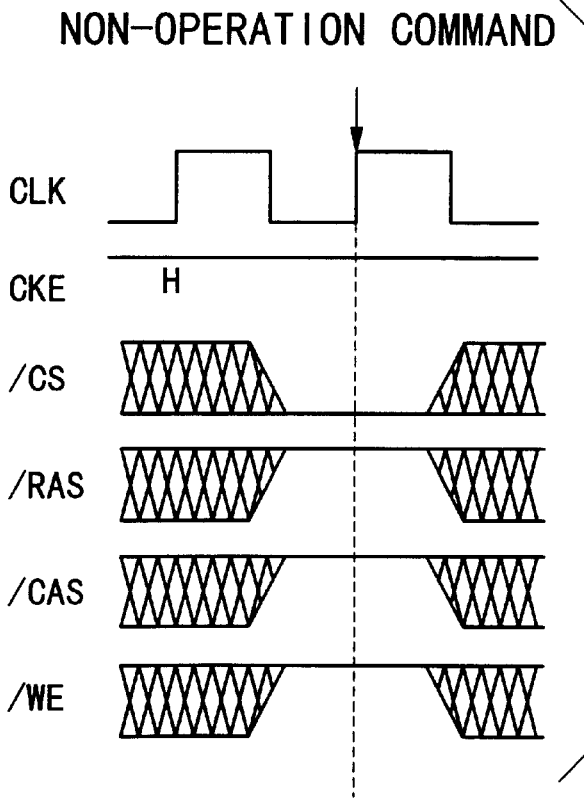

FIG. 17 [DEVICE NON-SELECTION COMMAND]
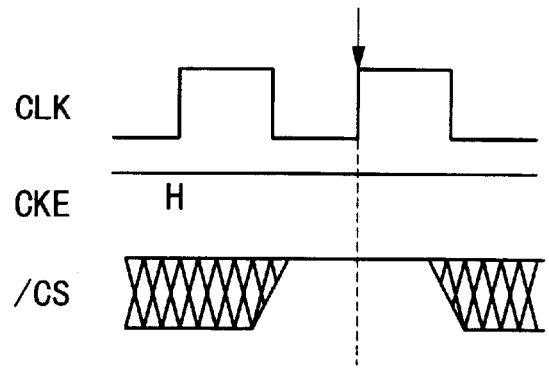
FIG. 18
(1) (1) [MODE REGISTER SETTING (1) COMMAND] OF [REGISTER SETTING COMMAND] (A), (B), (C) AND (D)
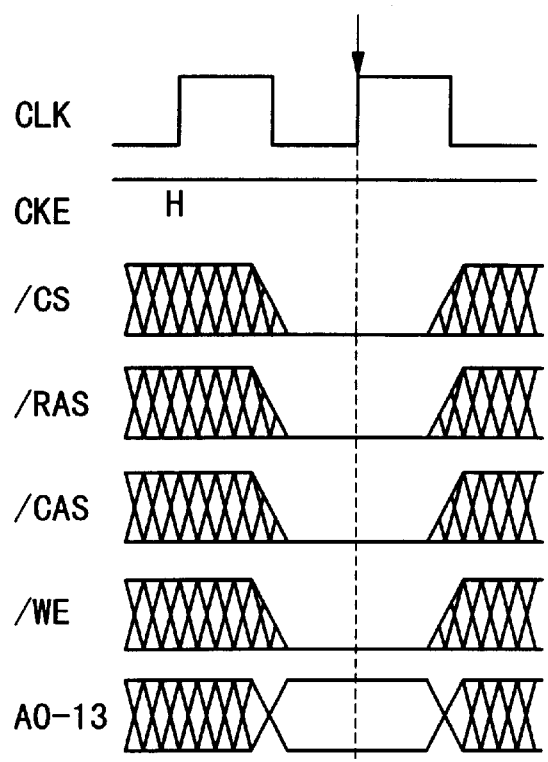

REGISTER SETTING

FIG. 20A

| A13 | A12 | A11 | A10 | A9 | A8 | A7 | A6 | A5 | A4 | A3 | A2 | A1 | A0 | |
|-----|-----|-----|-----|----|----|----|----|----|----|----|----|----|----|---|
| L | L | L | L | L | L | H | x | x | x | x | x | x | x | REFRESH COUNTER TEST SET (STANDARD TEST SET) |

FIG. 20B

| A13 | A12 | A11 | A10 | A9 | A8 | A7 | A6 | A5 | A4 | A3 | A2 | A1 | A0 | |
|-----|-----|-----|-----|----|----|----|----|----|----|----|----|----|----|---|
| | | | | | H | L | | | | | | | | UNUSED TEST SET |

FIG. 20C

| A13 | A12 | A11 | A10 | A9 | A8 | A7 | A6 | A5 | A4 | A3 | A2 | A1 | A0 | |
|-----|-----|-----|-----|----|----|----|----|----|----|----|----|----|----|---|
| x | x | x | x | x | H | H | V | V | V | V | V | V | V | DEVICE TEST SET |

FIG. 20D

| A13 | A12 | A11 | A10 | A9 | A8 | A7 | A6 | A5 | A4 | A3 | A2 | A1 | A0 | |
|-----|-----|-----|-----|----|----|----|----|----|----|----|----|----|----|---|
| L | L | L | L | L | L | L | V | V | V | V | V | V | V | MODE REGISTER SETTING COMMAND |

H: HIGH LEVEL    L: LOW LEVEL
x: INVALID DATA (DON'T CARE)    V: VALID DATA INPUT

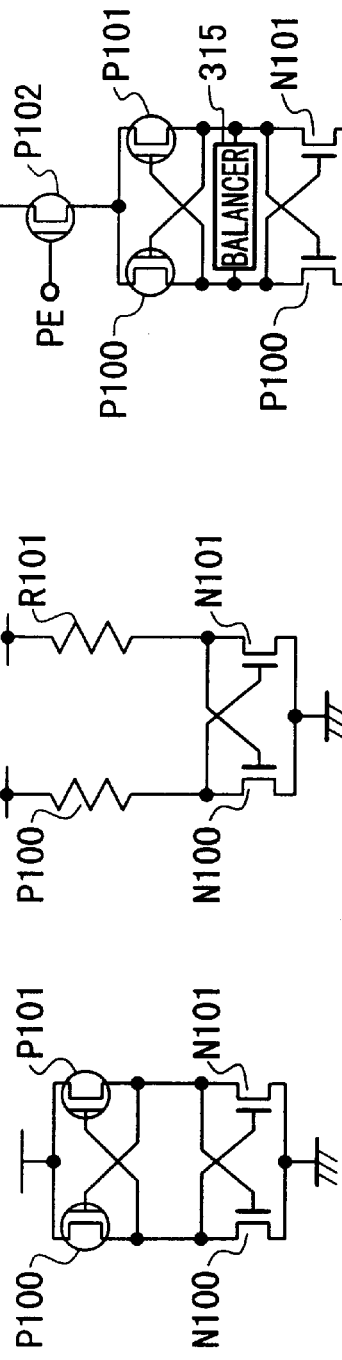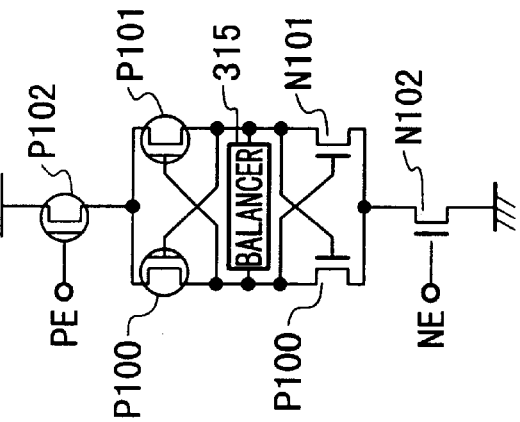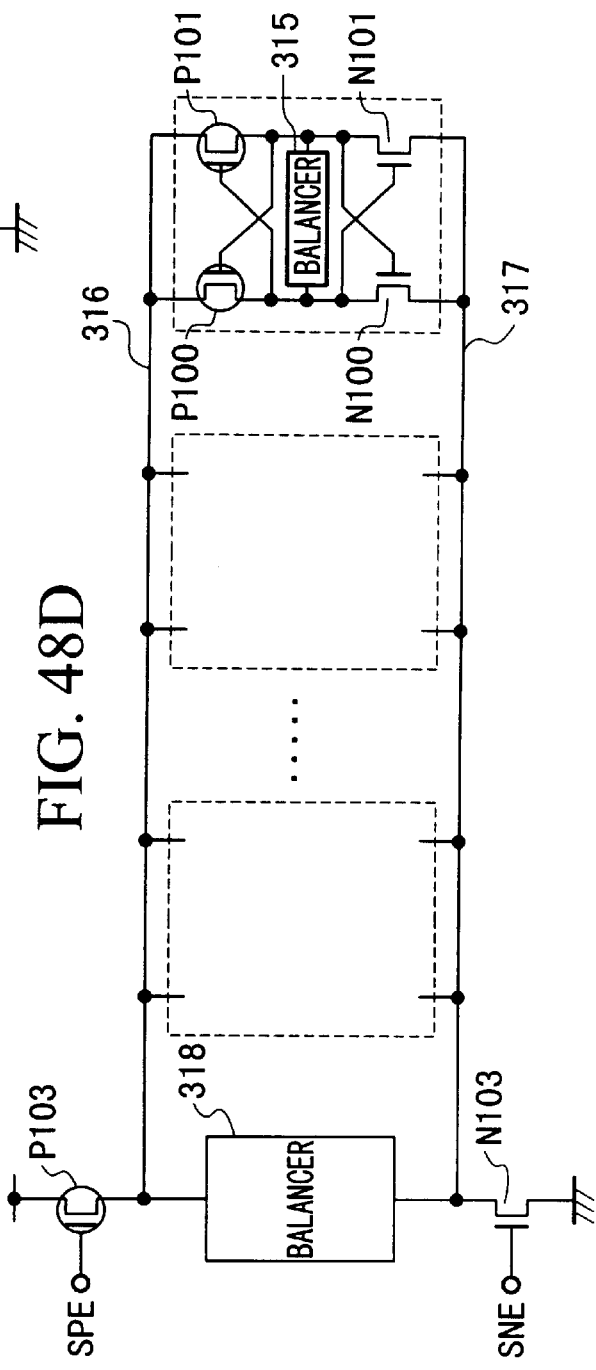

SEMICONDUCTOR INTEGRATED CIRCUIT DEVICE

BACKGROUND OF THE INVENTION

1. Field of the Invention

The present invention relates to a semiconductor integrated circuit device and, particularly, to a semiconductor integrated circuit device having a main memory portion and a sub-memory portion formed in a semiconductor substrate and a data transfer circuit provided between the main memory portion and the sub-memory portion.

This application is based on Japanese Patent Application No. 11-62393, the contents of which are incorporated herein by reference.

2. Description of the Related Art

In general, a relatively low speed, inexpensive semiconductor device having the large memory capacity, such as general purpose DRAM, is used as the main memory in a computer system.

In recent computer systems, the operating speed of a DRAM constituting the main memory is increased along with the increase of the operating speed of the system, particularly, of the MPU. However, the operating speed of the DRAM is still insufficient and, in order to solve this problem, it is usual to provide a sub-memory between the MPU and the main memory. Such a sub-memory is generally called as a cache memory and is constructed with a high speed SRAM or an ECLRAM.

The cache memory is generally provided to the MPU externally or internally. Recently, a semiconductor device in which the DRAM constituting the main memory and the cache memory are mounted on the same semiconductor substrate has gained attention. Japanese Unexamined Patent Application, First publication Nos. Sho 57-20983, Sho 607690, Sho 62-38590 and Hei 1-146187 disclose examples of such semiconductor memory. Such semiconductor memory is sometimes called cache DRAM or CDRAM since it includes the DRAM and the cache memory. Data are bi-directionally transferred between the SRAM, which functions as the cache memory, and the DRAM which is the main memory.

These conventional arts have problems such as delays in data transfer operation in a case of cache mis-hit, and techniques which solve such problem has been proposed. Examples of the proposed techniques are disclosed in Japanese Unexamined Patent Applications, First Publication Nos. Hei 4-252486, Hei 4-318389 and Hei 5-2872. In the techniques, a latch or register function is provided in a bi-directional data transfer circuit between a DRAM portion and an SRAM portion, so that data transfer from the SRAM portion to the DRAM portion and data transfer from the DRAM portion to the SRAM portion can be done simultaneously, and the speed of data transfer (copy back) at the cache his-hit can be increased.

The above mentioned technique, however, has a limitation in the number of the circuits and in the number of the transfer bus lines because the bi-directional transfer gate circuit occupies a significant part of the area. Therefore, the number of bits which can be transferred between the DRAM array and the SRAM array at a time is limited to 16 bits. In general, as the number of bits transferred at a time decreases, the cache hit rate decreases.

Further, there is the recent problem of degradation of the cache hit rate when there are access requests from a plurality of processing devices as shown in FIG. 70. When the CDRAM or the EDRAM is used for the main memory as shown in FIG. 70 and there are access requests from a plurality of processing devices (memory masters), the cache hit rate is lowered and the speeding up of the whole system operation is restricted since the number of address requests for different sets (rows) may be increased. As the number of the systems having processing devices is increased, the memory portions must respond not only to one type of an access request but also various types of access requests.

In addition to the above-mentioned problem, this type of semiconductor memory receives an address signal synchronously with an external clock, and has the problem in that it takes time to generate an internal address signal.

FIG. 71 shows the construction of the circuit for generating the internal address signal within the conventional semiconductor memory. As shown in FIG. 71, a clock signal CLK, an external address signal Ai, various control signals CSB, RASB, CASB, and WEB are input through receiver circuits 6001 to 6006. The receiver circuits 6001 to 6006 convert these external signals into signals suitable for handling within the device. The clock signal CLK, which is input through the receiver circuit 6001, is input into an internal clock signal generating circuit 6010, which then generates an internal clock signal ICLK having a predetermined duty.

The address signal Ai, which is input through the receiver circuit 6002, is latched in an address latch circuit 6011, which then generates an internal address signal IAi. The various control signals CSB, RASB, CASB, and WEB are input into a command latch circuit 6012, which then generates a read/write command signal and an active command signal. A read/write signal generating circuit 6013 receives the read/write command signal, and generates a read/write signal and a column address latch signal. An active signal generating circuit 6014 receives the active command signal, and generates an active signal and a row address latch signal.

A column address latch circuit 6020 uses the column address latch signal from the read/write signal generating circuit as the trigger, latches the internal address signal LAi from the address latch circuit, and generates a column address signal Yi. This column address signal Yi is input into a counter circuit 6021, which then generates a counter output address signal. The counter output address signal is input into a column address latch circuit 6020 and is used, for example, as a column address signal in a burst mode. A row address latch circuit 6022 uses the row address latch signal from the active signal generating circuit 6014 as the trigger, latches the internal address signal IAi from the address latch circuit, and generates a row address signal Xi.

FIG. 72 shows the construction of the address latch circuit 6011.

As shown in FIG. 72, the address latch circuit 6011 comprises: a master latch circuit 6011A for allowing the address signal CAi, which is externally input, to pass when the internal clock signal is at a L (low) level, and latching the address signal CAi when the internal clock signal is at a H (high) level; and a slave latch circuit 6011B for allowing the signal from the master to pass when the internal clock signal is at the H level, and latching the signal when the internal clock signal is at the L level. That is, according to this construction, the address signal is latched by the master at the rising edge of the clock signal ICLK, and is latched by the slave at the falling edge of the clock signal ICLK, to thereby output the internal address signal IAi.

FIG. 73 shows the construction of the command latch circuit 6012.

As shown in FIG. 73, the various control signals CCS (control signals corresponding to CSB), CRAS (control signal corresponding to RASB), CCAS (control signal corresponding to CASB), and CWE (control signal corresponding to WEB), which are output from the above-mentioned receiver circuits 6003 to 6006, are latched in master latch circuits 6012A at the rising edge of the internal clock signal ICLK, and their logical product is calculated by a gate circuit 6012B. The signal, obtained from the logical product, is latched in a slave latch circuits 6012C at the falling edge of the internal clock signal ICLK, and the read/write command signal and the active command signal are generated.

FIG. 74 shows the construction of the read/write signal generating circuit.

The internal clock signal ICLK is delayed by a predetermined time by an inverter chain 6013A, and is input into one of the NAND circuits 6013B and 6013C. The above-described read/write command signal and the burst signal for activating the burst mode are input into the other NAND circuits 6013B or 6013C. Signals output from the NAND circuits 6013B and 6013C are input into the NAND circuit 6013D. A signal output from the NAND circuit 6013D is delayed by a predetermined time by an inverter chain 6013E, and becomes the read/write signal.

The internal clock ICLK delayed by the inverter chain 6013A and the read/write command signal is input into a NAND circuit 6013F, and an inverter 6013G outputs it as the column address latch signal. This column address latch signal is input as the trigger to the column address latch circuit 6020. The delay time of the column address latch signal is adjusted in the inverter chain 6013A so that the column address latch signal is activated after the address signal input into the column address latch circuit 6020 is set.

FIG. 75 shows the construction of the column address latch circuit 6020.

As shown in FIG. 75, the column address latch circuit 6020 comprises: a gate circuit 6020A for accepting the internal address signal IAi using the column address latch signal as the trigger; a gate circuit 6020B for accepting the counter output address signal using the counter output address latch signal as the trigger; a flip-flop 6020C for storing output from those gate circuits; and an inverter 6020D. When receiving a pulse signal at H level as the column address latch signal, the column address latch circuit 6020 receives the address signal LAi, stores it in the flip-flop 6020C, and outputs the address signal Yi.

Referring to the waveform chart of FIG. 76, the operation of the conventional internal address generating circuit system will be explained by way of an example of generating the column address signal Yi.

The internal clock generating circuit 6010 generates the internal clock signal ICLK from the external clock signal CLK. According to the internal clock signal ICLK, the address latch circuit 6011 latches the external address signal CAi, generates the internal address signal IAi, and outputs it to the column address latch circuit 6020.

On the other hand, according to the internal clock signal ICLK, the command latch circuit 6012 latches the various control signals CSB, RASB, CASB, and WEB, performs the predetermined logic operation, and outputs the read/write command signal. From the internal clock signal ICLK and the read/write signal, the read/write signal generating circuit 6013 generates the column address latch signal in which the pulse waveform of the internal clock signal ICLK is reflected. The column address latch circuit 6020 uses the column address latch signal as the trigger, latches the internal address signal IAi, and outputs the column address signal Yi.

With this construction of the internal address generating circuit system, the external address signal and the various control signals are latched in the address latch circuit 6011 and the command latch circuit 6012, and then the column address signal and the row address signal are generated according to the operation specified by the control signal. For example, in the process for generating the column address signal Yi, it takes time to generate the column address signal Yi because the external address signal passes through the address latch circuit 6011 which performs the master-slave latch operation according to the clock signal ICLK Further, when the column address latch circuit 6020 latches the internal address signal IAi, the internal address signal IAi must be set. Therefore, the above-described inverter chain 6013A delays the column address latch signal, and, after the internal address signal IAi is set, the column address latch circuit 6020 starts its operation. Thus, the generation of the internal column address signal Yi is further delayed.

BRIEF SUMMARY OF THE INVENTION

It is therefore an object of the present invention to provide a semiconductor integrated circuit device which can quickly respond to an access request from a plurality of memory masters without decreasing a cache hit rate, and which can receive an address signal and various control signals and generate an internal address signal according to the external clock signal at high speed.

In a first aspect of the present invention, a semiconductor integrated circuit device for accepting an external signal (an address signal Ai, or various control signals CSB, RASB, CASB, and WEB) synchronously with an external clock signal (CLK), comprises: an internal clock signal circuit (7010) for detecting a change in the external clock signal and generating an internal clock signal (ICLK) having a predetermined pulse width; a latch circuit (a transfer gate 7032A, an inverter 7032B, and a flip-flop 7032C) for accepting the external signal in advance from the outside and latching the external signal for the period of time corresponding to the predetermined pulse width according to the internal clock signal; and an internal signal generating circuit (a gate circuit 7032G) for generating an internal signal which reflects the logic of the external signal and has the predetermined pulse width, according to the internal clock signal.

In a second aspect of the present invention, a semiconductor integrated circuit device for accepting an external control signal (an address signal Ai, or various control signals CSB, RASB, CASB, and WEB) synchronously with an external clock signal (CLK), comprises: an internal clock signal circuit for detecting a change in the external clock signal and generating an internal clock signal (ICLK) having a predetermined pulse width; a latch circuit (transfer gates 8011A to 8011C, an inverter 8011D, and flip-flops 8011E to 8011G) for accepting the external control signal in advance from the outside and latching the external control signal for the period of time corresponding to the predetermined pulse width according to the internal clock signal; and an internal control signal generating circuit (a NAND circuit 8011H, an inverter 8011J, and an NAND circuit 8011K) for generating an internal signal which reflects the logic of the external control signal and has the predetermined pulse width, according to the internal clock signal.

In a third aspect of the present invention, a semiconductor integrated circuit device in the second aspect, further comprises: an external address signal latch circuit (a transfer gate 8020A, an inverter 8020B, and a flip-flop 8020C) for accepting an external address signal in advance and latching the external address signal for the period of time corresponding to the predetermined pulse width according to the internal clock signal; and n internal address signal generating circuit (a tristate buffer 8020D, and a flip-flop 8020G) or generating an internal address signal which reflects the logic of the external address signal latched in the external address signal latch circuit, according to the internal control signal.

In a fourth aspect of the present invention, a semiconductor integrated circuit device in the second aspect, further comprises: an external address signal latch circuit (a transfer gate 7032A, an inverter 7032B, and a flip-flop 7032C) for accepting an external address signal in advance and latching the external address signal for the period of time corresponding to the predetermined pulse width of the internal clock signal; and an internal address signal generating circuit (a gate circuit 7032G) for generating an internal address signal which reflects the logic of the external address signal latched in the external address signal latch circuit and which has the predetermined pulse width, according to the internal control signal.

In a fifth aspect of the present invention, a semiconductor integrated circuit device in the third or fourth aspect, further comprises: a first latch circuit (a transfer gate 7032A, an inverter 7032B, and a flip-flop 7032C) for accepting the external address signal in advance in parallel with the internal address signal generating circuit, and for latching the external address signal for the period of time corresponding to the predetermined pulse width, according to the internal clock signal; and a second latch circuit (an address latch circuit 70320) for latching a signal having the phase opposite to that of the external address signal latched in the first latch circuit, according to the internal clock signal.

In a sixth aspect of the present invention, a semiconductor integrated circuit device the third or fourth aspect, further comprises a latch circuit (an address latch circuit 70320) for latching a signal having the phase opposite that of the external address signal latched in the internal address signal generating circuit, according to the internal clocks signal.

According to the invention, the semiconductor integrated circuit device detects the change in the external clock signal, generates the internal clock signal having a predetermined pulse width, receives the external signal, and allows the external signal to pass through, according to the internal clock signal, to thereby generate the internal signal having the predetermined pulse width. Therefore, the device can receive an address and various external control signals according to the external clock signal at high speed, and can generate the internal address at high speed.

Further, the semiconductor integrated circuit device can transfer the data bi-directionally between a main memory and a sub memory, detects the change in the external clock signal, generates the internal clock signal having a predetermined pulse width, receives the external address signal, and allows the address signal to pass through, according to the internal clock signal, to thereby generate the address signal for the access to the main memory. Therefore, the device can quickly respond to access requests from a plurality of memory masters. Further, the device can receive the external address signal according to the external clock signal at high speed, and can generate the internal address at high speed.

Moreover, the semiconductor integrated circuit device can transfer the data bi-directionally between a main memory and a sub memory, detect the change in the external clock signal, generate the internal clock signal having a predetermined pulse width, receive the external control signal, allow the signal, which reflects the logic state of the control signal, to pass through, according to the internal clock signal, generate the latch signal for latching the external address signal, and use the latch signal as the trigger to latch the address signal. Therefore, the device can quickly respond to access requests from a plurality of memory masters. Further, the device can receive the external control signal according to the external clock signal at high speed, and can generate the internal address at high speed.

BRIEF DESCRIPTION OF THE DRAWINGS

FIG. 4 shows an arrangement of external terminals of the semiconductor memory device shown in FIG. 1.

FIG. 5 shows a correspondence between various commands determining operating functions of the semiconductor memory device shown in FIG. 1 and the external terminals;

FIG. 15 shows states of the external terminals showing the CBR refresh command shown in FIG. 5.

FIG. 16 shows states of the external terminals showing the device non-selection command shown in FIG. 5.

FIG. 17 shows states of the external terminals showing the non-operation command shown in FIG. 5.

FIG. 18 shows states of the external terminals showing the register setting command (1) shown in FIG. 5.

FIGS. 20(A) to 20 (D) shows states of the external terminals showing the register setting command shown in FIG. 5.

FIGS. 48(A) to 48(D) is a concrete circuit of a flip-flop of the SRAM cell shown in FIG. 47.

DETAILED DESCRIPTION OF THE INVENTION

(1) Basic Construction

A basic construction of an embodiment of the present invention will be described.

A semiconductor integrated circuit device according to the present invention includes a semiconductor memory device and a control device of the semiconductor memory device. The semiconductor memory device includes a main memory portion and a sub memory portion and bi-directional data transfer is possible between the main memory portion and the sub memory portion. The sub memory portion is constructed with a plurality of memory cell groups, each of which is able to function as an independent cache memory. In the semiconductor memory device of the present invention, the number of control terminals and the number of address terminals can be the same as those necessary to control the main memory portion.

The semiconductor integrated circuit device will be described by way of an embodiment which has a synchronous interface having a x8 2-bank constriction including a 64-Mbit DRAM array as the main memory portion and a 16-Kbit SRAM array as the sub memory portion. The present invention is not limited to this embodiment.

(2) Block Diagram

Figure 1:
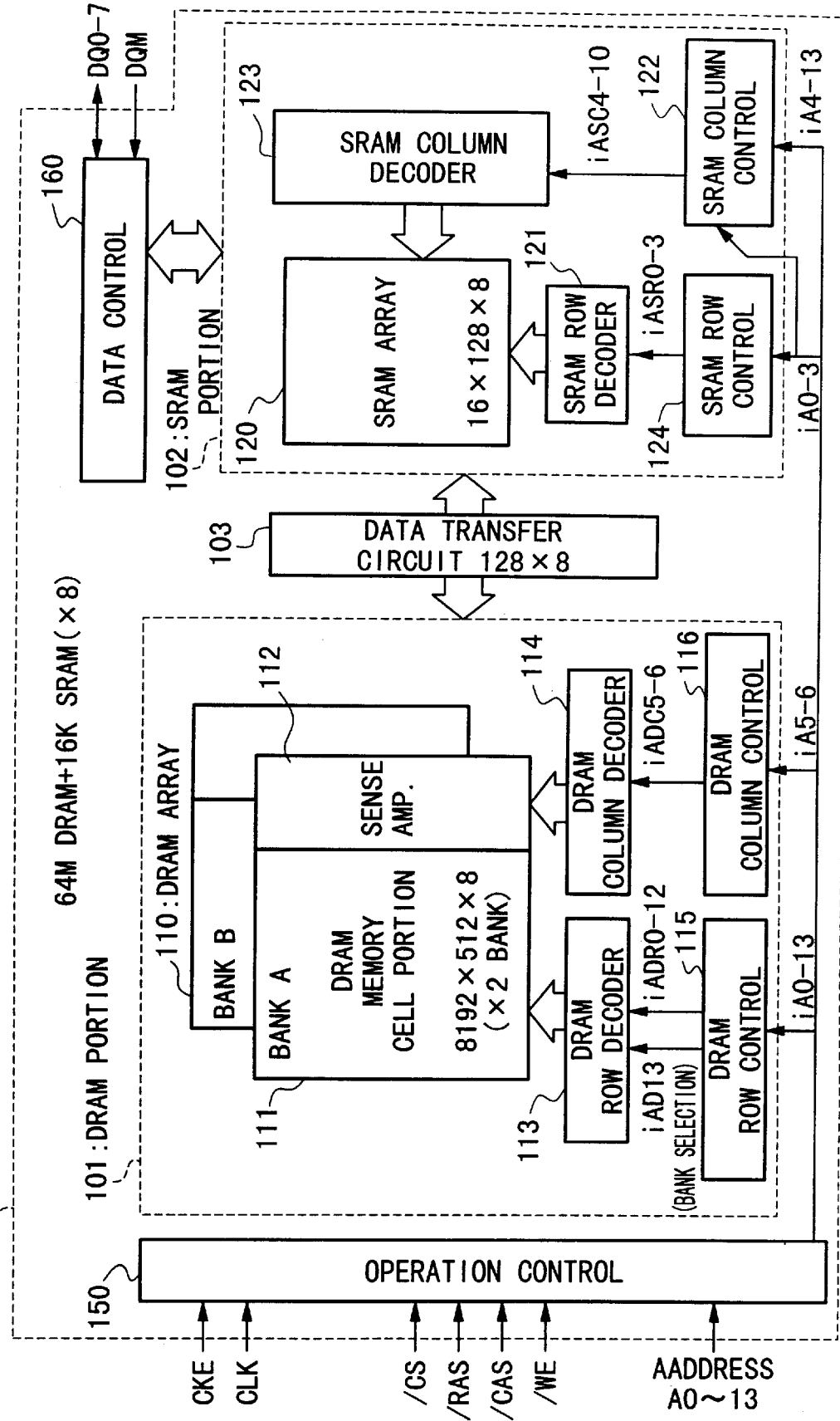
FIG. 1 is a block diagram showing a whole construction of a semiconductor memory device according to a first embodiment of the present invention.

FIG. 1 is a block diagram schematically showing a construction of a whole semiconductor memory device according to an embodiment of the present invention. In FIG. 1, the semiconductor memory device 100 includes a dynamic RAM (DRAM) portion 101 as a main memory portion, a static RAM (SRAM) portion 102 as a sub memory portion, and a bi-directional data transfer circuit 103 for data transfer between the DRAM portion 101 and the SRAM portion 102.

The DRAM portion 101 includes a DRAM array 110 having a plurality of dynamic memory cells arranged in a row and column matrix, a DRAM row control circuit 115 for generating a DRAM row selection signal and a bank selection signal from internal address signals iA0 to iA13, a DRAM row decoder 113 responsive to the DRAM row selection signals IADR0 to iADR12 and the bank selection signal iAD13 for selecting a corresponding row of the DRAM array 110, a DRAM column control circuit 116 for generating a DRAM column selection signal from the internal address signals iA5 and iA6, and a DRAM column decoder 114 responsive to the DRAM column selection signals iADC5 and iADC6 for selecting a corresponding column.

Further, the DRAM array 110 includes a memory cell portion 111 and a sense amplifier 112 for detecting and amplifying data held in the selected DRAM cell. Further, the DRAM array 110 is divided to a plurality of blocks called banks and, in this embodiment, to two banks A and B one of which is selected by the bank selection signal iAD13.

The SRAM portion 102 includes an SRAM array 120 having a plurality of static memory cells arranged in a row and column matrix, an SRAM row control circuit 124 for generating an SRAM row selection signal from the internal address signals iA0 to iA3, an SRAM row decoder 121 responsive to SRAM row selection signals iASR0 to iASR3 for selecting one of SRAM cell groups (in this embodiment, cell groups divided every row), an SRAM column control circuit 122 for generating an SRAM column selection signal from the internal address signals iA0 to iA3 and iA4 to iA13, and an SRAM column decoder 123 for selecting a column by SRAM column selection signals iASC4 to iASC10. The semiconductor memory device 100 further includes an operation control circuit 150 for controlling an operation of the semiconductor memory device in response to an external input signal, and a data control circuit 160 for controlling an external data input/output operation.

Although, in this embodiment, the DRAM and SRAM are used as the main memory portion and the sub memory portion, respectively, the present invention is not limited thereto. Instead of the DRAM, a memory such as SRAM, mask ROM, programmable ROM (PROM), erasable PROM (EPROM), electrically erasable PROM (EEPROM), flush EEPROM, and ferroelectric memory may be used as the main memory portion. The memory constituting the main memory portion is preferably constructed such that the kind and specific function thereof can be efficiently utilized. For example, in a case where a DRAM is used as the main memory portion, a usual DRAM, an EDODRAM, a synchronous DRAM, a synchronous GRAM, a burst EDODRAM, a DDR synchronous DRAM, a DDR synchronous GRAM, an SLDRRAM, or a RambusDRAM may be used. Further, any random access memory may be used as the sub memory portion provided that the memory allows access at higher speed than that of a memory used as the main memory portion. In a case where the main memory portion is constituted with a flush EEPROM, a memory capacity of the sub memory portion is preferably a half or more of the capacity of a unit erase sector of the flush EEPROM.

(3) System

The semiconductor memory device according to the present invention is provided with the SRAM column control circuit 122 and, therefore, an SRAM column control mode can be changed in an SRAM cell group unit, as to be described in detail later. This function allows the setting of a lap time, a burst length, and a latency, etc., (referred to as "data input/output mode", hereinafter) for every SRAM cell group, so that the data input/output mode of each SRAM cell group is automatically determined within the semiconductor memory device when the SRAM cell group is selected, by preliminarily providing the setting. Therefore, there is no need of data control externally of the semiconductor memory device or an external data processing control for switching the data input/output mode.

Figure 2:
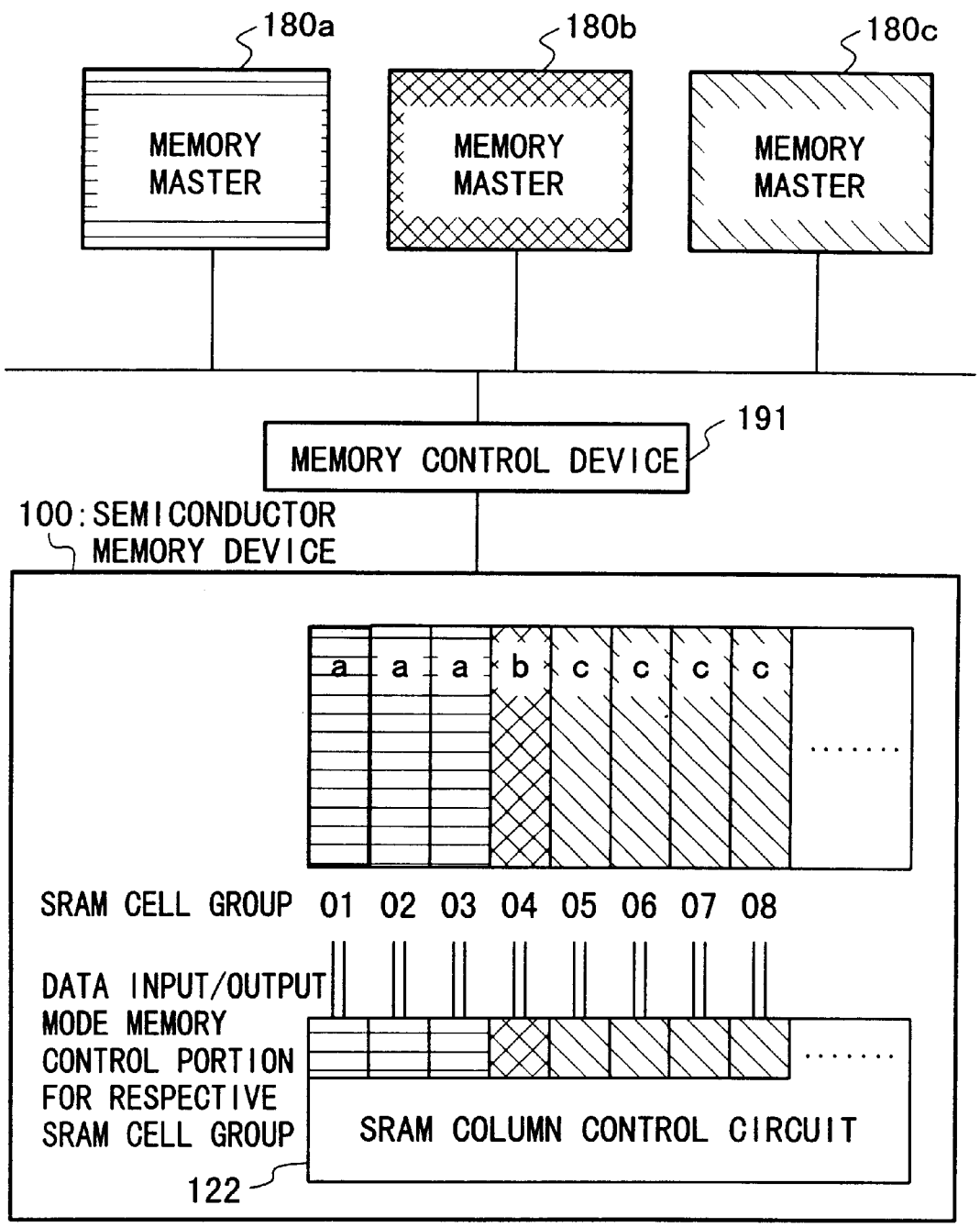
FIG. 2 is a block diagram of a memory system including the semiconductor memory device shown in FIG. 1 and a plurality of memory masters which perform access requests with respect to the semiconductor memory device.

The semiconductor memory device of the present invention has a function that, when it receives a plurality of access requests, the semiconductor memory device receives an allocation, assignment and/or re-assignment in SRAM cell group unit for every access request. FIG. 2 shows a memory system having a plurality of memory masters which perform access requests to the semiconductor memory device 100 shown in FIG. 1. In FIG. 2, SRAM cell groups 01, 02 and 03 are assigned to an access request from a memory master 180a, SRAM cell group 04 is assigned to an access request from a memory master 180b, and the SRAM cell groups 05, 06, 07 and 08 are assigned to an access request from a memory master 180c. The assignment of the SRAM cell groups to these access requests is variable and can be changed at any time.

Figure 3:
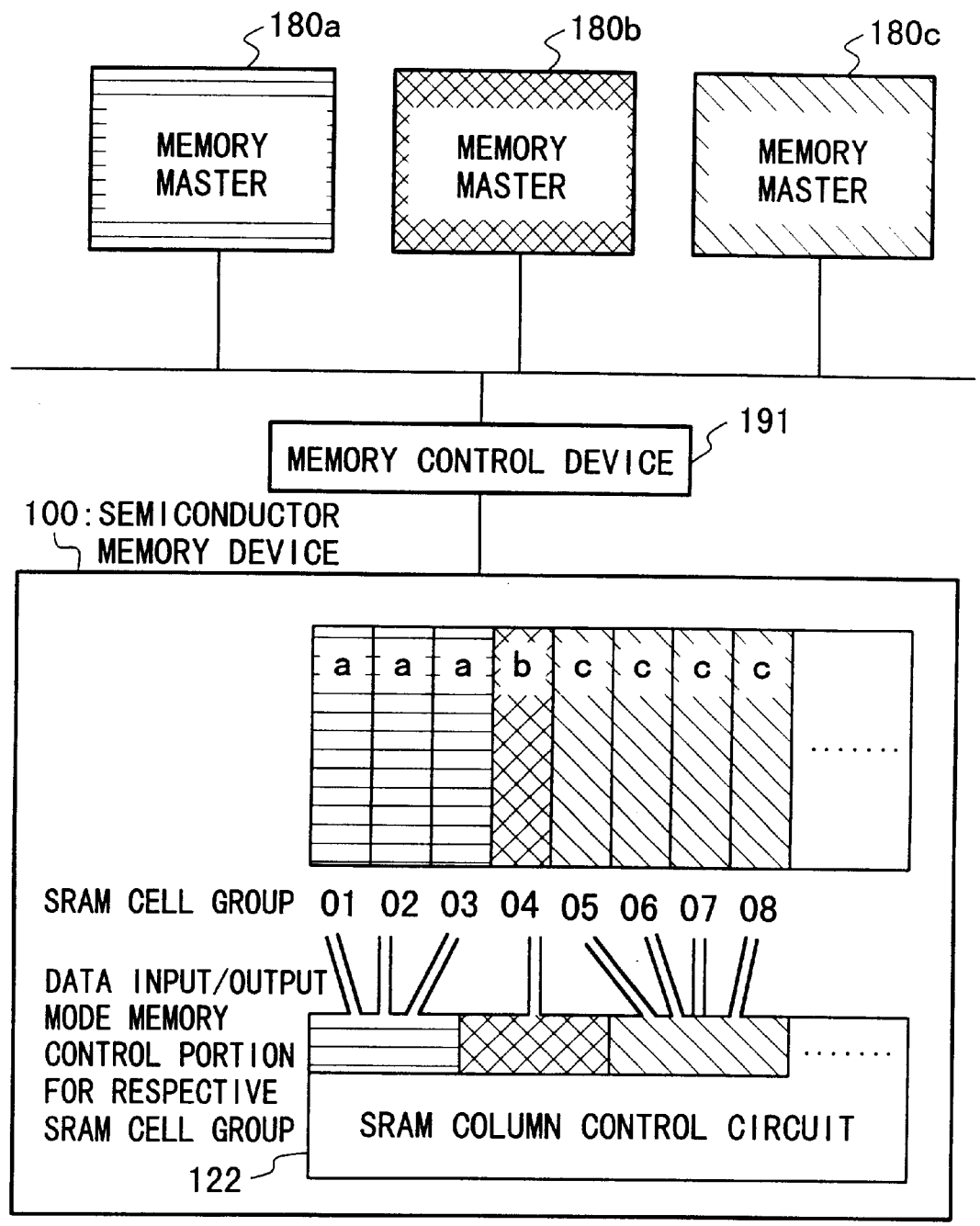
FIG. 3 is a block diagram of a memory system including the semiconductor memory device shown in FIG. 1 and a plurality of memory masters which perform access requests with respect to the semiconductor memory device.

Further, in FIG. 2, when the data input/output mode requested for the semiconductor memory device 100 by the memory master 180a is different from the data input/output mode requested for the semiconductor memory device by the memory master 180b, it is possible to perform the data input/output operation for the memory master 180a and the data input/output operation for the memory master 180b successively without using a special control signal. In order to realize such an operation, the SRAM column control circuit 122 of the semiconductor memory device 100 includes a data input/output mode memory portion. The data input/output mode memory portion may have a one-to-one correspondence to the SRAM cell groups as shown in FIG. 2 or may correspond to a plurality of SRAM cell groups as shown in FIG. 3.

(4) Pin Arrangement

FIG. 4 shows an example of a pin arrangement of a package of the semiconductor memory device according to the present invention. The semiconductor memory device shown in FIG. 4 has a x8-bit, 2-bank construction including a 64-Mbit DRAM array and a 16-Kbit SRAM array and a synchronous interface and is housed in a 54 pin TSOP type II plastic package of 400 mil×875 mil with a lead pitch of 0.8 mm. The number of pins and the pin arrangement of this pin construction are the same as those of a usual 64-Mbit synchronous DRAM. Further, the number of pins and the pin arrangement of other bit constructions are the same as those of a corresponding synchronous DRAM.

Signals of the respective pins are defined as follows:

CLK: A clock signal CLK is a reference clock commonly used for all other input/output signals. That is, the clock signal CLK determines take-in timing of other input signals and output signal timing. A set-up/store time of each external signal is defined with reference to a rising edge of the clock CLK.

CKE: A clock enable signal CKE determines whether or not a CLK signal subsequent thereto is effective. When the CKE signal is HIGH at the rising edge of the CLK signal, the CLK signal is determined as being effective and, when it is LOW, the CLK signal is determined as being invalid.

/CS: A chip select signal /CS determines whether or not external input signals /RAS, /CAS, /WE are accepted. When the signal /CS is LOW at the leading edge of the signal CLK, the /RAS signal, the ICAS signal and the /WE signal which are input at the same timing are received by the operation control circuit. When the signal /CS is HIGH at the leading edge of the CLK signal, the /RAS signal, the /CAS signal and the /WE signal input at the same timing are neglected.

/RAS, /CAS, /WE: The respective control signals /RAS, /CAS and /WE in combination determine the operation of the semiconductor memory device.

A0 to A13: Address signals A0 to A13 are received by the address control circuit according to the clock signal, sent to the DRAM row decoder, the DRAM column decoder, the SRAM row decoder, and the SRAM column decoder, and used to select a cell of the DRAM portion and a cell of the SRAM portion. Further, the address signals are input into a mode register to be described later, according to an internal command signal to set the data input/output mode of the internal operation. The address signal A13 is a bank selection signal of the DRAM cell array, too.

DQM: A data mask signal DQM functions to invalidate (mask) a data input and output in byte unit.

DQ0 to DQ7: Data signals DQ0 to DQ7 are input/output data signals.

(5) Basic Operation

A basic operation of the semiconductor memory device according to the present invention will be described. It should be noted that commands and the number of data are a mere embodiment and other combinations can be made arbitrarily.

FIG. 5 shows an example of various commands determining operation functions of the semiconductor memory device according to the present invention and states of the external input control signals. It should be noted, however, that any other combination of the various commands determining the operational functions of the semiconductor memory device and the states of the external input control signals can be used.

In FIG. 5, the states of the respective input control signals at a rising edge of a reference clock signal CLK and operations determined thereby are shown. A symbol "H" indicates a logical high level, "L" a logical low level, and "x" an arbitrary level. Further, input control signals CKEn-1 in FIG. 5 shows a state of the input control signal CKE in a period of a reference clock just preceding a specified reference clock, and the control signal CKE to be described for the respective commands is the CKEn-1.

The commands shown in FIG. 5 will be described in sequence.

Figure 10:
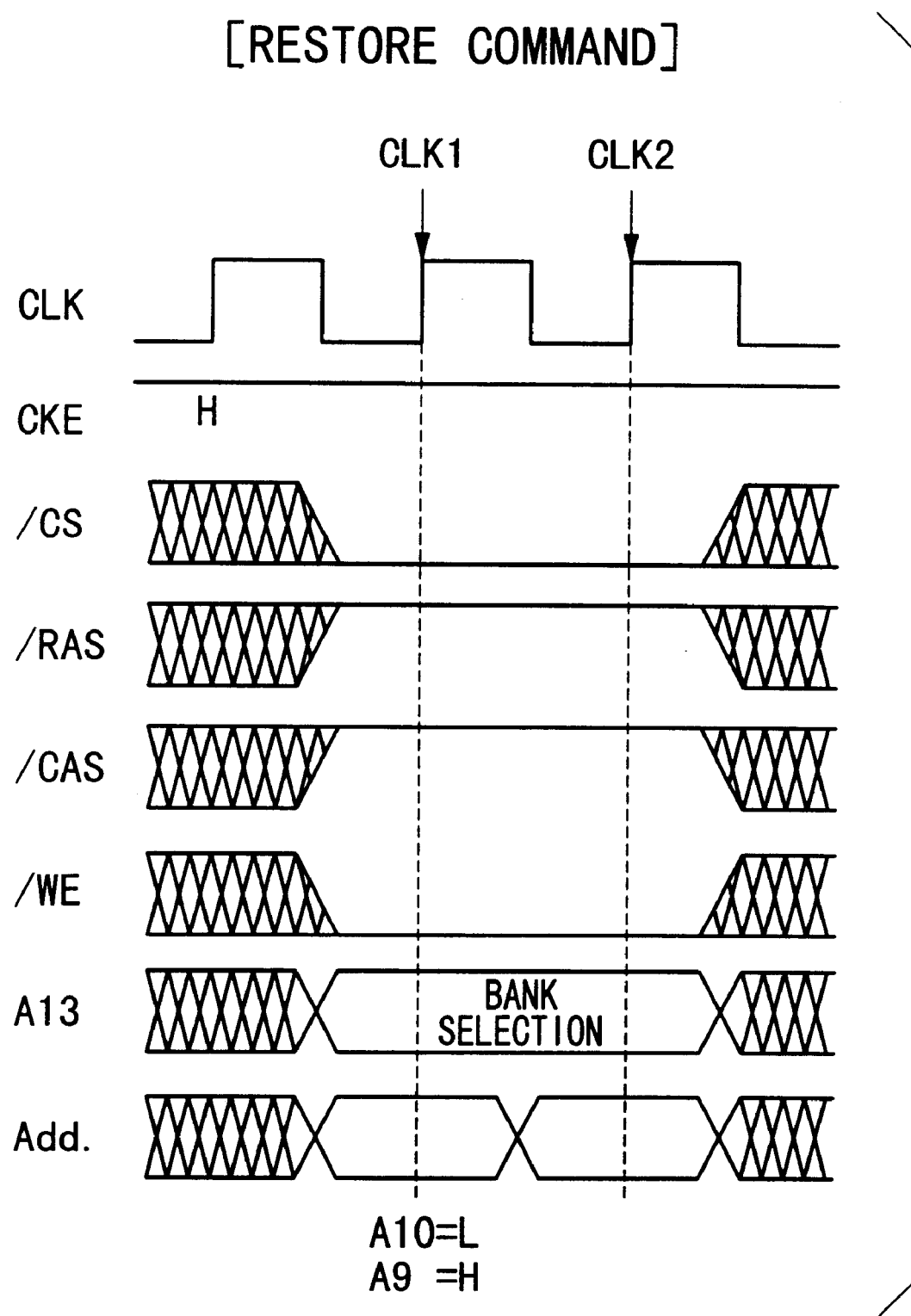
FIG. 10 shows states of the external terminals showing the restore command shown in FIG. 5.

The commands shown in FIG. 10 will be described in sequence.

1. Read Command

Read command is to execute a data read operation from an SRAM cell.

Figure 6:
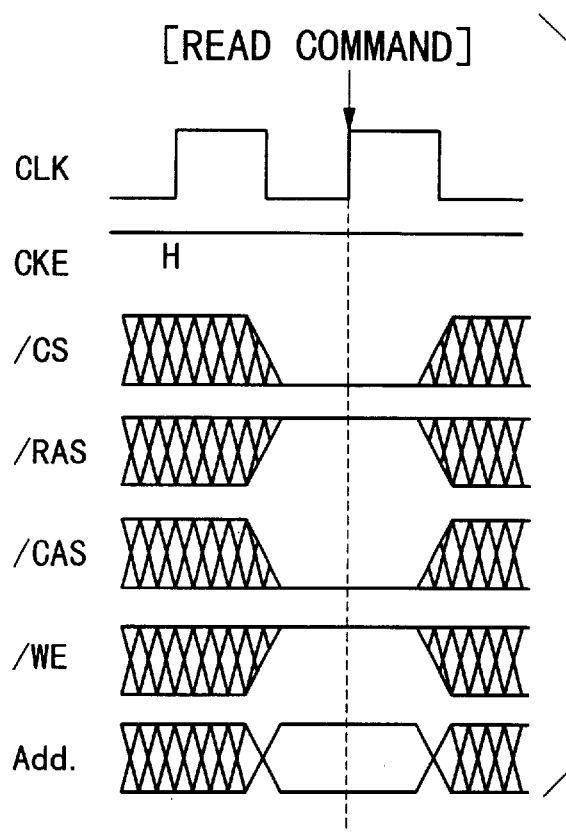
FIG. 6 shows states of the external terminals showing the read command shown in FIG. 5.

As shown in FIG. 6, the states of the respective input control signals at the rising edge of the external clock signal are CKE=H, /CS=L, /RAS=H, /CAS=L and /WE=H. When this read command is input, the addresses A0 to A3 and the addresses A4 to A10 are input as the SRAM row selection addresses and as the SRAM column selection addresses, respectively. Data at these addresses are output to DQ0 to DQ7 at a time delayed from the input of the read command by a latency. When DQM=H with the clock set for the read command, the data output of the DQ0 to DQ7 are masked and are not output externally.

Figure 24:
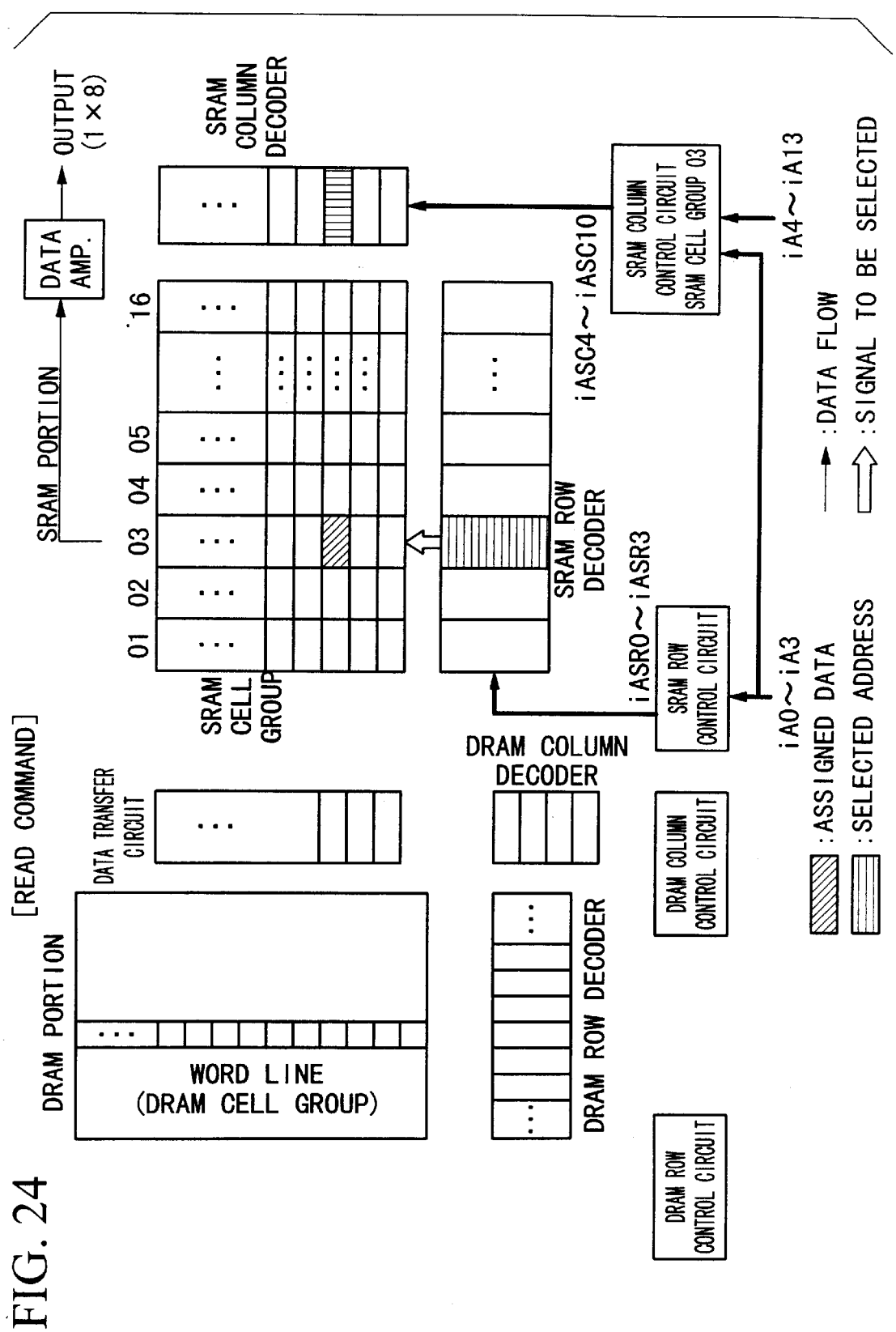
FIG. 24 is a flowchart of an address assignment and data in a read command operation.

FIG. 24 shows an address signal and a data flow in an internal operation according to this read command. SRAM cells are selected by the row selection of the SRAM row decoder by the internal address signals iA0 to iA3 and the column selection of the SRAM column decoder by the SRAM selection signals iASC4 to iASC10 generated from the internal address signals iA0 to iA3 and iA4 to iA13. Data of the selected SRAM cells are output externally through the data amplifier in an assigned data input/output mode.

2. Write Command

The write command performs the operation of writing data to the SRAM cell.

Figure 7:
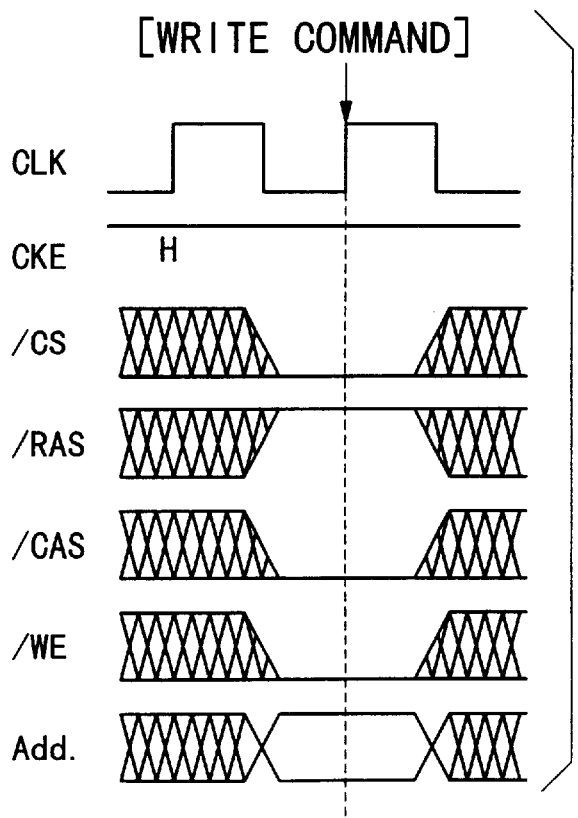
FIG. 7 shows states of the external terminals showing the write command shown in FIG. 5.

As shown in FIG. 7, the states of the respective input control signals at the rising edge of the external clock signal are CKE=H, /CS=L, /RAS=H, and /CAS=/WE=L. When the write command is input, the addresses A0 to A3 are received as SRAM row selection addresses and the addresses A4 to A10 are received as SRAM column selection addresses. As data to be written, the data of DQ0 to DQ7 is received at a time delayed from the input of the write command by a latency. When DQM=H with the clock for data input of DQ0 to D07, the data output of the DQ0 to DQ7 are masked and are not input.

Figure 25:
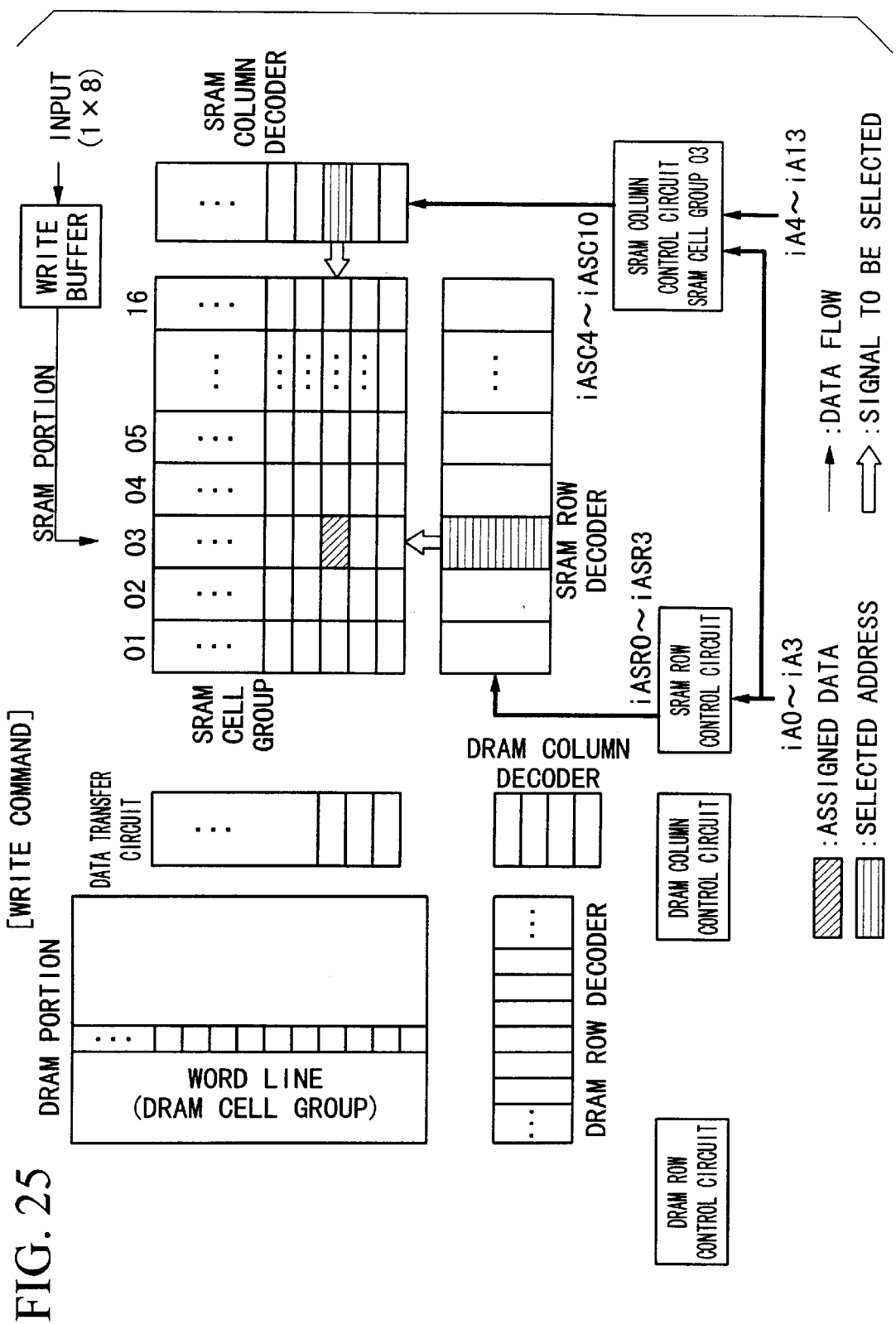
FIG. 25 is a flowchart of an address assignment and data in a write command operation.

FIG. 25 shows an address signal and a data flow in an internal operation according to this write command. SRAM cells are selected by the row selection of the SRAM row decoder by the SRAM row selection signals iASR0 to iASR3 generated from the internal address signals iA0 to iA3 and the column selection of the SRAM column decoder by the SRAM selection signal iASC4 to iASC10 generated from the internal address signals iA0 to iA3 and iA4 to iA13. The write data from DQ0 to DQ7 is written in the selected SRAM cell through the write buffer.

As shown in FIGS. 24 and 25, the read command and the write command perform the read and write regardless of the DRAM portion and the data transfer portion. Therefore, these commands can operate even when data transfer operation between SRAM cell groups other than the SRAM row selected for the data input/output and the DRAM portion and/or the operation inside the DRAM portion still continues. On the contrary, even if the read command or the write command is operated, it is possible to operate by commands of data transfer operation between SRAM cell groups other than the SRAM row selected for the data input/output and the DRAM portion and/or the operation inside the DRAM portion.

3. Prefetch Command

Figure 8:
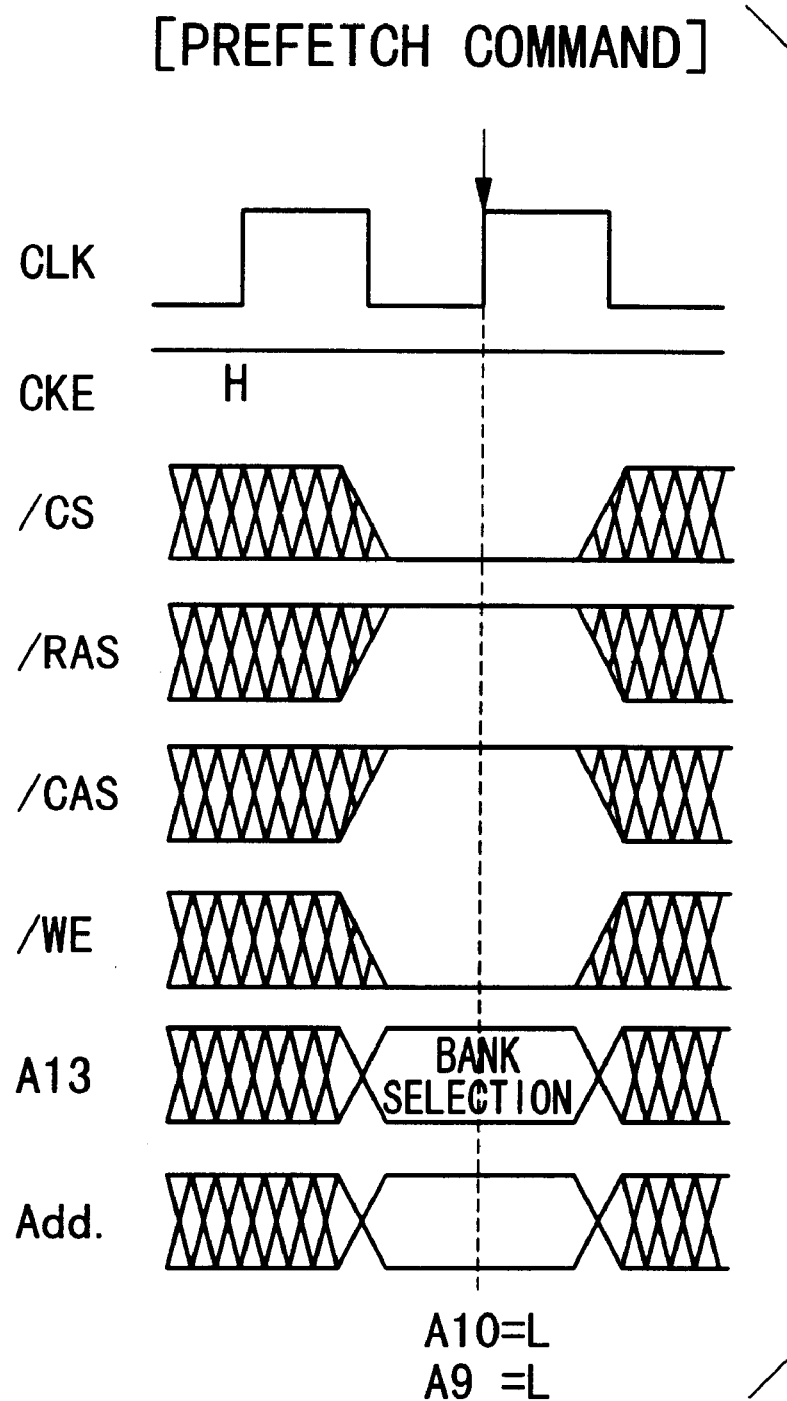
FIG. 8 shows states of the external terminals showing the prefetch command shown in FIG. 5.

The prefetch command is to perform a data transfer from a DRAM cell group to an SRAM cell group. As shown in FIG. 8, the states of the respective input control signals at the rising edge of the external clock signal are CKE=H, /CS=L, /RAS=/CAS=H and /WE=L. Further, A10=L and A9=L. When the prefetch command is input, the addresses A0 to A3 are input as SRAM row selection addresses, the addresses A5 to A6 are input as DRAM column selection addresses and A13 is input as a bank selection address of the DRAM array.

Figure 26:
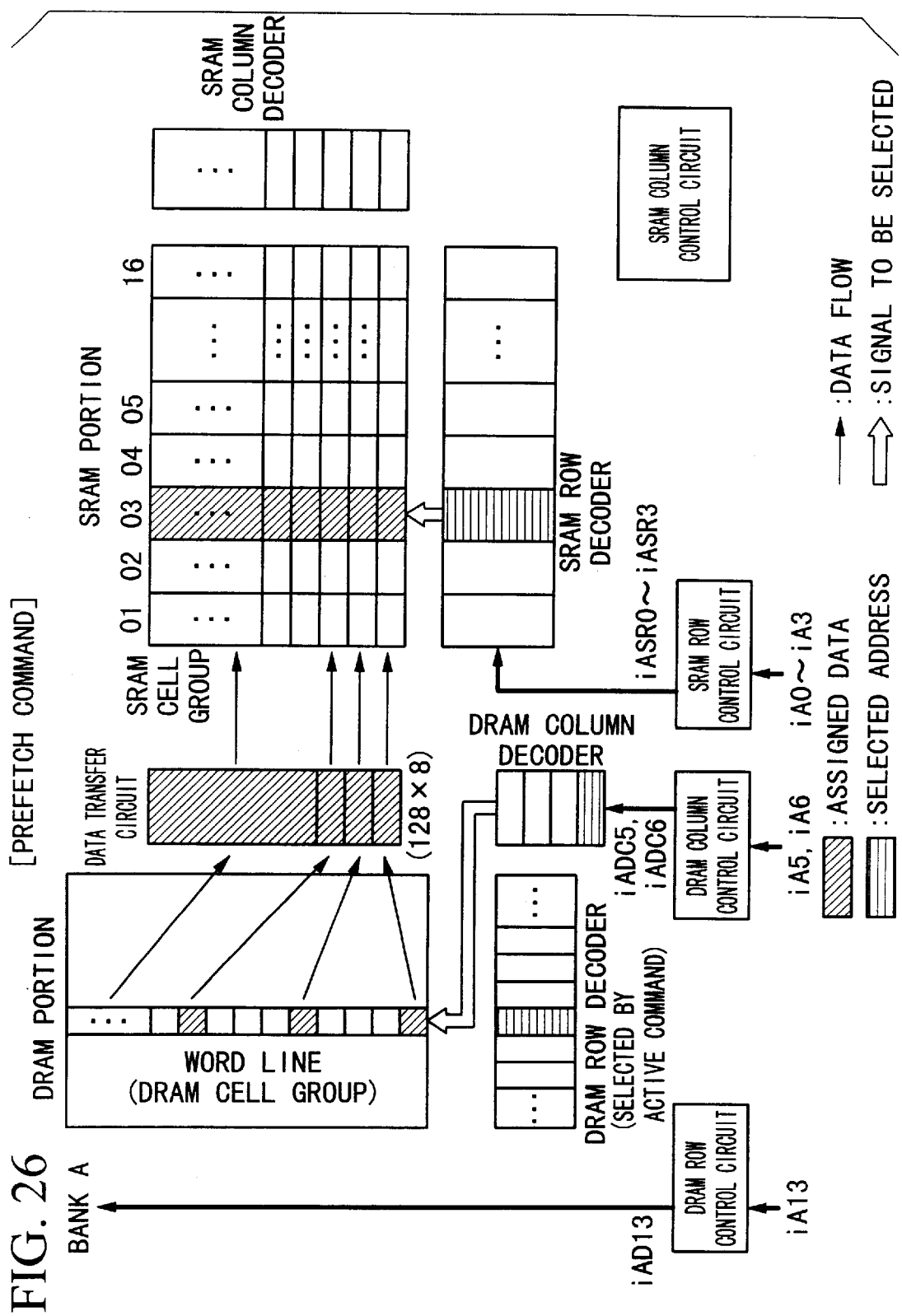
FIG. 26 is a flowchart of an address assignment and data in a prefetch command operation.

FIG. 26 shows an address signal and a data flow in an internal operation according to this prefetch command. Among DRAM cell groups already selected by an active command to be described later, an SRAM cell in a bank assigned by iA13 is selected. In this embodiment, the bank A is selected. Bit lines of the DRAM cell group assigned by the addresses iA5 and iA6 are selected. Data of the bit lines is amplified by the sense amplifier at the time of the active command and the data of the selected bit lines is transmitted to a data transfer bus line through the data transfer circuit. The cells on the row of the SRAM selected by the addresses iA0 to iA3 stop storing of the previous data, receive the data on the data transfer bus line, and store data transferred thereafter. An output from the sense amplifier through the data transfer circuit to the data transfer line is stopped after the data transfer. In this embodiment, the number of data transferred by the prefetch command at once is 128×8.

4. Prefetch Command with Auto Precharge

Figure 9:
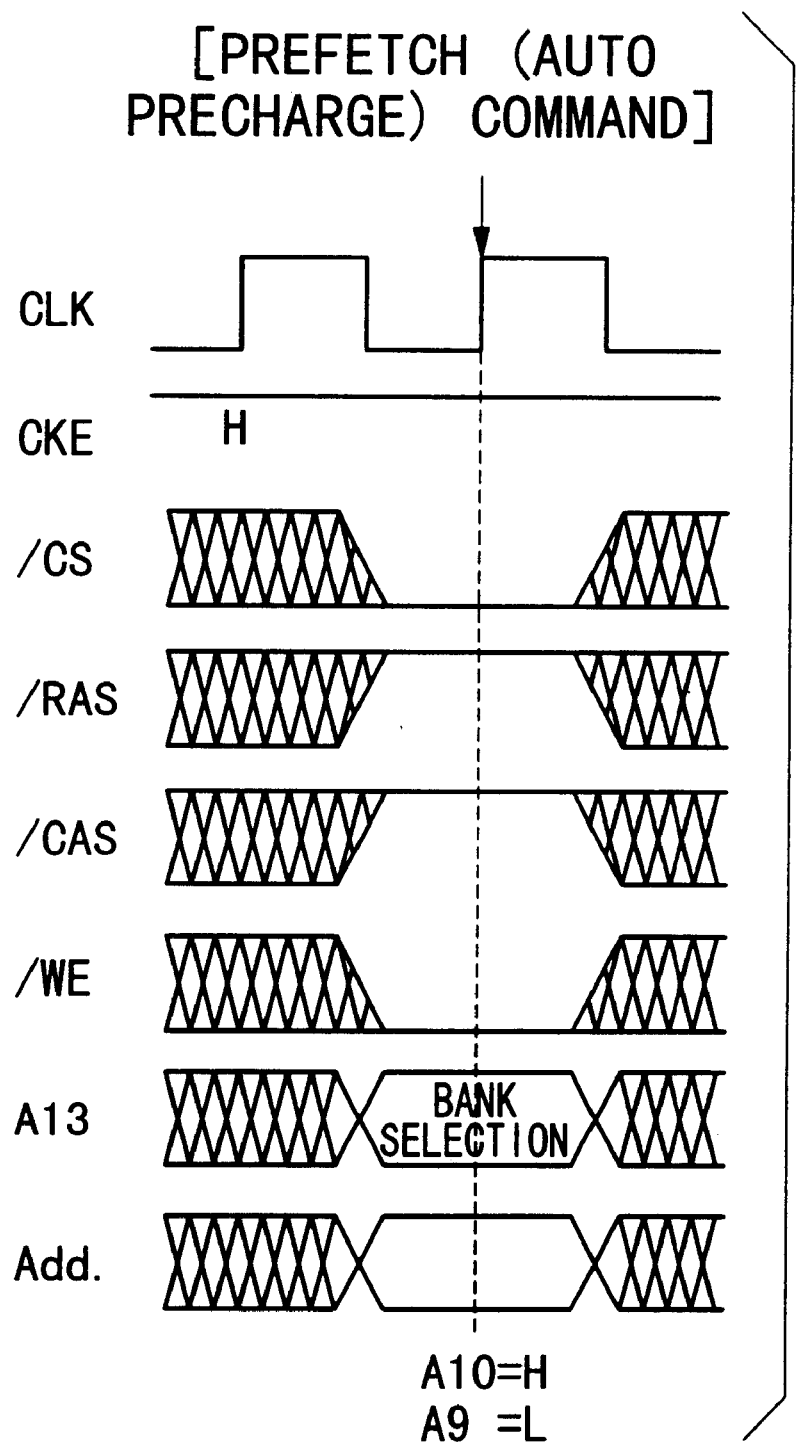
FIG. 9 shows states of the external terminals showing the prefetch command with auto precharge shown in FIG. 5.

The prefetch command with auto precharge is to transfer data from the DRAM cell group to the SRAM cell group and to automatically precharge the DRAM portion after data transfer. As shown in FIG. 9, the states of the respective input control signals at the rising edge of the external clock signal are CKE=H, /CS=L, /RAS=/CAS=H, and /WE=L. Further, A10=H and A9=L. Similarly to the above mentioned prefetch command, the addresses A0 to A3 are input as SRAM row selection addresses, the addresses A5 and A6 are input as DRAM column selection addresses, and A13 is input as a bank selection address of the DRAM array when the prefetch command with auto precharge is input.

Address signals in an internal operation and data flow caused by the prefetch command with auto precharge will be described. Among DRAM cell groups already selected by the active command to be described later, an SRAM cell in a bank assigned by iA13 is selected. Bit lines of the DRAM cell group assigned by the addresses iA5 and iA6 are selected. Data of the bit lines is amplified by the sense amplifier at the time of the active command and the data of the selected bit lines is transmitted to a data transfer bus line. The cells on the row of the SRAM selected by the addresses iA0 to iA3 stop storing of the previous data, receive the data on the data transfer bus line, and store data transferred thereafter. An output from the sense amplifier through the data transfer circuit to the data transfer line is stopped after the data transfer. After a predetermined time from the stoppage of output to the data transfer bus line, the word line is set to a non-selection state, and the internal operation (potential equilibration of the bit line and the sense amplifier) to be described for the precharge command is performed. After a predetermined time from the input of the prefetch command with auto precharge, the DRAM is automatically made in a precharge (non selection) state.

5. Restore Command

The restore command is to perform a data transfer from the SRAM cell group to the DRAM cell group. As shown in FIG. 10, this command is a continuous input command extending over the external clock signals CLK1 and CLK2. The states of the respective input control signals at the rising edge of the external clock signal shown in FIG. 10 are CKE=H, /CS=L, /RAS=/CAS=H, and /WE=L. Further, A10=L and A9=H.

At the rising edge of the first external clock signal CLK1, the addresses A0 to A3 are input as SRAM row selection addresses, and the addresses A5 and A6 are input as DRAM column selection addresses. At the rising edge of the second external clock signal CLK2, addresses A0 to A12 are input as row selection addresses of the DRAM array which is a destination of transfer. The addresses A13 are input as the bank selection addresses of the DRAM array at the rising edges of the CLK1 and CLK2. The A13 addresses input by the CLK1 and CLK2 must be identical.

Figure 27:
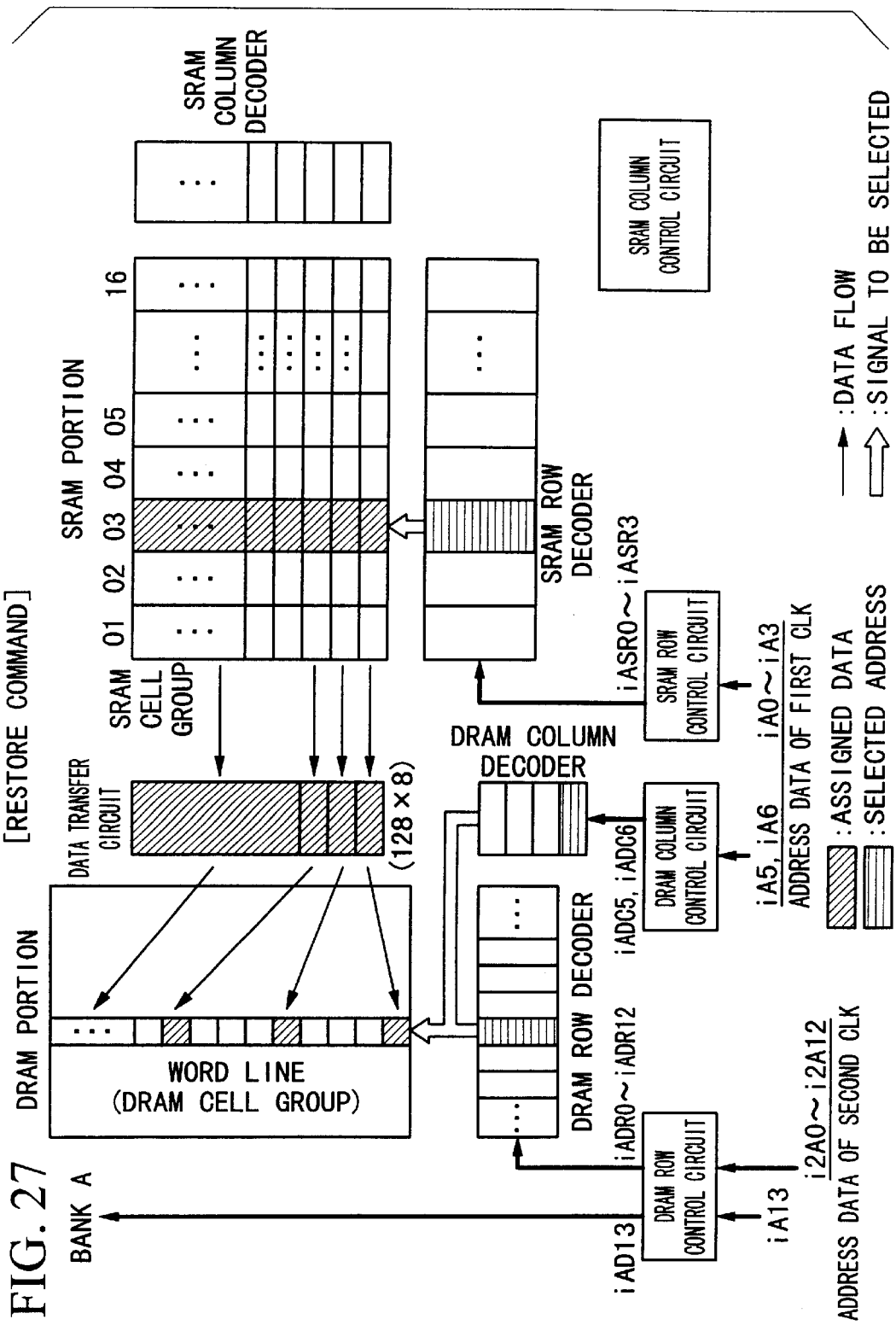
FIG. 27 is a flowchart of an address assignment and data in a restore command operation.

FIG. 27 shows address signals in an internal operation and data flow caused by this restore command. Internal address signals i1A0 to i1A12 shown in FIG. 27 are internal address data at the time of the first clock CLK1 and internal address signals i2A0 to i2A12 are internal address data at the time of the second clock CLK. Data of identical internal address signal line being shown for each clock. Data of the SRAM cell group selected by the addresses i1A0 to i1A3 generated from the address at the first clock CLK1 is transferred to a data transfer bus line of a bank selected by the address iA13. Thereafter, the data of the data transfer bus line is transferred to bit lines of the DRAM selected by the addresses i1A5 and i1A6.

Further, word lines of the DRAM are selected by the addresses i2A0 to i2A12 and iA13 are selected, and data of the cell groups on the selected word lines are output to corresponding bit lines, respectively. Sense amplifiers corresponding to the bit lines of the DRAM detect and amplify the data of the DRAM cell groups output to the bit lines, respectively. The sense amplifiers corresponding to the bit lines selected by the addresses i1A5 and i1A6 detect and amplify write data transmitted from the data transfer bus line. A data output through the data transfer bus line to the bit lines of the DRAM is stopped after the word line is raised. In this embodiment, the number of data transferred at once is 128×8.

6. Restore Command with Auto Precharge

Figure 11:
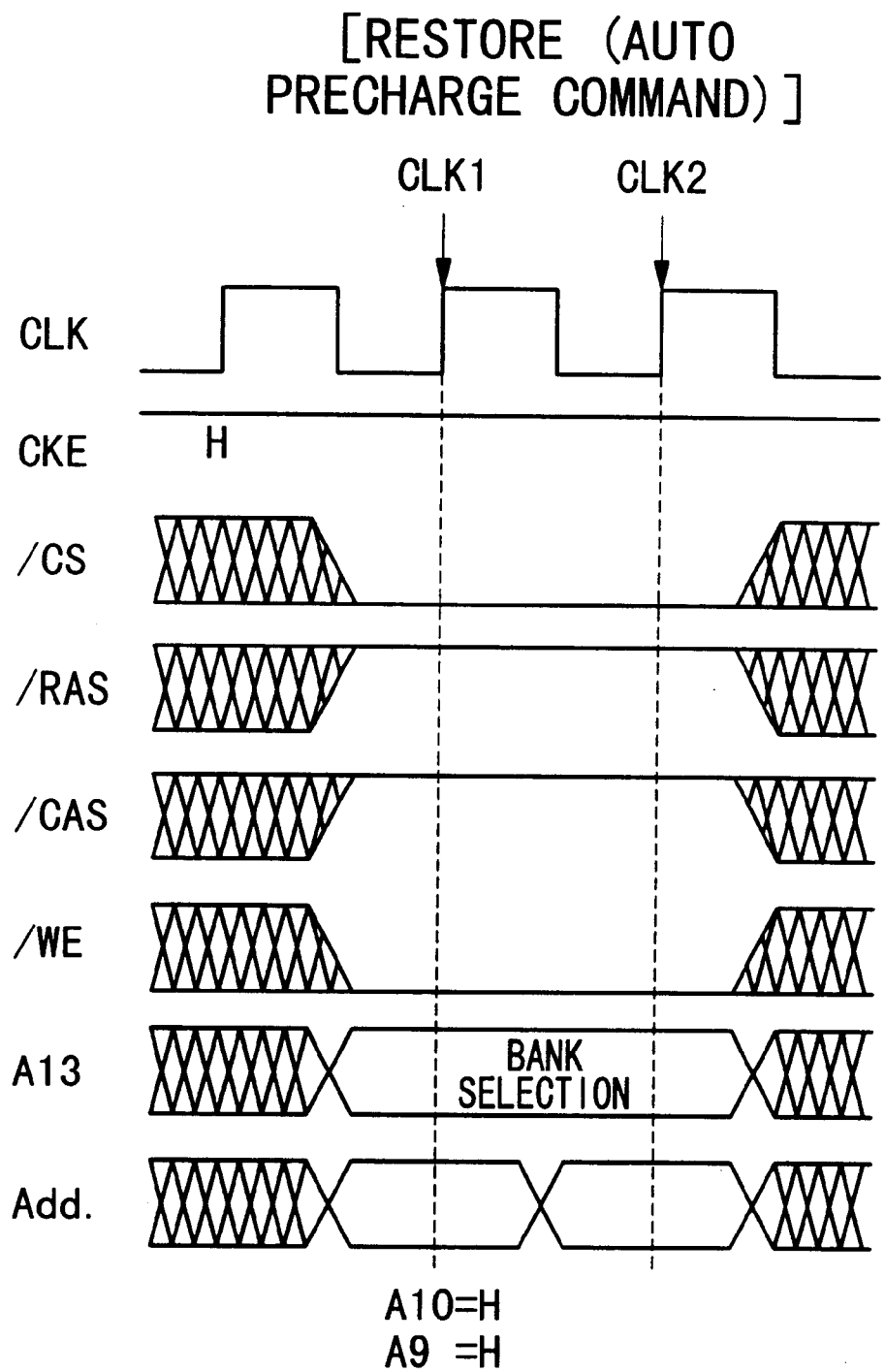
FIG. 11 shows states of the external terminals showing the restore command with auto precharge shown in FIG. 5.

The restore command with auto precharge is to perform a data transfer from an SRAM cell group to a DRAM cell group and to automatically perform a precharge of the DRAM portion after the data transfer. As shown in FIG. 11, the states of the respective input control signals at the rising edges of the external clock signal CLK1 and CLK2 are CKE=H, /CS=L, /RAS=/CAS=H and /WE=L and, further, A10=H and A9=H.

At the rising edge of the first external clock signal CLK1, the addresses A0 to A3 are input as SRAM row selection addresses, and the addresses A5 and A6 are input as DRAM column selection addresses. At the rising edge of the next, a second external clock signal CLK2, and addresses A0 to A12 are input as row selection addresses of the DRAM array which is a destination of transfer. The addresses A13 are input as the bank selection addresses of the DRAM array at the rising edges of the CLK1 and CLK2. The A13 addresses input by the CLK1 and CLK2 must be identical.

Address signals in an internal operation and data flow caused by this restore command with auto precharge will be described. Data of the SRAM cell group selected by the addresses i1A0 to i1A3 generated from the addresses at the time of the first clock CLK1 is transmitted to the data transfer bus line of the bank selected by the address iA13. Thereafter, the data of the data transfer bus line is transmitted to the bit line of the DRAM selected by the addresses i1A5 and i1A6. Then, word lines of the DRAM are selected by the addresses i2A0 to i2A12 and iA13 generated by the addresses at the time of the next clock CLK2, and data of the cell groups on the selected word lines are output to corresponding bit lines.

The sense amplifiers corresponding to the respective bit lines detect and amplify data of the DRAM cell group output to the bit lines, and the sense amplifiers corresponding to the bit lines selected by the addresses i1A5 and i1A6 detect and amplify write data transferred from the data transfer bus line. The output to the bit lines of the DRAM through the data transfer bus line is stopped after the word line is raised, then the word line is set to a non-selection state after a predetermined time, and an internal operation (equilibration of the bit line and the sense amplifier) indicated by a precharge command to be described later is performed. After a predetermined time from the command, the DRAM automatically switches to a precharge (non-selection) state.

7. Active Command

Figure 12:
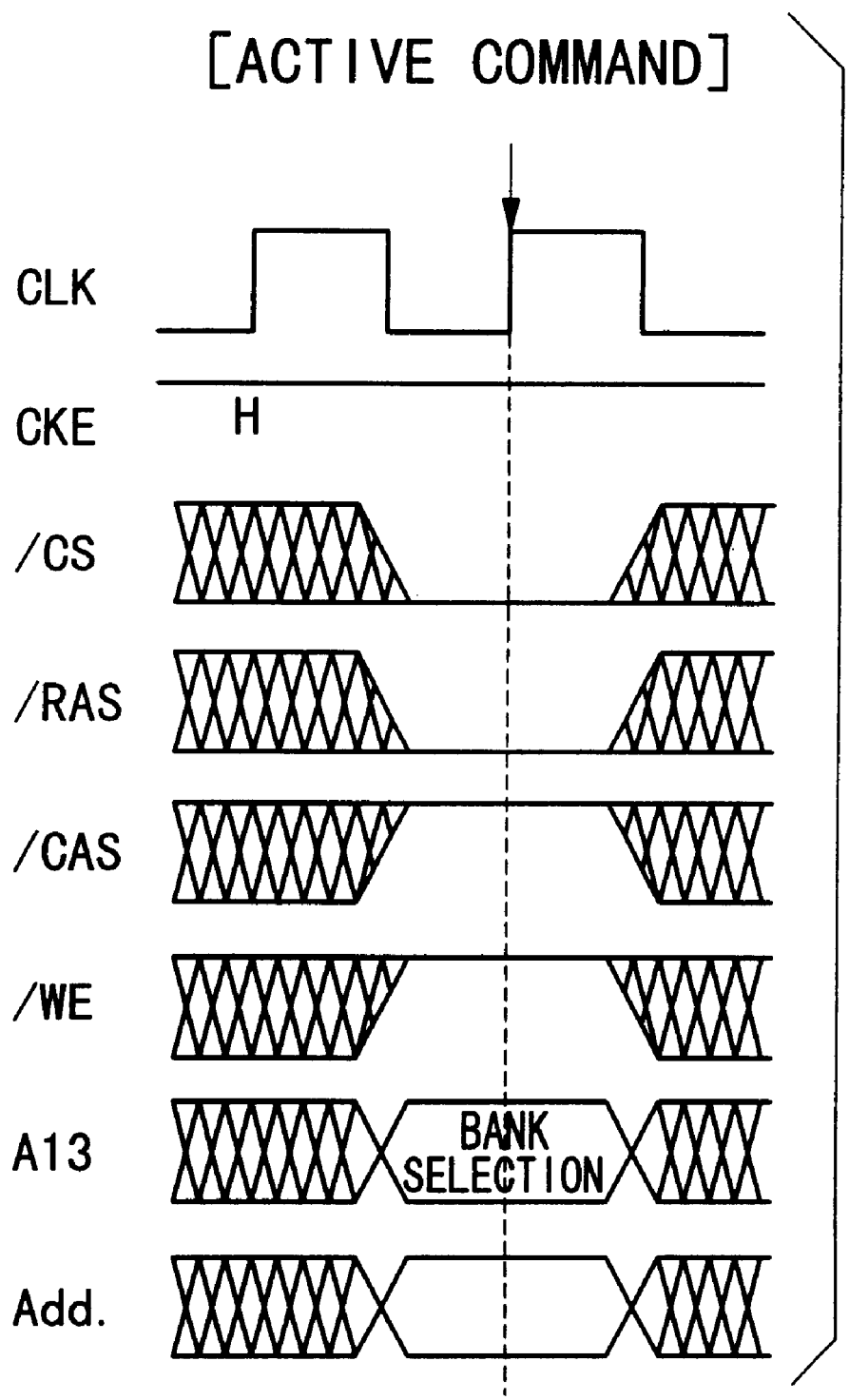
FIG. 12 shows states of the external terminals showing the active command shown in FIG. 5.

The active command is to activate a bank selected from the DRAM array. As shown in FIG. 12, the states of the respective input control signals at the rising edges of the external clock signal are CKE=H, /CS=/RAS=L, and /CAS=/WE=H. An address A13 at the input time of this active command is input a bank selection address of the DRAM, and addresses A0 to A12 are input as row selection address of the DRAM.

Figure 28:
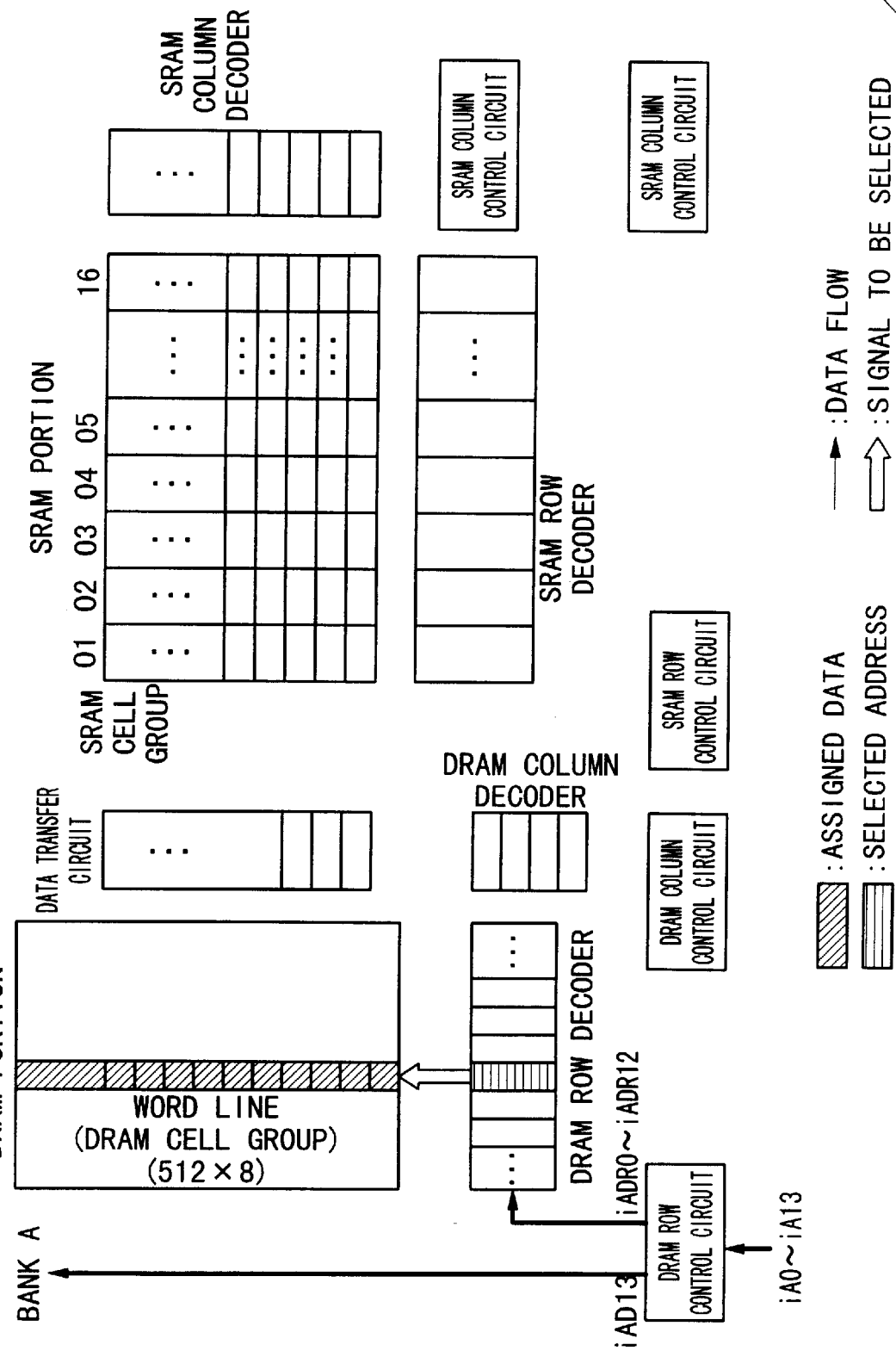
FIG. 28 is a flowchart of an address assignment and data in an active command operation.

FIG. 28 shows address signals in an internal operation caused by the active command and data flow. In the bank selected by the address iA13, the word lines of the DRAM are selected by the addresses iA0 to iA12. Data of DRAM cell groups on the selected word lines are output to bit lines connected thereto, and the sense amplifiers corresponding to the respective bit lines detect and amplify the data of the DRAM cell groups output to the bit lines. In this embodiment, the number of data transferred at one time is 512×8.

When another word line selection is to be performed with respect to a bank which is already activated, it is necessary to make the bank in a precharge state and then to newly input an active command. This command corresponds to a case where a /RAS signal of a usual DRAM is set to LOW.

8. Precharge Command

Figure 13:
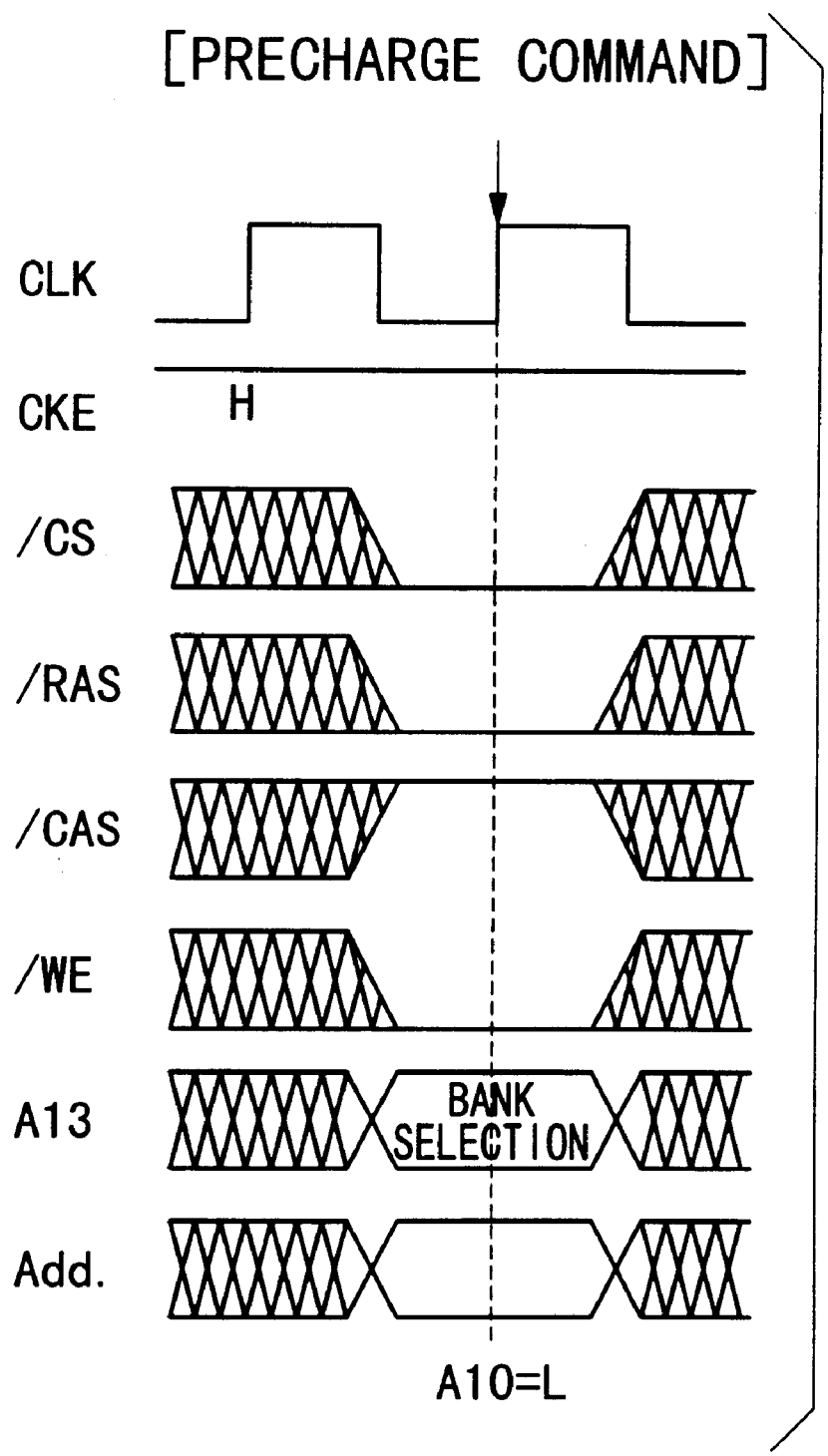
FIG. 13 shows states of the external terminals showing the precharge command with auto precharge shown in FIG. 5.

The precharge command is to precharge (inactivation) a bank selected from a DRAM array. As shown in FIG. 13, the states of the respective input control signals at the rising edges of the external clock signal are CKE=H, /CS=/RAS=L, /CAS=H and WE=L. When, upon the input of the precharge command, A10=L and A13=valid data, a bank assigned by data of the address A13 is precharged (nonselection). The bank is selected at the active command input prior to this precharge, and, when there is no active command input into the bank assigned by this precharge command prior to the input of the latter command thereto, the precharge command is invalid.

Address signals in an internal operation caused by the precharge command and data flow will be described. Bit line potential and sense amplifier potential are equilibrated by switching a word line of a DRAM whose bank selected by the address iA13 is activated to a non-selection state. After the operation of the precharge command completes, the selected bank becomes ready to receive a next active command. The precharge command corresponds to a case where a /RAS signal of a usual DRAM is set to HIGH.

9. All Bank Precharge Command

Figure 14:
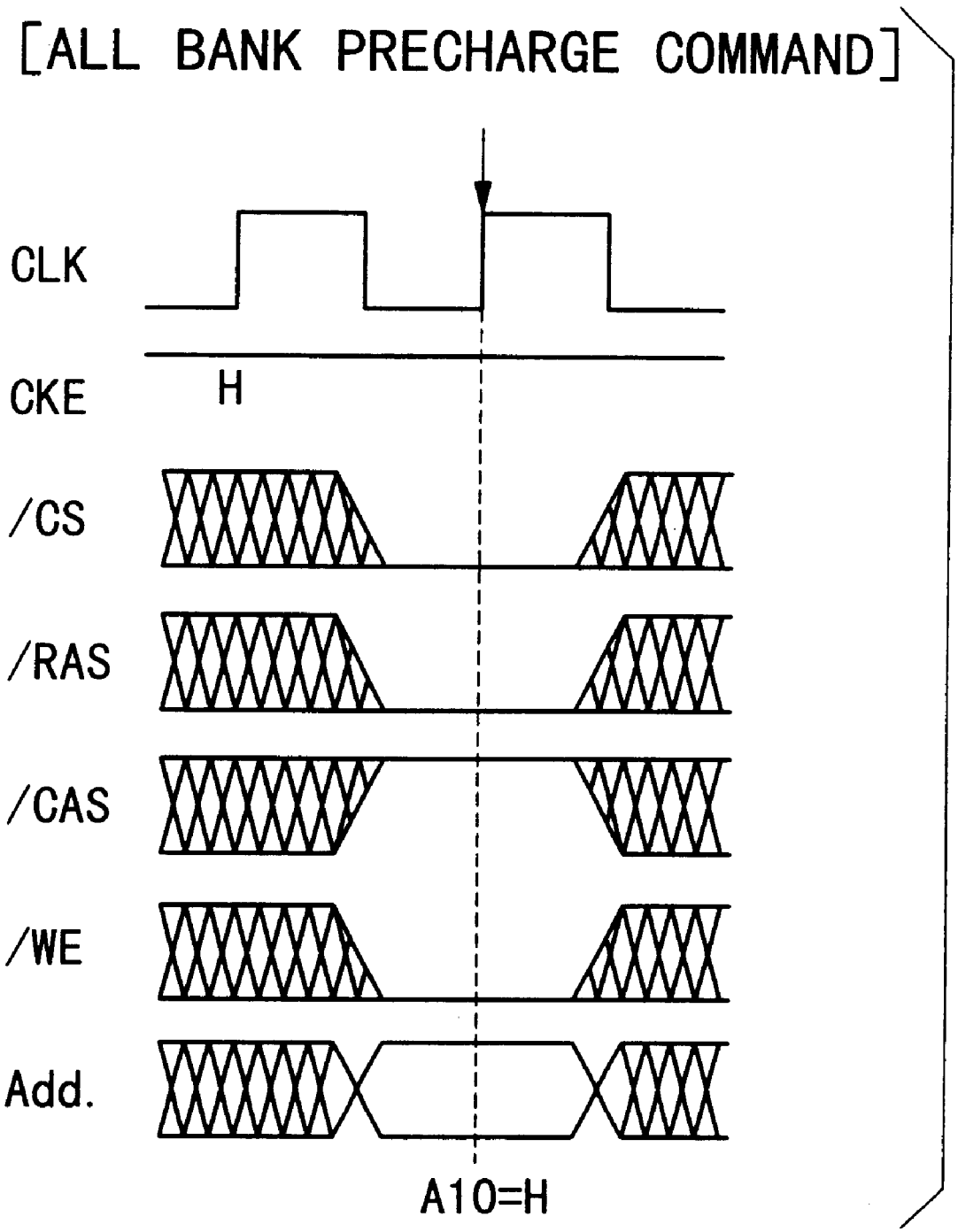
FIG. 14 shows states of the external terminals showing the whole bank precharge command shown in FIG. 5.

The all bank precharge command is to precharge (inactivation) all banks of a DRAM array. With this command, the DRAM portion is set to a precharge state and the active state of all banks can be ended. As shown in FIG. 14, the states of the respective input control signals at the rising edges of the external clock signal CLK are CKE=H, /CS=/RAS=L, /CAS=H, and /WE=L. Further, A10=H.

Address signals in an internal operation caused by the precharge command and data flow will be described. Bit line potential and sense amplifier potential are equilibrated by setting all word lines of a selected DRAM to a non-selection state. After the operation of this command is completed, all banks become ready to receive a next active command input. The all bank precharge command corresponds to a case where a /RAS signal of a usual DRAM is set to HIGH.

10. CBR Refresh Command

The CBR refresh command is to refresh cell data of a DRAM portion. The address signal necessary for the refresh is automatically generated internally. As shown in FIG. 15, the states of the respective input control signals at the rising edges of the external clock signal are CKE=H, /CS=/RAS=/CAS=L and /WE=H.

Address signals in an internal operation caused by the CBR refresh command and data flow will be described. Addresses iA0 to iA12 and iA13 are automatically generated internally. A bank is selected by the internally generated address iA13, word lines of a DRAM are selected by the internally generated addresses iA0 to iA12, DRAM cell groups on the selected word lines output their data to corresponding bit lines, respectively. Sense amplifiers corresponding to the respective bit lines detect and amplify the data of the DRAM cell groups output to the bit lines. The data detected and amplified by the sense amplifiers are written in the DRAM cell groups again through the bit lines. After a predetermined time from the re-write of the data, the word lines are switched to a non-selection state to equilibrate the bit line and sense amplifiers potential, completing a refresh operation.

11. Non-Operation Command

Non-operation commands of CKE=H, /CS=L, and /RAS=/CAS=/WE=H shown in FIG. 16 are not execution commands.

12. Device Non-Selection Command

Device non-selection commands of CKE=H, /CS=H shown in FIG. 17 are not execution commands.

13. Register Setting Command

Figure 19:
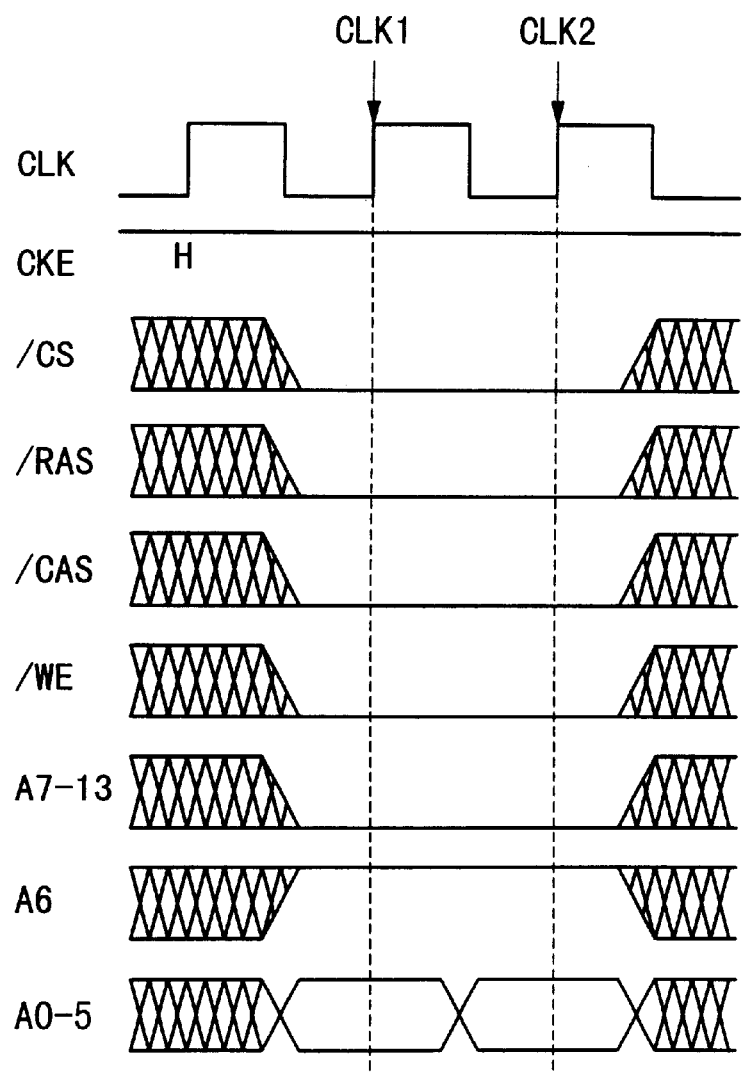
FIG. 19 shows states of the external terminals showing the register setting command (2) shown in FIG. 5.

The register setting command is to set setting data in various operation modes in a register. As shown in FIGS. 18 and 19, the states of the respective input control signals at the rising edges of the external clock signal are CKE=H, and /CS=/RAS=/CAS=/WE=L. At a time of input of this command, valid data of the addresses A0 to A13 are input as setting data of operation modes. An input of a register setting by this command is necessary in order to initialize a device after a power source is connected.

FIG. 20 shows an operation by address data at the register setting command. Portions of register setting commands (a), (b), (c) and (d) shown in FIG. 20 are input by one clock shown in FIG. 18 and another portion of the register setting command (d) to be described later is input by two clocks shown in FIG. 19. The register setting command (a) in FIG. 20 is a test set of a refresh counter, which is similar to that of a usual synchronous DRAM. This address set is selected upon the input of A7=H and A8=L. The register setting command (b) in FIG. 20 is an unused set. This address set is selected upon the input of A7=L and A8=H. The register setting command (c) in FIG. 20 is a device test set. This address set is selected upon the input of A7=H and A8=H. The register setting command (d) in FIG. 20 is a mode register setting set. This address set is selected upon the input of A7=L and A8=L, and various data input/output modes to be described later are set. A mode register stores data input/output modes of the respective SRAM cell groups of the sub memory portion.

Figure 21:
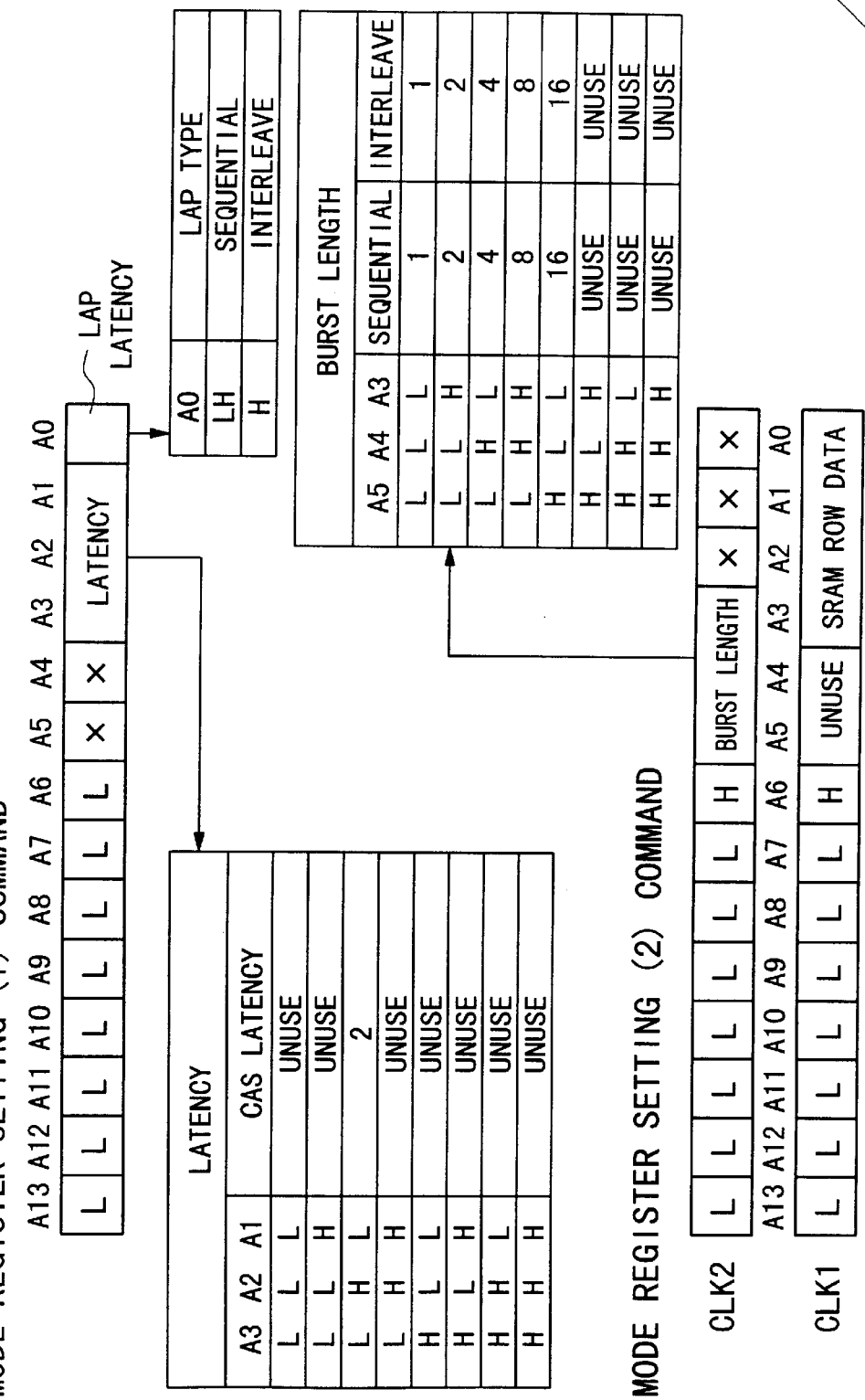
FIG. 21 shows states of the external terminals showing the mode register setting command which is a portion of the register setting command shown in FIG. 5.

FIG. 21 is a list of detailed setting items of the mode register setting. A mode register setting (1) command is to switch between a latency mode and an input/output address sequence (lap type). This command is input by one clock of an external clock signal such as shown in FIG. 18. This address set is selected when A6=L, A7=L, and A8=L. The latency mode setting is determined by data of A1, A2 and A3 input simultaneously, and the input/output sequence (lap type) is set by data of A0. The latency mode is set to latency=2 when A1=L, A2=H, and A3=L and, otherwise, switches to non-setting or unused state. The input/output address sequence (lap type) is set to sequential when A0=L and to interleave when A0=H.

The mode register setting (2) command is an address data set for setting a burst length of every selected row of the SRAM and, in order to input the row assignment of the SRAM and the burst length data, is continuously input over two clocks of the external clock signal as shown in FIG. 19. This address set is selected when A6=H, A7=L, and A8=L. An SRAM cell group is selected by data of A0, A1, A2 and A3 of the first clock CLK1, and the burst length of the selected cell group is set by data of A3, A4, and A5 of the next clock CLK2. The burst length is set to 1 when A3=L, A4=L, and A5=L, to 2 when A3=H, A4=L, and A5=L, to 4 when A3=L, A4=H, and A5=L, to 8 when A3=H, A4=H and A5=L, and to 16 when A3=L, A4=L, and A5=H.

Various data input/output modes will be described briefly.

Figure 22:
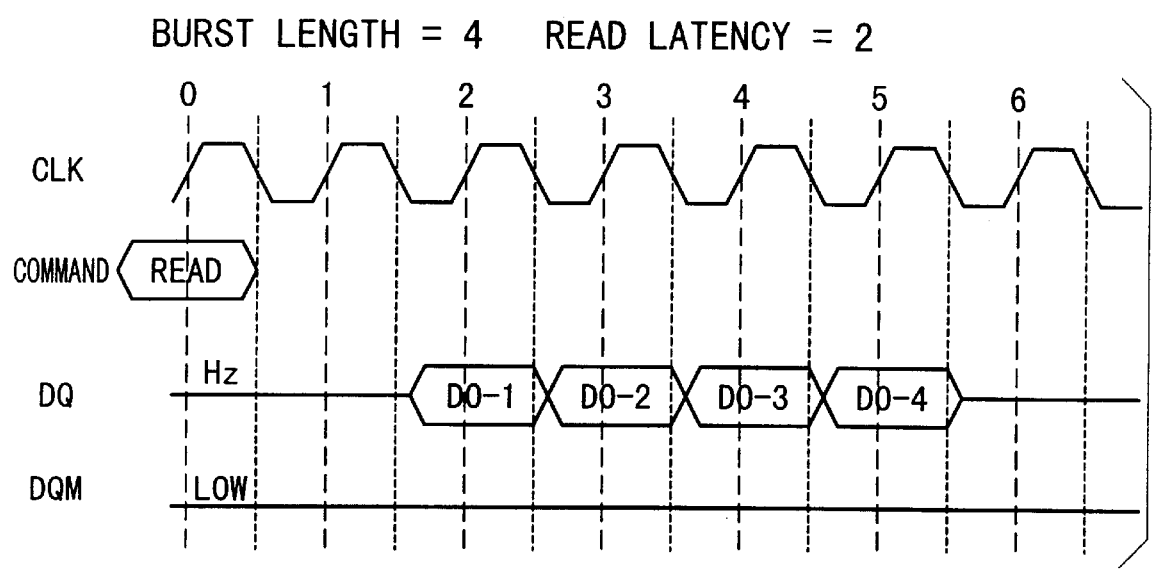
FIG. 22 shows an address sequence accessed corresponding to respective lap times and burst lengths of data input/output mode.
Figure 23:
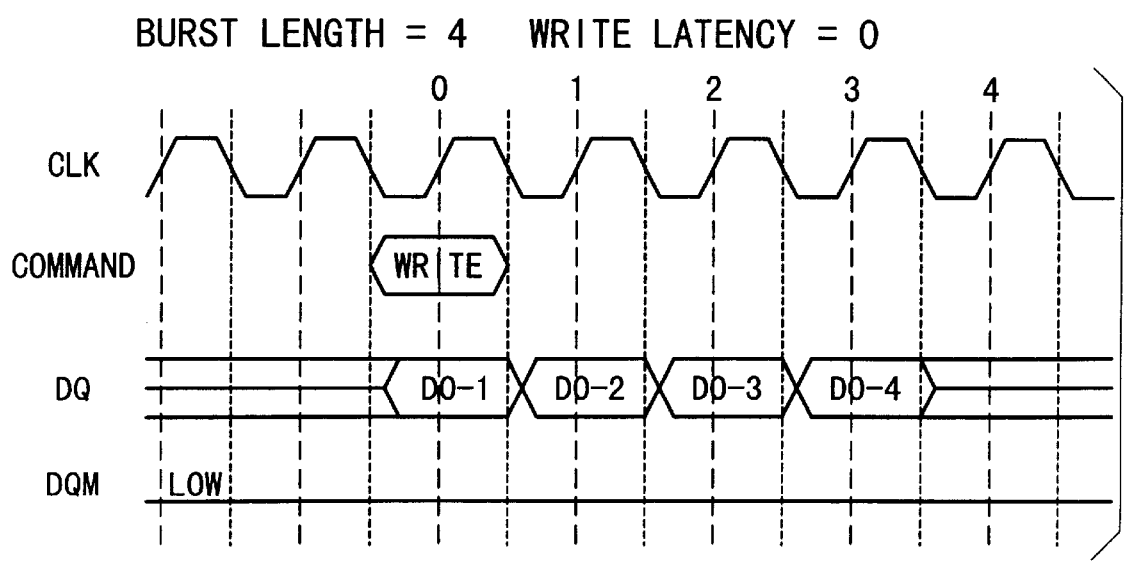
FIG. 23 is a timing chart of data output having a burst length of 4 and a read latency of 2 at a read command input.

Burst Length: burst length represents the number of data continuously input/output by the input of a read command or write command. The continuous data input/output is performed on the basis of a clock signal. FIG. 22 shows a timing of the respective signals for data read, in which the burst length is 4. That is, when the read command is input at CLK0, four data D0-1 to D0-4 are successively output at CLK2, CLK3, CLK4, and CLK5. FIG. 23 shows a timing of the respective signals for data write. Since the burst length is 4, when the write command is input at CLK0, four data D0-1 to D0-4 are successively input at CLK0, CLK1, CLK2, and CLK3.

Latency: latency represents a waiting time by the number of clocks from the input time of a read command or write command to a time at which data input/output becomes possible. FIG. 22 shows a timing of respective signals when the data is read. In this embodiment, the latency at data read is 2. That is, when a read command is input at CLK0, output of data to a DQ terminal is started at CLK2. FIG. 23 shows a timing of the respective signals when the data is written. In this embodiment, the latency when the data is written is 0. That is, when the write command is input at CLK0, the data take-in from the DQ terminal is started simultaneously with the CLK0 input.

Lap Type: Lap type (input/output address sequence) determines an address sequence of data input/output when data is input/output successively for a time corresponding to a set burst length, and includes sequence and interleave. Another operation is a function control by control of the clock enable signal CKE, as in the usual synchronous DRAM.

A portion of the operation of the semiconductor memory device according to the present invention will be described.

Read operation when there is externally assigned data in the SRAM portion: as shown in FIG. 24, data assigned by a read command is only output externally through a data amplifier.

Read when there is no externally assigned data in the SRAM portion: after the active command shown in FIG. 28 is completed, the prefetch command shown in FIG. 26 is executed, and the assigned data is transferred to the SRAM portion. Then, the assigned data is externally output through the data amplifier by the read command shown in FIG. 24.

Read when there is no externally assigned data in the SRAM portion and there is a write data which is not restored as yet: the write data is transferred to the DRAM portion by the restore command shown in FIG. 27. Thereafter, the active command shown in FIG. 28 and the prefetch command shown in FIG. 26 are executed, and the assigned data is transferred to the SRAM portion. Then, the assigned data is output externally through the data amplifier by the read command shown in FIG. 24.

(6) Layout

1. Overall Layout

Figure 30:
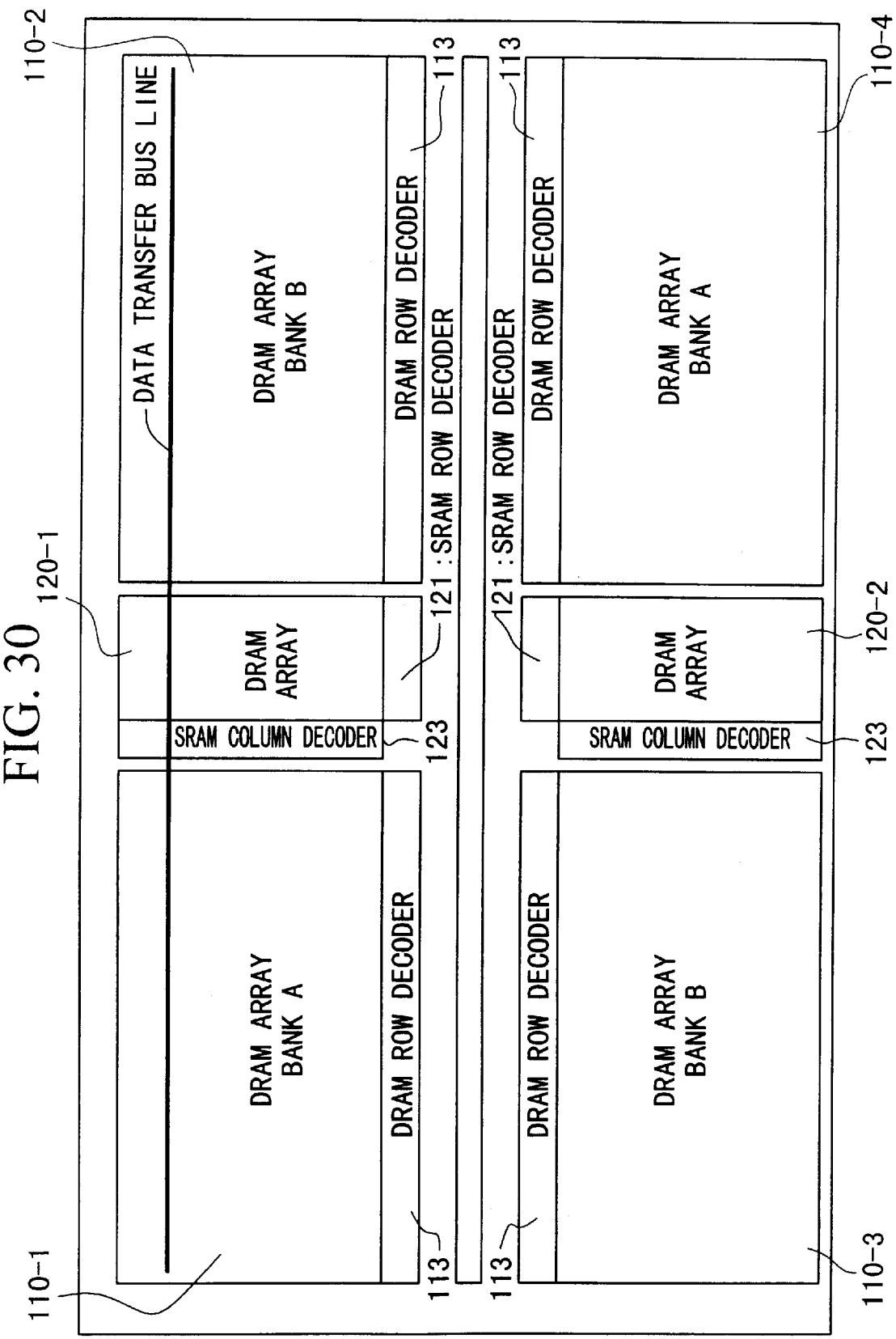
FIG. 30 schematically shows a whole layout of chips of a semiconductor memory device according to an embodiment of the present invention.

FIG. 30 shows an overall chip layout of an embodiment of the semiconductor memory device to which the present invention is applied. The semiconductor memory device shown in FIG. 30 includes a 64-Mbit DRAM array of x8-bit, 2-bank construction as the main memory portion, a 16-Kbit SRAM array as a sub memory portion, and a synchronous interface. However, it is possible to construct the semiconductor memory device in other ways.

A cross-shaped area including a vertical center portion and a lateral center portion is provided as shown in FIG. 30. DRAM arrays 110-1, 110-2, 110-3 and 110-4 each having a memory capacity of 16 Mbits are arranged in four areas divided by the cross-shaped area, respectively. The overall memory capacity of the DRAM arrays 110-1, 110-2, 110-3 and 110-4 is 64 Mbits. DRAM row decoders 113 are provided adjacent to the lower portions of the DRAM arrays 110-1 and 110-2, respectively. Similarly, DRAM row decoders 113 are arranged adjacent to upper portions of the DRAM arrays 110-3 and 110-4, respectively.

An SRAM row decoder 121 and an SRAM column decoder 123 are arranged between the DRAM arrays 110-1 and 110-2 serve as an SRAM array 120-1. Similarly, an SRAM array 120-2, an SRAM row decoder 121, and a column decoder 123 are arranged between the DRAM arrays 110-3 and 110-4. The data transfer bus line traverses the DRAM array 110-1, the SRAM array 120-1, and the DRAM array 110-2 such that the data transfer between selected DRAM cell groups and a selected SRAM cell group is possible. Similarly, the data transfer bus line traverses the DRAM array 110-3, the SRAM array 120-2, and the DRAM array 110-4 such that selected DRAM cell groups and a selected SRAM cell group is possible. An operation control circuit and a data control circuit, etc., are arranged in other portions of FIG. 30. Although other arrangements may be possible, an input/output signal terminal is arranged in the lateral center portion in the shown embodiment.

Figure 31:
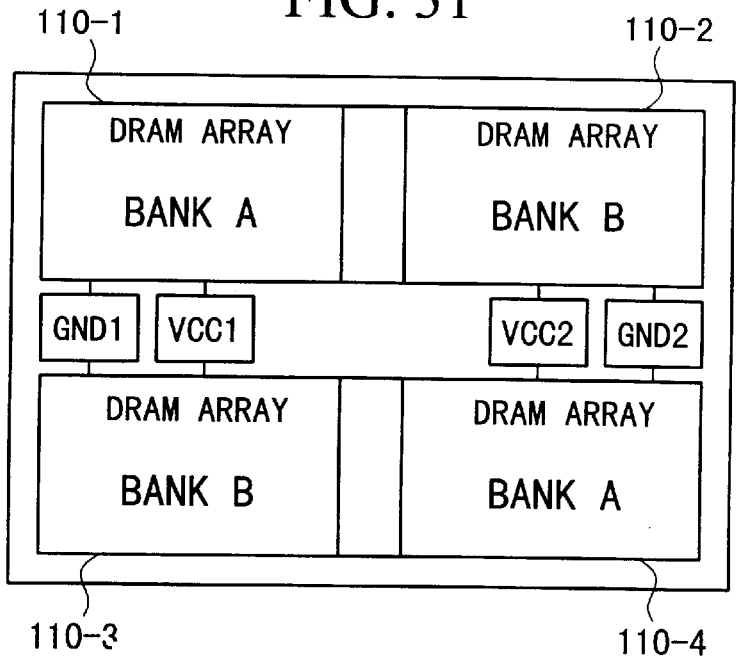
FIG. 31 schematically shows blocks which use a common power source of a semiconductor memory device according to an embodiment of the present invention.

In FIG. 30, the main memory portion has the 2-bank construction having a layout in which portions which are selected simultaneously are not concentrated in a portion so that, when the bank A is selected, the DRAM arrays 110-1 and 110-4 are selected simultaneously and, when the bank B is selected, the DRAM arrays 110-2 and 110-3 are selected simultaneously. FIG. 31 shows an internal power source wiring VCC and an internal ground wiring GND. Thus, a load on an internal power source wiring VCC and an internal ground wiring GND, etc., is not one sided because areas to be selected simultaneously are dispersed.

In the following, the arrangement of the banks, the power source wiring, and the ground wiring are explained in more detail. In the embodiment shown in FIG. 30, the DRAM arrays 110-1 and 110-4 constitute the bank A, and the DRAM arrays 110-2 and 110-3 constitute the bank B. That is, each of the banks A and B is comprised of a plurality of memory arrays.

As shown in FIG. 31, the memory arrays constituting the respective banks have the power source wiring and the ground wiring. In other words, one source for supplying the power source potential and the ground potential (a pad or an internal power source circuit) is connected to banks which are not to be simultaneously activated. In this example, in the bank A, the DRAM array 110-1 is connected the power source wiring VCC1 and the ground wiring GND1, and the DRAM array 110-4 is connected to the power source wiring VCC2 and the ground wiring GND2. In the bank B, the DRAM array 110-2 is connected to the power source wiring VCC2 and the ground wiring GND2, and the DRAM array 110-3 is connected to the power source wiring VCC1 and the ground wiring GND1. Thus, in one bank, the power source wiring and the ground wiring for one of the memory arrays are separated from those for the other memory arrays.

Both the power source wiring and the ground wiring need not be always separated, and at least one of the power source and the ground may be separated.

Further, the power source and the ground for the DRAM arrays may not be separated, and may be electrically connected. In this case, power source pads or setting pads corresponding to the respective DRAM arrays are provided, and the electric potential for the power source wiring or the setting wiring for the respective DRAM arrays may be stabilized.

In the embodiment shown in FIG. 30, the memory arrays in the same banks are diagonally located. The neighboring memory arrays belong to different banks, so that the memory arrays in the same bank are not adjacent. As shown in FIG. 31, the power source wiring and the ground wiring are used in common by the memory cell arrays which belong to different banks. Specifically, the DRAM array 11-1 in the bank A and the DRAM array 110-3 in the bank B use in common the power source wiring VCC1 and the ground wiring GND1, and the DRAM array 110-2 in the bank B and the DRAM array 110-4 in the bank A use in common the power source wiring VCC2 and the ground wiring GND2.

While the memory arrays, which are diagonally positioned, belong to the same bank in the embodiment shown in FIGS. 30 and 31, bank A may be comprised of the DRAM arrays 110-1 and 110-3, and bank B may be comprised of the DRAM arrays 110-2 and 110-4. The number of the divisions may be increased, and the areas, which are to be simultaneously selected, may be dispersed or decreased. When the bank A is comprised of the DRAM arrays 110-1 and 110-3 and the bank B is comprised of the DRAM arrays 110-2 and 110-4, the power source wiring VCC1 and the ground wiring GND1 are assigned to the DRAM arrays 110-1 and 110-3, the power source wiring VCC2 and the ground wiring GND2 are assigned to the DRAM arrays 110-3 and 110-4, and the power source wiring and the ground wiring must be modified so that the different power source wiring and the different ground wiring are assigned to the respective DRAM arrays in the same bank. According to the assignment of the power source wiring and the ground wiring to the DRAM arrays in the banks, the current flowing through the power source wiring and the ground wiring is dispersed, and it is possible to reduce noise in the connections due to this current.

The function for reducing the noise will be explained.

To transfer data between the DRAM portion (main memory) and the SRAM portion (sub memory), one of the banks A and B in the DRAM portion is selected. That is, the two banks are not simultaneously activated. In FIGS. 30 and 31, assuming that the bank A is selected, the DRAM array 110-1 in the bank A uses the power source wiring VCC1 and the ground wiring GND1, and the DRAM array 110-4 uses the power source wiring VCC2 and the ground wiring GND2. That is, the DRAM arrays uses the different power source wiring and the ground wiring, and the power source wiring and the ground wiring of one of the arrays are separated from those of the other array.

When bank A is activated and the DRAM arrays 110-1 and 110-4 in the bank A become the targets of the read/write operation, the power source potential and the ground potential are supplied to these DRAM arrays through different power source wiring and ground wiring. While the power source wiring VCC1 and the ground wiring GND1 are connected to the DRAM array 110-3 as well as the DRAM array 110-1 and the power source wiring VCC2 and the ground wiring GND2 are connected to the DRAM array 110-2 as well as the DRAM array 110-4, the operating current does not flow in the DRAM arrays 110-2 and 110-3 because the bank B is not activated.

As the result, the current does not concentrate on a part of the power source wiring and the ground wiring, and the operating current for the DRAM arrays is not concentrated. Further, because the two banks are not simultaneously activated, the power source wiring and the ground wiring do not simultaneously supply the power source potential and the ground potential to the DRAM arrays in banks A and B. Thus, the noise on the power source wiring and the ground wiring for the arrays is reduced and suppressed.

Similarly, when the bank B is activated, the current in the DRAM array in the bank B is dispersed, and the noise due to this current is effectively suppressed.

(7) Detailed Description of the Respective Blocks

The respective circuit blocks of the overall block diagram shown in FIG. 1 will be described in detail. It should be noted that the following description is simply for a embodiment and this invention is not limited thereto.

1. Operation Control Circuit

Figure 32:
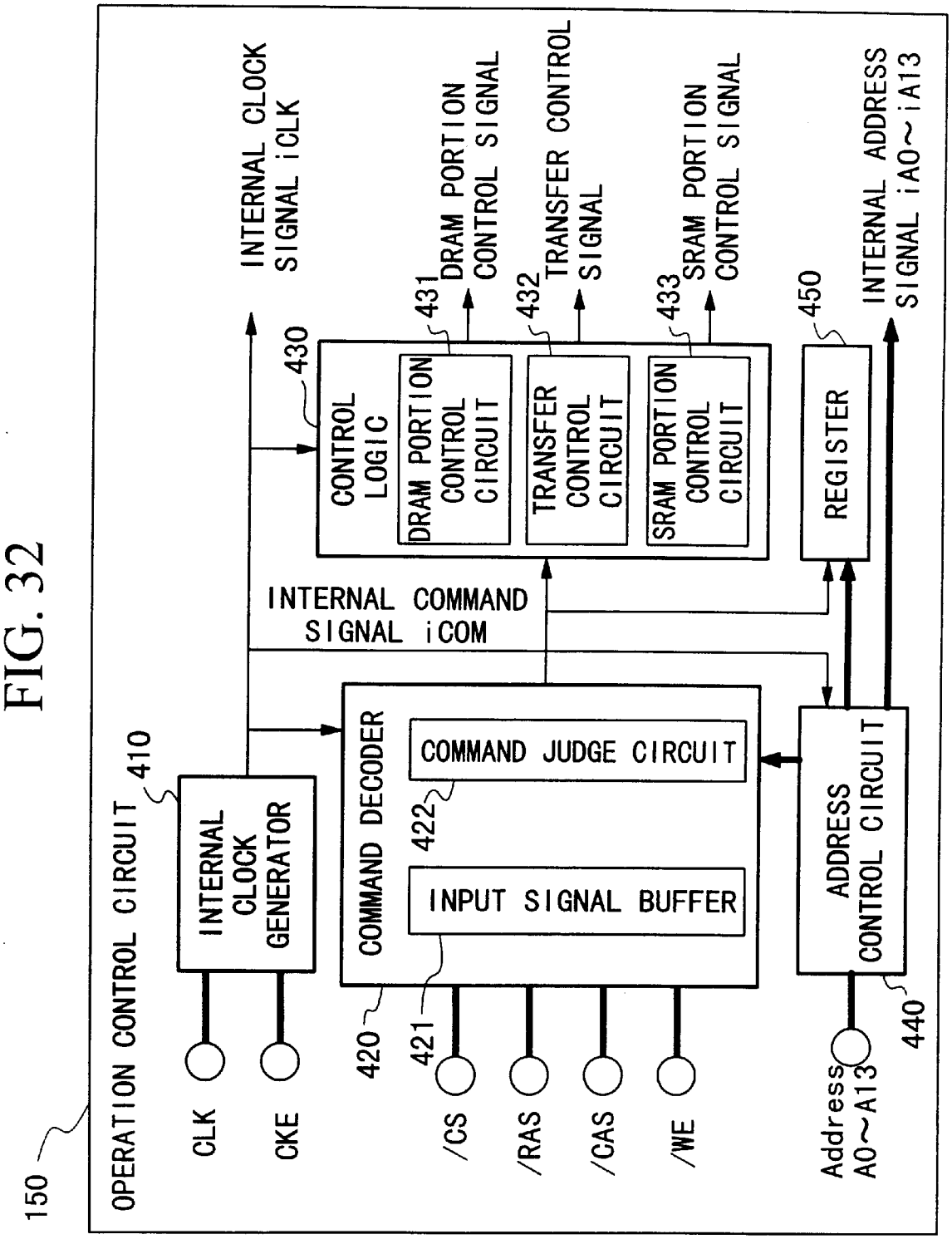
FIG. 32 is a block diagram of an operation control circuit of the semiconductor memory device shown in FIG. 1.

FIG. 32 is a circuit diagram of the operation control circuit 150. The operation control circuit 150 is constructed with an internal clock generator circuit 410, a command decoder 420, a control logic 430, an address control circuit 440 and a mode register 450. The internal clock generator circuit 410 generates an internal clock signal iCLK from the external input signals CLK and CKE. The internal clock signal iCLK is supplied to the command decoder 420, the control logic 430, the address control circuit 440, and the data control circuit to control the timing of the respective portions.

The command decoder 420 includes a buffer 421 for receiving the respective input signals and a command judge circuit 422. The /CS signal, the /RAS signal, the /CAS signal and the /WE signal are transmitted to the command judge circuit 421 in synchronism with the internal clock signal iCLK to generate an internal command signal iCOM. The command generator circuit 421 responds to the respective input signals in the manners indicated in the correspondence table of the commands and the respective input terminal states as shown in FIG. 5. The control logic 430 responds to the internal command signal iCOM, the internal clock signal iCLK, and the register signal iREG to generate the control signal necessary to perform operations assigned by these signals.

The control logic 430 includes a DRAM control circuit 431, a transfer control circuit 432, and an SRAM control circuit 433 which generate respective control signals. The register 450 functions to store data defined by a combination of data of a specific address input when it receives a specific register write signal from the command judge circuit, and stores the data until a register write signal is input again. The data held in the register is referenced when the control logic 430 is operated.

2. DRAM Portion

DRAM Portion and Data Transfer Circuit

Figure 33:
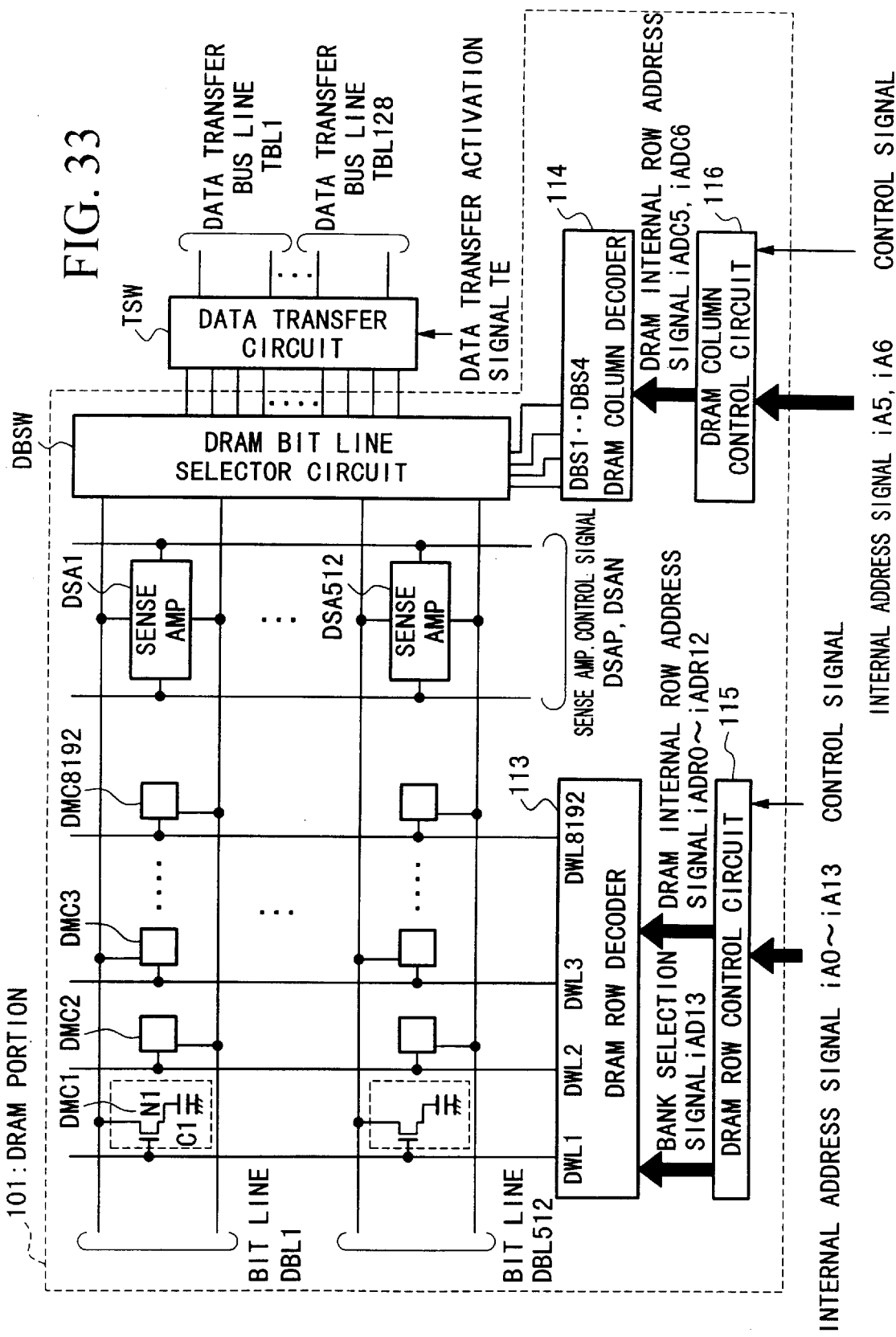
FIG. 33 shows in detail a construction of the DRAM portion and the data transfer circuit shown in FIG. 1.

FIG. 33 shows a concrete construction of the DRAM portion and the data transfer circuit shown in FIG. 1. In FIG. 33, the DRAM portion 101 includes a plurality of dynamic memory cells DMC arranged in a matrix. Each memory cell DMC includes a memory transistor N1 and a memory capacitor C1. A constant potential Vgg (½Vcc, etc.) is applied to one terminal of the memory capacitor C1. Further, the DRAM portion 101 includes DRAM word lines DWL to which the DRAM cells DMC are connected in rows, and DRAM bit lines DBL to which the DRAM cells DMC are connected in columns. Each bit line is paired with a complementary bit line. The DRAM cells DMC are positioned at cross points of the word lines DWL and the bit lines DBL, respectively.

The DRAM portion 101 includes DRAM sense amplifiers DSA correspondingly to the bit lines DBL. The sense amplifier DSA functions to detect and amplify a potential difference between the paired bit lines, and is controlled by sense control signals DSAP and DSAN. Since the DRAM array has a x8-bit, 2-bank construction and has a memory capacity of 64 Mbits, the DRAM array includes word lines DWL1 to DWL8192, bit lines DBL1 to DBL512 and sense amplifiers DSA1 to DSA512. This is a construction corresponding to x1 bit of 1 bank.

The DRAM portion 101 includes the DRAM row decoder 113 for selecting one of the word lines DWL1 to DWL8192, and the DRAM row control circuit 115 for generating DRAM internal row address signals iADR0 to iADR12 and bank selection signal iAD13. Further, the DRAM portion 101 includes a DRAM bit line selection circuit DBSW which selects one of four bit line pairs by the DRAM bit line selection signals DBS1 to DBS4 generated by the DRAM column decoder 114, and connects it to the data transfer bus line TBL through the data transfer circuit 103. Further, the DRAM portion 101 includes a DRAM column control circuit 116 for generating DRAM column address signals iADC5 and iADC6 which are used by the DRAM column decoder.

Figure 34:
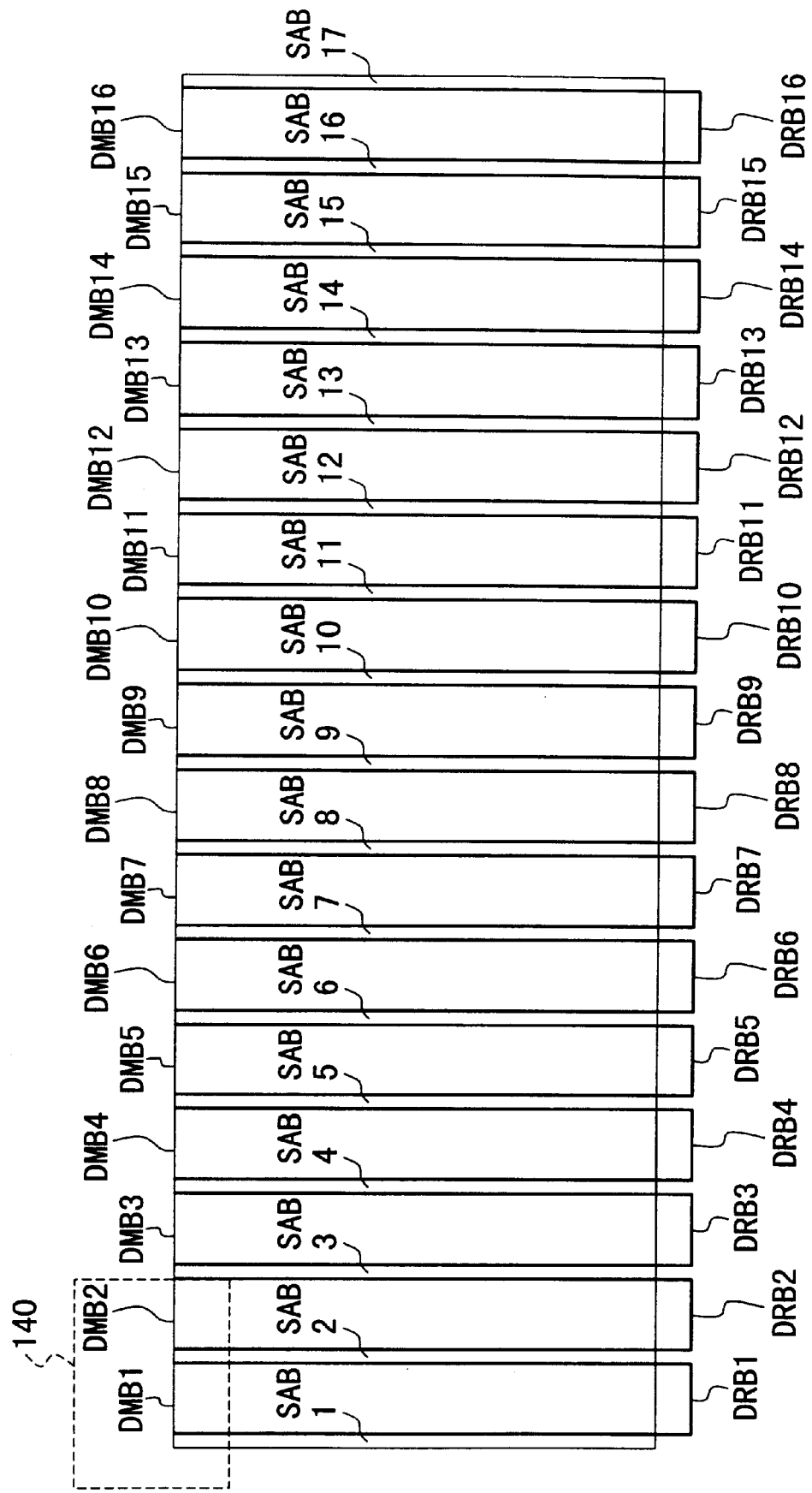
FIG. 34 shows in detail an example of the array construction of a DRAM array 110-1 of the whole layout which is an embodiment of the present invention shown in FIG. 30

FIG. 34 shows an example of a concrete array construction of the DRAM array 110-1 of the overall layout shown in FIG. 30. In FIG. 34, the DRAM array is divided into 16 memory cell blocks DMB1 to DMB16. DRAM row decoders DRB1 to DRB16 corresponding to the respective memory cell blocks DMB1 to DMB16, and blocks SAB1 to SAB17 corresponding to (sense amplifier+DRAM bit line selector circuit+data transfer circuit) are provided. In this figure, each memory cell blocks DMB1 to DMB16 has a memory capacity of 1 Mbits in 512 rows×2048 columns. It should be noted that the number of memory cell blocks is not limited to 16.

As shown in FIG. 34, when the DRAM memory cell array is divided into a plurality of portions, the length of each bit line is shortened. Therefore, the capacitance of the bit line is reduced, and it is possible to increase the potential difference between the paired bit lines when data is read out. Further, since, during the operation, only the sense amplifier corresponding to the memory block including the word line selected by the row decoder is operated, it is possible to reduce power consumption due to charging/discharging of the bit line.

Figure 35:
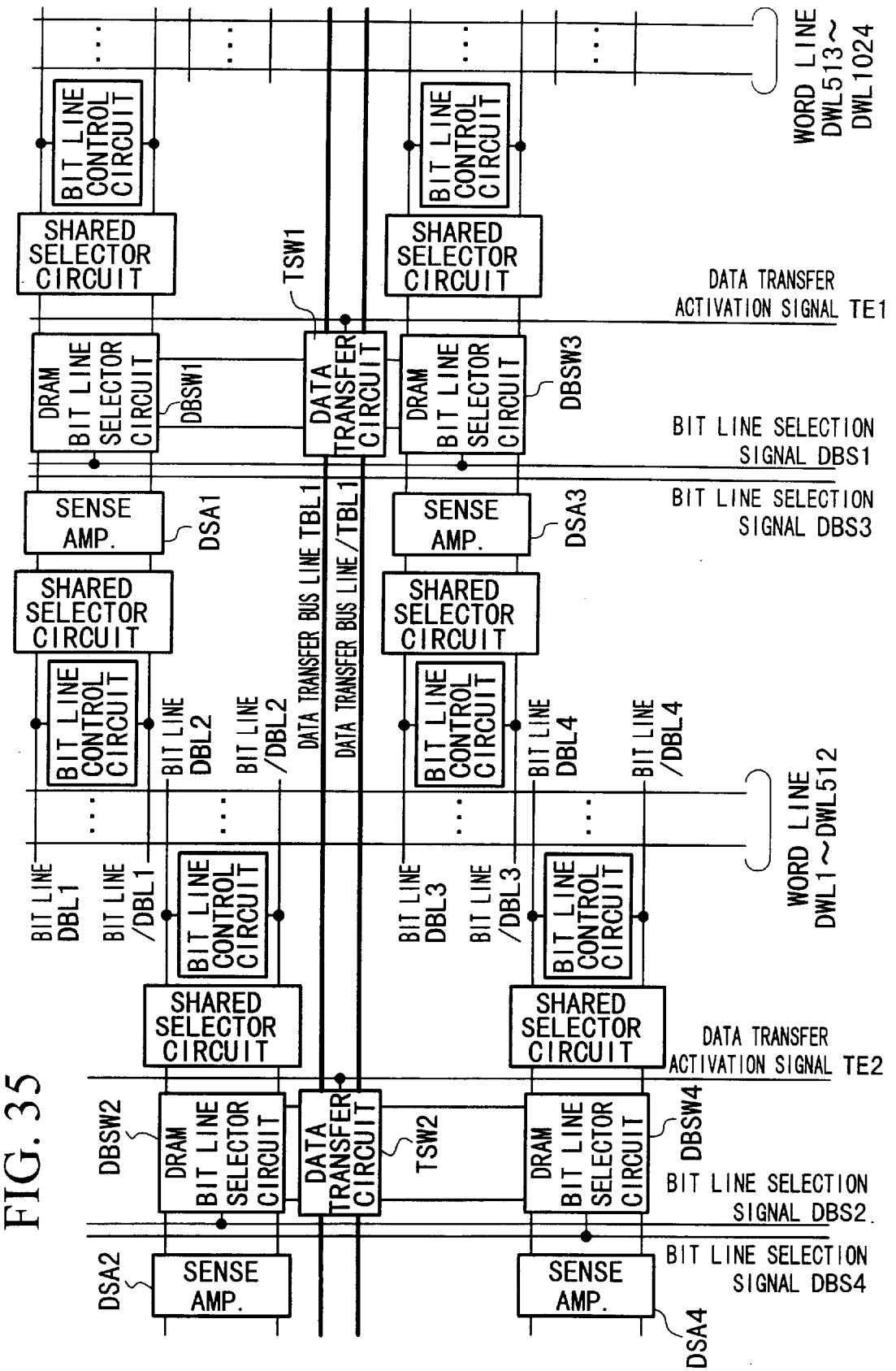
FIG. 35 shows in detail an example of the connection relationship between the transfer bus line and the bit lines for a portion (corresponding to 4 pairs of bit lines) of the layout shown in FIG. 34.

FIG. 35 shows, in detail, an example of a connecting relation between the transfer bus line and bit lines in a portion 140 (including 4 pairs of bit lines) of the layout shown in FIG. 34. In FIG. 35, sense amplifiers DSA are arranged in zigzag manner such that a sense amplifier DSA1 corresponding to one column is located in one end of a memory cell block and a sense amplifier DSA2 corresponding to a next column is located in the other end of the memory cell block, etc. Such a zigzag arrangement of the sense amplifiers is employed for the reason that, although the size of the memory cell can be miniaturized in the recent process technology, the miniaturization of sense amplifier in proportion to the miniaturization of memory cell has not been achieved, and become necessary when there is no margin for arranging the sense amplifiers correspondingly to the bit line pitch. Therefore, when the bit line pitch is large enough, the sense amplifiers can be arranged in only one end of the memory cell block. One sense amplifier DSA is commonly used by two memory cell blocks through a shared selector circuit. Each bit line pair is provided with a bit line control circuit for equilibrating a potential difference between the bit lines thereof and precharging. The bit line control circuit may be used by two memory cell blocks similarly to the sense amplifier.

Figure 36:
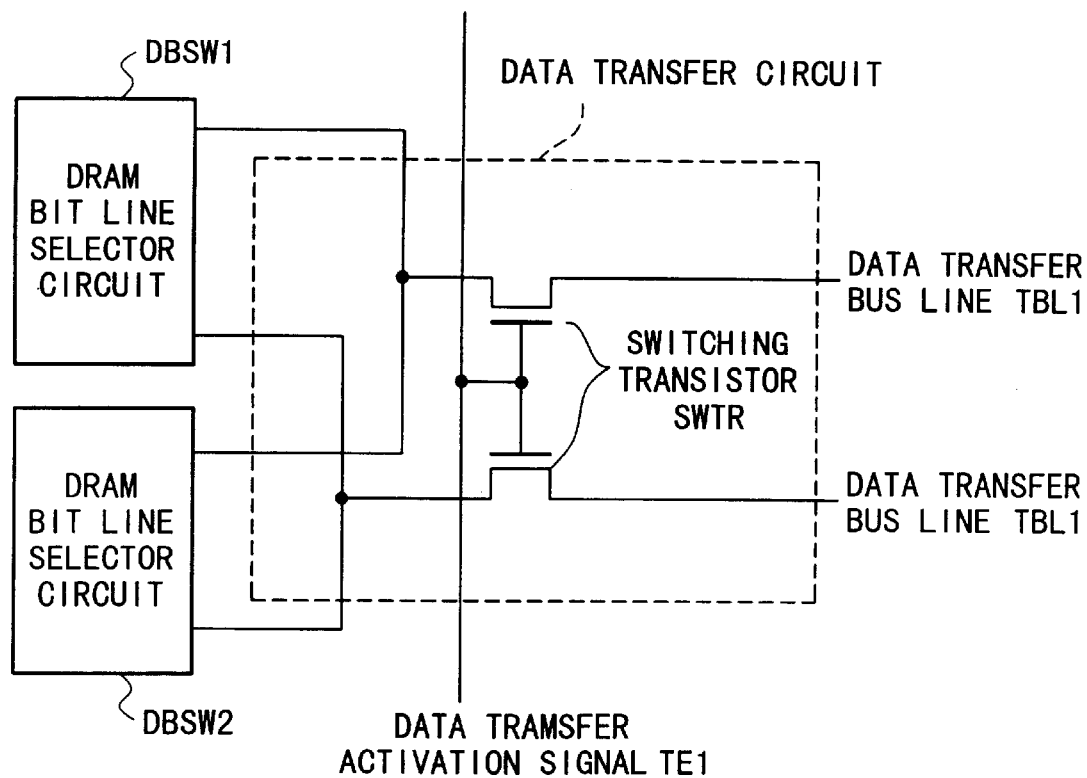
FIG. 36 is a circuit diagram showing the data transfer circuit in detail.

The bit lines and the data transfer bus lines are connected through DRAM bit line selector circuits DBSW1 to DBSW4 selected by DRAM bit line selection signals DBS1 to DBS4 and data transfer circuits TSW1 and TSW2 which use switching transistors SWTR each shown in FIG. 36, in detail. Data transfer activation signals TE1 and TE2 for activating the data transfer circuits are obtained by logical operation of the transfer control signal generated by the operation control circuit shown in FIG. 32 and the address signals for selecting the memory cell block. In FIG. 35, since the bit line is connected to the data transfer bus line through the data transfer circuit, the data transfer circuit of a memory cell block, which is not activated, is in a non-conduction state and there is no load on a DRAM bit line selection circuit connected thereto. There, it is possible to minimize the load on the data transfer bus line in operation. In the construction shown in FIG. 35, however, there is the problem that the chip area is increased since the data transfer circuits are required and the wiring for transmitting the data transfer activation signal for activating the data transfer circuits must be provided.

Figure 37:
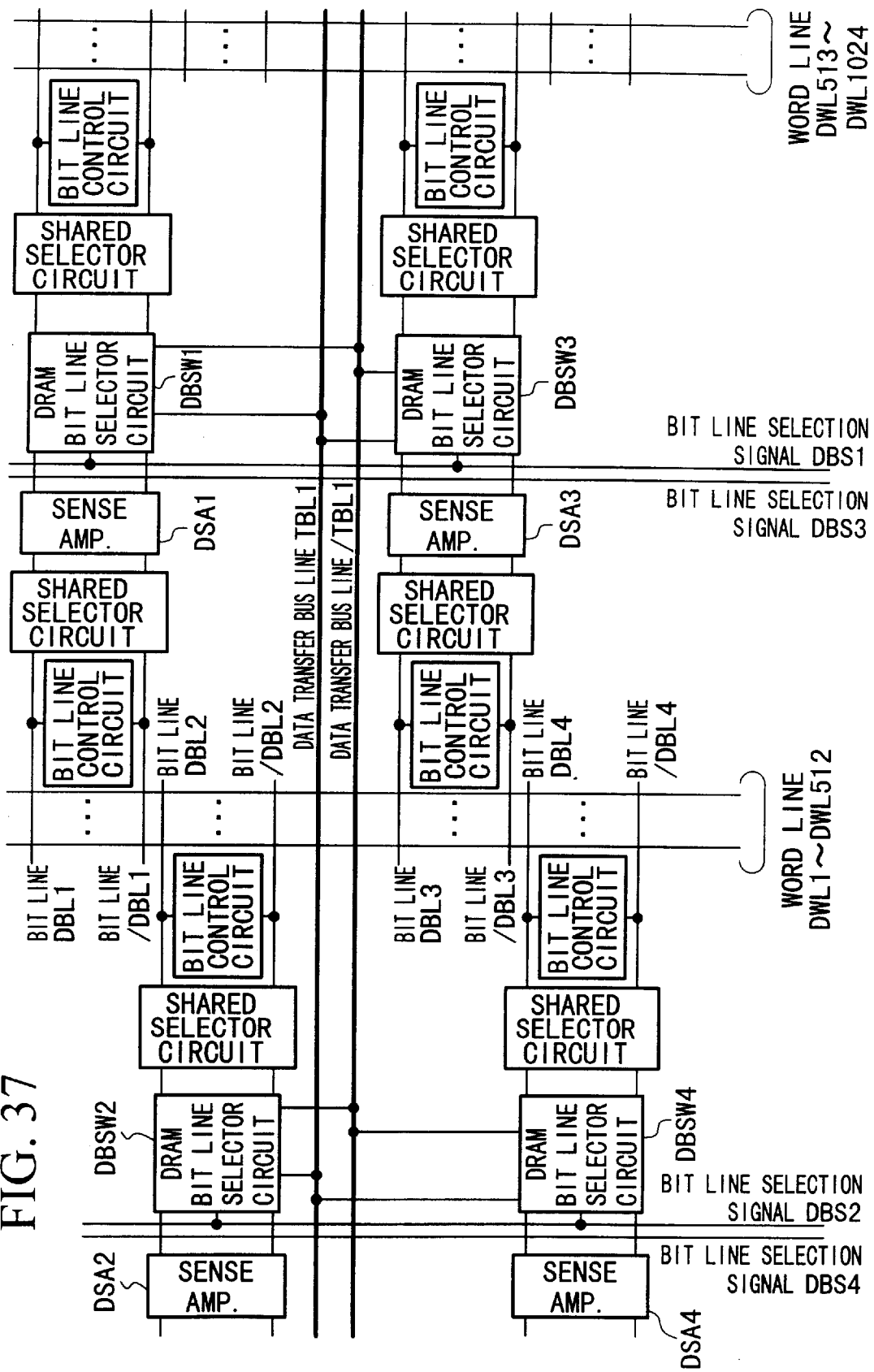
FIG. 37 shows an example of a construction for solving the problem of the example shown in FIG. 35.

FIG. 37 shows an example of construction which solves such problem. In FIG. 37, the bit line and the data transfer bus line are connected to each other through only the DRAM bit line selector circuits DBSW1 to DBSW4 selected by the DRAM bit line selection signals DBS1 to DBS4. This construction can be realized by providing the function of the data transfer circuit by adding a logic of the data transfer activation signal to the DRAM column decoder generating the DRAM bit line selection signal DBS1 to DBS4. Although the load on the data transfer bus line is increased during operation, it is possible to make the chip area very small.

The activation of the DRAM portion and the column selection and data transfer operation will be described with reference to FIGS. 33 and 35. The activation of the DRAM portion will be described first. In FIG. 33, when the DRAM row selection control signal, which is one of the DRAM portion control signals generated by the operation control circuit shown in FIG. 32, and the internal address signal iA0 to iA13 are input into the DRAM row control circuit 115, the bank selection signal iAD13 and the internal DRAM row address signal iADR0 to iADR12 are generated and the word line DWL of the bank assigned by the DRAM row decoder 113 is selected. With the selected word line DWL, data held in the cell DMC is output to the bit line DBL. The potential difference between the paired bit lines is detected and amplified by the sense amplifier DSA in response to the sense amplifier drive signals DSAN and DSAP. The number of sense amplifiers activated simultaneously in the DRAM portion 101 is 512, and, since the DRAM portion has the x8-bit construction, the total number of the simultaneously activated sense amplifiers becomes 512×8=4096.

The column selection of the DRAM portion and the data transfer will be described. The DRAM column selection circuit 116 shown in FIG. 33 is input with a control signal which is one of the DRAM portion control signals generated by the operation control circuit shown in FIG. 32 in response to the internal address signals iA5 and iA6 and generates the DRAM column address signals iADC5 and iADC6. The DRAM column address signals iADC5 and iADC6 are input into the DRAM column decoder 114, and, after the DRAM bit line selection signals DBS1 to DBS4 are generated and the bit line is selected, data of the bit line is transmitted to the data transfer bus line TBL by the data transfer activation signal TE obtained by a logic between the transfer control signal generated by the operation control circuit shown in FIG. 32 and the address signal for selecting the memory cell block. As shown in FIG. 37, with the logic of the data transfer activation signal in the DRAM column decoder, it is possible to provide the data transfer circuit function, and the DRAM bit line selection signals DBS1 to DBS4 can be made signals with which the column selection and the transfer operation are performed simultaneously.

Assuming, in FIG. 37, that the DRAM bit line selection signal DBS1 is selected, a signal synchronized with the transfer control signal is input into the DRAM bit line selection circuit DBSW1, and the data on the bit lines DBL1 and /DBL1, which is amplified by the sense amplifier DSA1, is transmitted to the data transfer bus lines TBL1 and /TBL1. The DRAM portion 101 shown in FIG. 37 includes 128 each of the portions shown in FIG. 33, and, since it has the x8-bit construction, a total number of data transferred simultaneously from the bit line to the transfer bus line is 128×8=1024. This number of data transferred simultaneously is the same in other bit constructions.

DRAM Row Control Circuit and DRAM Row Decoder

Figure 38:
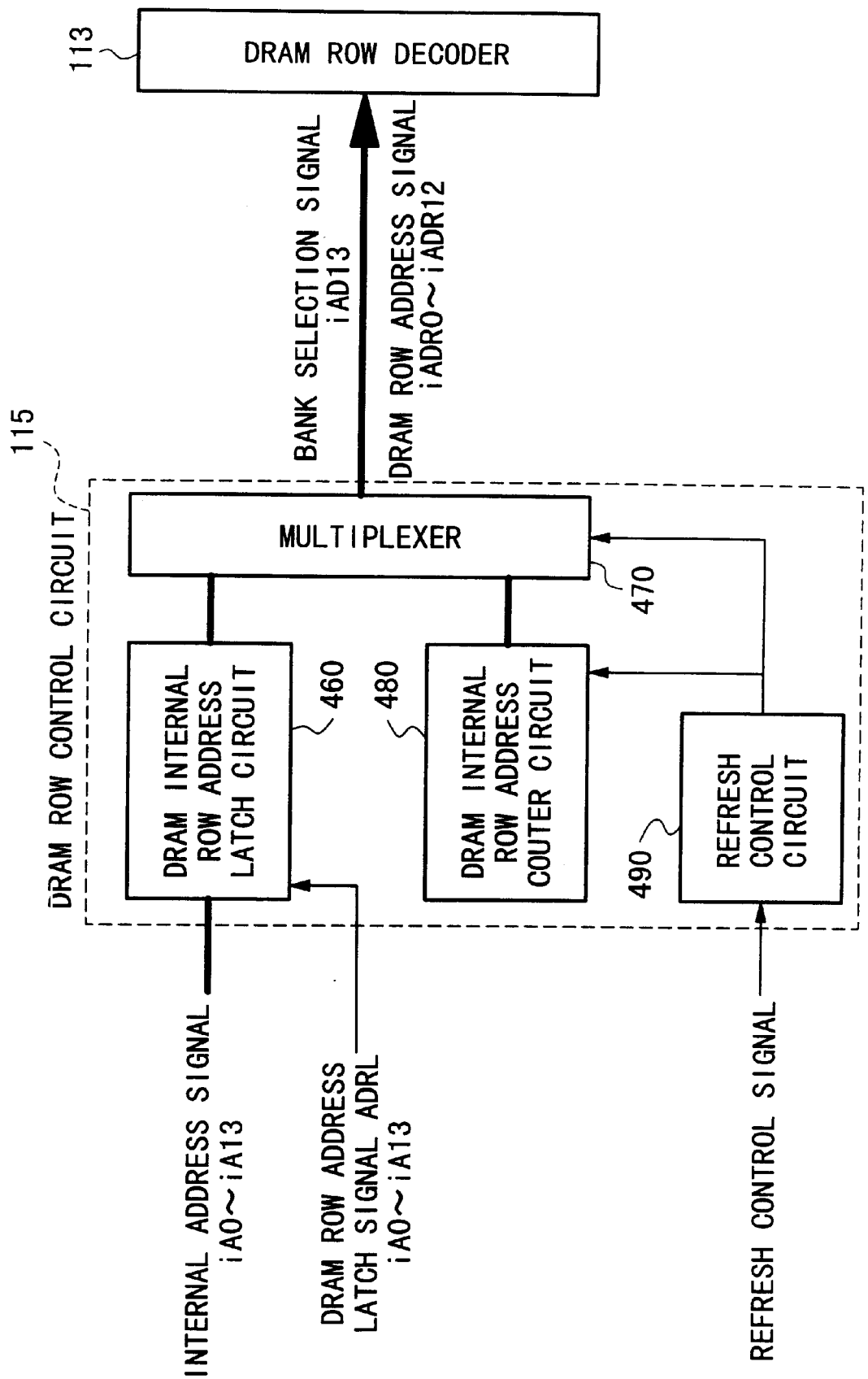
FIG. 38 is a block diagram showing an example of a DRAM line control circuit.

FIG. 38 is a block diagram of the DRAM row control circuit 115. The DRAM row control circuit 115 includes a DRAM internal row address latch circuit 460, a multiplexer 470, an internal address counter circuit 480, and a refresh control circuit 490. In the usual activation of the DRAM portion, the address latch circuit 460 receives the DRAM row address latch signal ADRL, and the internal address signal iA0 to iA13 to the DRAM row decoder 113. The DRAM row control circuit 115 outputs the DRAM internal row address signal iADR0 to iADR12 and the bank selection signal iAD13 through the multiplexer 470 from the address latch circuit 460.

In the refresh operation, the DRAM row control circuit 115 receives the refresh control signal, and the refresh control circuit 490 operates the internal address counter circuit 480 to control the multiplexer 470 such that the selection signal from the internal address counter circuit is output. As a result, the DPAM internal row address signal iADR0 to iADR12 and the bank selection signal iAD13 are output to the DRAM row decoder 113 without input of the address signal. The internal address counter circuit 480 automatically adds or subtracts the address according to a predetermined method every time the refresh operation is performed, making an automatic selection of all of the DRAM rows possible.

DRAM Column Control Circuit and DRAM Column Decoder

Figure 39:
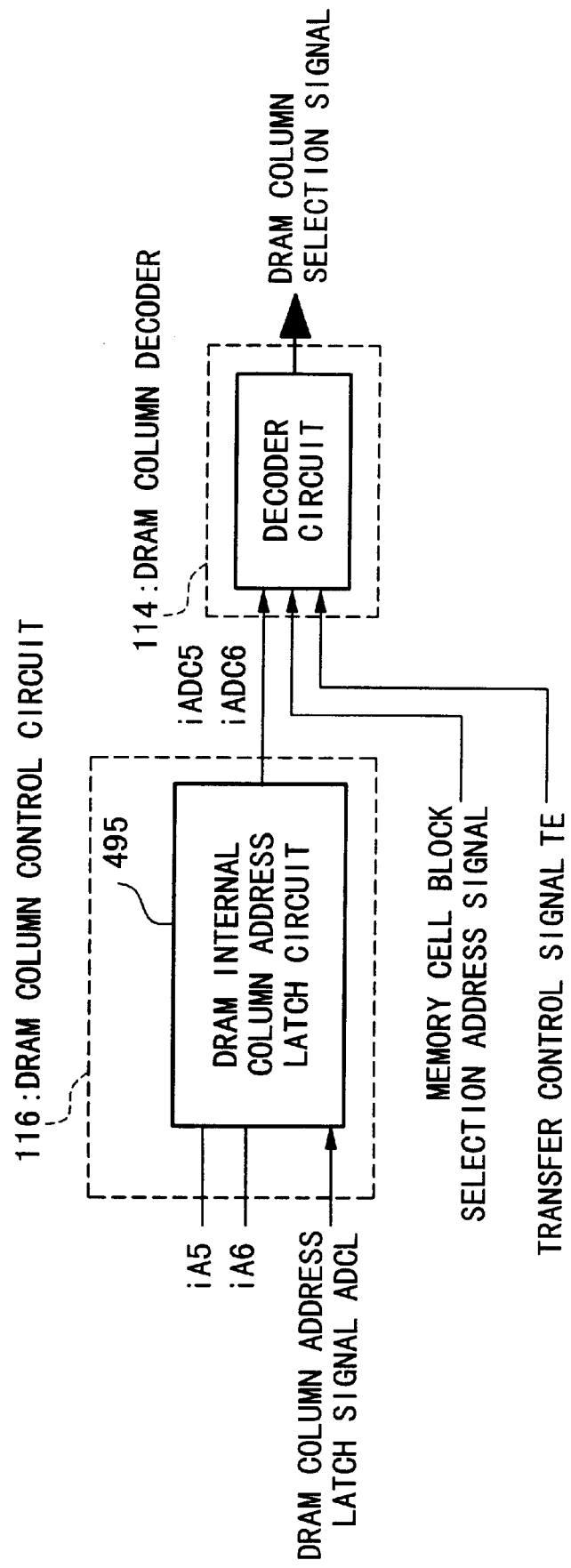
FIG. 39 shows an example of a concrete construction of a DRAM row control circuit and a DRAM row decoder shown in FIG. 33.

FIG. 39 shows a concrete example of the DRAM column control circuit and the DRAM column decoder shown in FIG. 33. In FIG. 39, the DRAM column control circuit 116 comprises a DRAM internal column address latch circuit 495, and the DRAM internal column address signals iADC5 to iADC6 are generated by the internal address signals iA5 and iA6 and the DRAM column address latch signal ADCL in a clock cycle of a command input of data transfer from the DRAM cell to the SRAM cell (prefetch transfer operation) and data transfer from the SRAM cell to the DRAM cell (restore transfer operation).

The DRAM column address latch signal ADCL is one of the transfer control signals generated in the operation control circuit shown in FIG. 32. Further, the DRAM column decoder 114 decodes the DRAM internal column address signals iADC5 and iADC6 generated by the DRAM column control circuit 116, and outputs the DRAM column selection signal generated only when the memory block selection address signal and the transfer control signal TE are activated. Therefore, the activation signals TE1 and TE2 of the data transfer circuit shown in FIG. 35 are the output signal of the DRAM column decoder 114, and the function of the data transfer circuit is performed by the DRAM bit line selection circuit to be described later.

DRAM Bit Line Selection Circuit

Figure 40:
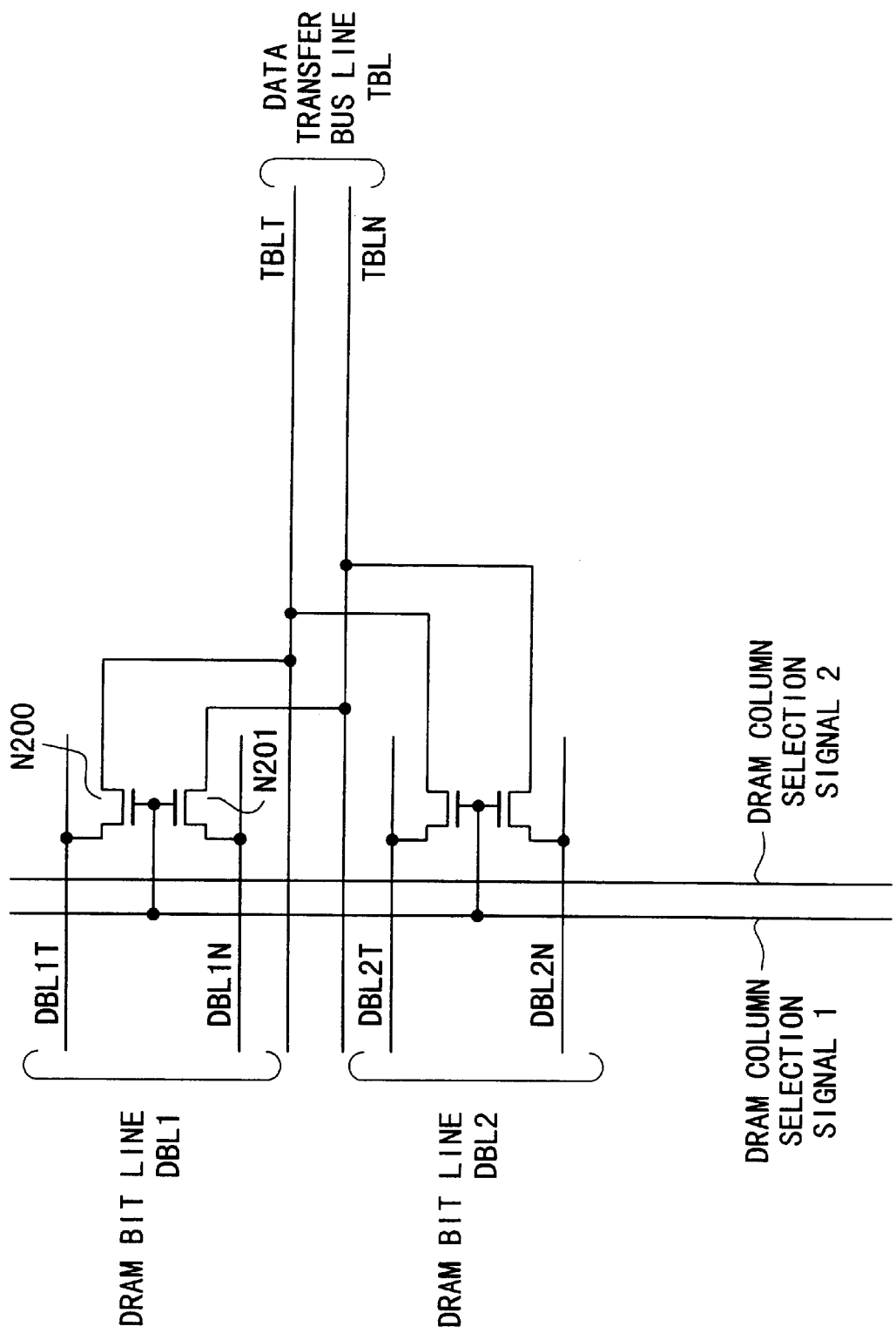
FIG. 40 shows an example of a concrete circuit construction of a DRAM bit line selection circuit.

FIGS. 40 to 43 show concrete examples of the circuit construction of the DRAM bit line selection circuit shown in FIG. 37. FIG. 40 shows the simplest construction including N channel MOS switching transistors (referred to as NMOS transistors, hereinafter) N200 and N201, in which the DRAM bit line DBL and the data transfer bus line TBL are connected by the DRAM column selection signal.

Figure 41:
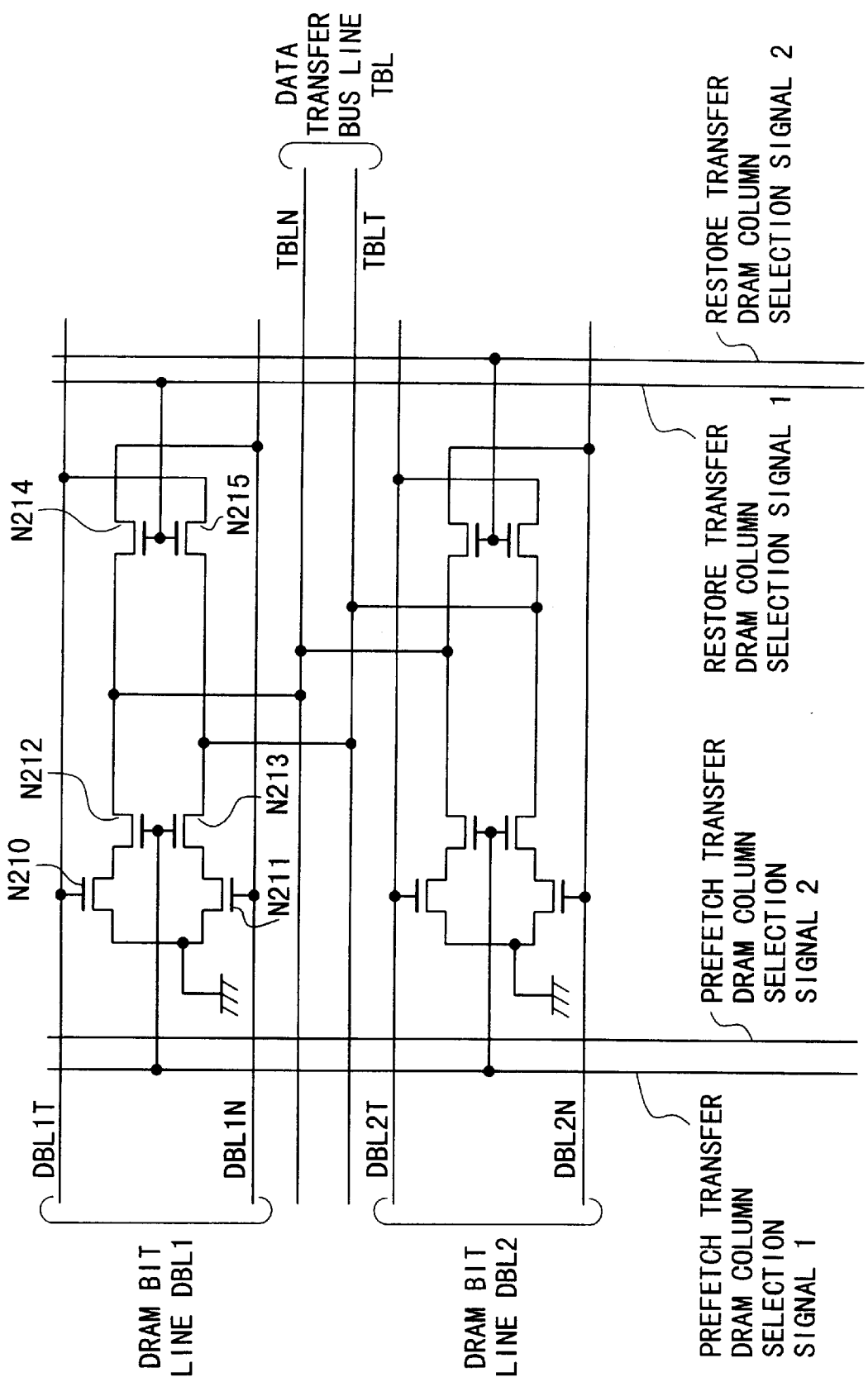
FIG. 41 shows an example of a concrete circuit construction of a DRAM bit line selection circuit.

FIG. 41 shows another construction of the DRAM bit line selection circuit which comprises a switching transistor circuit including: NMOS transistors N210 and N211 having gates connected to respective paired DRAM bit lines and differentially amplifying data on the DRAM bit lines when the data on the DRAM bit lines DBL is transmitted to the data transfer bus line TBL; and NMOS transistors N212 and N213 for transmitting the amplified signal to the data transfer bus line TBL by the prefetch transfer DRAM column selection signal. One terminals of the NMOS transistors N210 and N211 are connected to a fixed potential such as ground potential. Further, when the data on the data transfer bus line TBL is transmitted to the DRAM bit line DBL, the DRAM bit line selection circuit comprises a switching transistor circuit composed of NMOS transistors N214 and N215 as in the circuit shown in FIG. 40, and the DRAM bit line DBL and the data transfer bus line TBL are connected by the restore transfer DRAM column selection signal.

Figure 42:
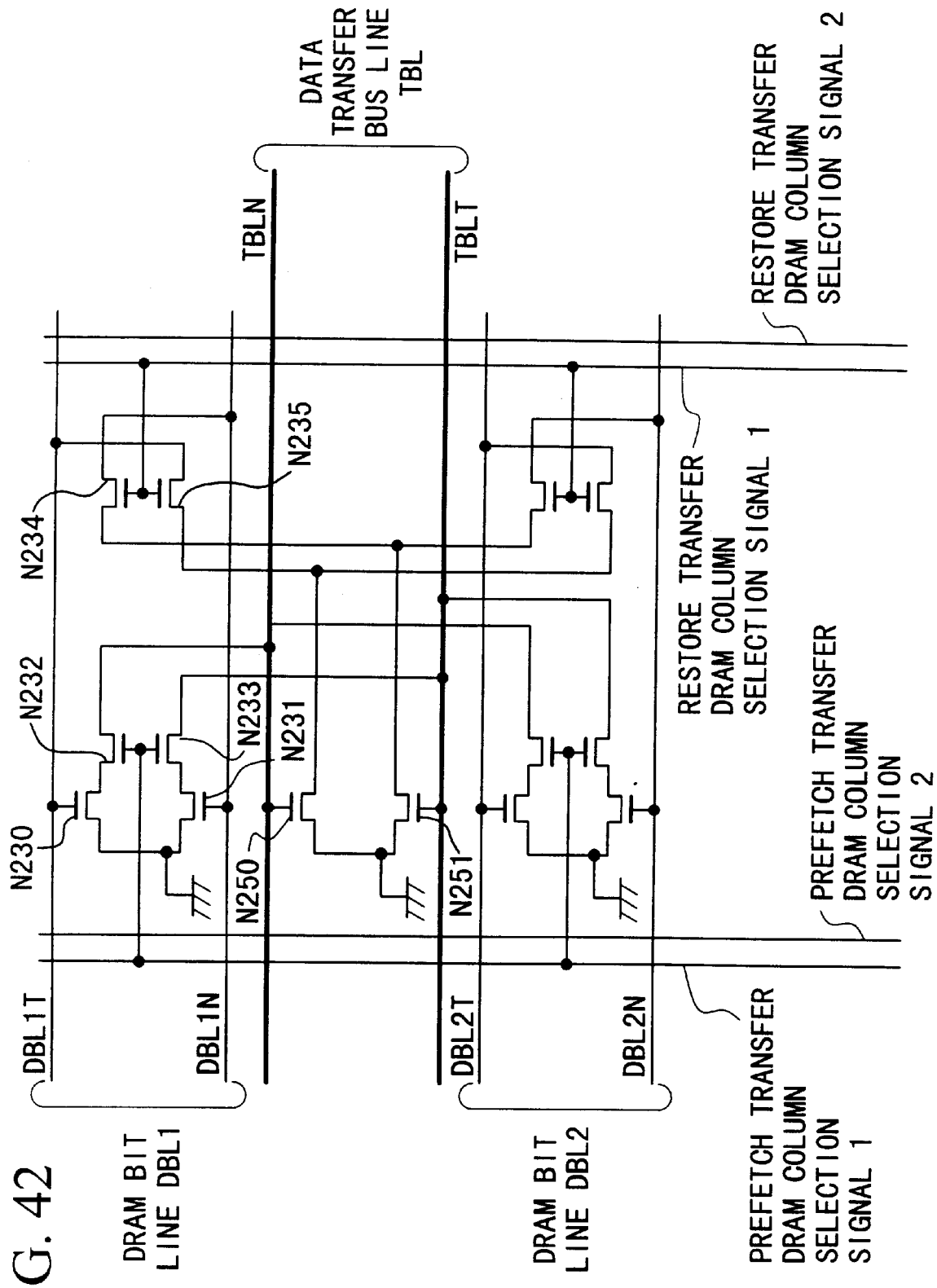
FIG. 42 shows an example of a concrete circuit construction of a DRAM bit line selection circuit.

FIG. 42 shows another construction of the DRAM bit line selection circuit, which comprises a switching transistor circuit including: NMOS transistors N230 and N231 having gates connected to respective paired DRAM bit lines and differentially amplifying data on the DRAM bit lines when the data on the DRAM bit lines DBL is transmitted to the data transfer bus lines TBL; and NMOS transistors N232 and N233 for transmitting the amplified signal to the data transfer bus lines TBL by the prefetch transfer DRAM column selection signal, as in the construction shown in FIG. 41. One terminal of the NMOS transistors N230 and N231 are connected to a fixed potential such as ground potential.

Further, when the data on the data transfer bus lines TBL is transmitted to the DRAM bit lines DBL, the DRAM bit line selection circuit comprises a switching transistor circuit composed of: NMOS transistors N250 and N251 having gates connected to respective paired DRAM bit lines and differentially amplifying data on the data transfer bus lines TBL; and NMOS transistors B234 and N235 for transmitting the amplified signal to the DRAM bit lines DBL by a restore transfer DRAM column selection signal. One end of each of the NMOS transistors N250 and N251 is connected to a fixed potential such as ground potential.

Figure 43:
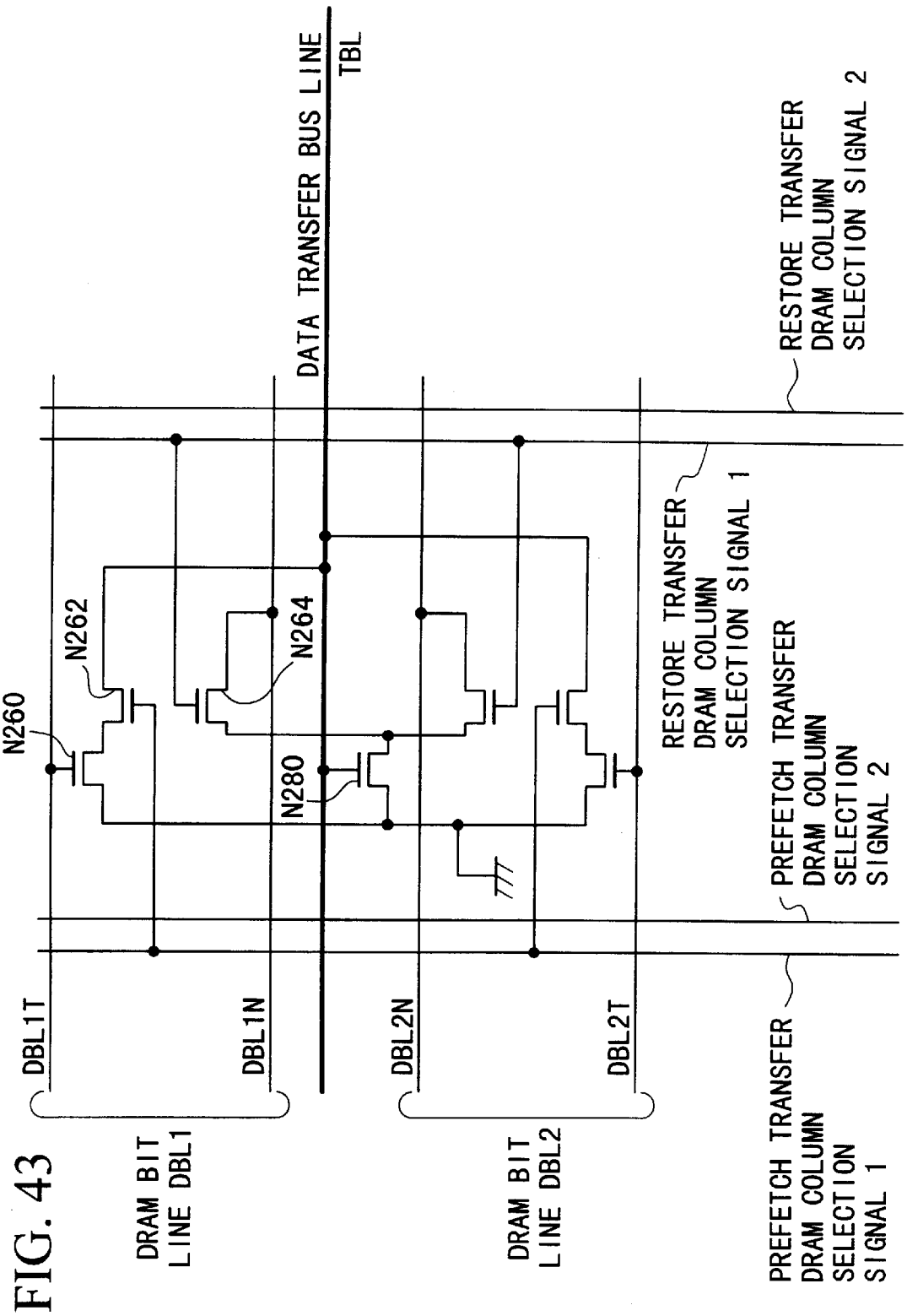
FIG. 43 shows an example of a concrete circuit construction of a DRAM bit line selection circuit.

FIG. 43 shows another construction of the DRAM bit line selection circuit which realizes the construction shown in FIG. 42 using only one data transfer bus line. In the construction shown in FIG. 43, an NMOS transistor N260 does not differentially amplify the data on the DRAM bit lines DBL but removes the data transfer bus line depending on the potential of the DRAM bit line. An NMOS transistor N280 is operated similarly. Alternatively, this may be constructed with only a switching transistor circuit as in the case shown in FIG. 40. By using only one data transfer bus line, the wiring layout becomes simple and it is possible to reduce noise between the data transfer bus lines.

Further, in the constructions in which data is received by the DRAM bit lines or the data transfer bus lines and transmitted, as shown in FIGS. 41 to 43, the DRAM bit lines can be completely separated from the data transfer bus lines. Therefore, noise generated in one side is hardly transmitted to the other and a high speed operation becomes possible.

Construction of DRAM Bit Line Selection Circuit and SRAM Cell

Figure 29:
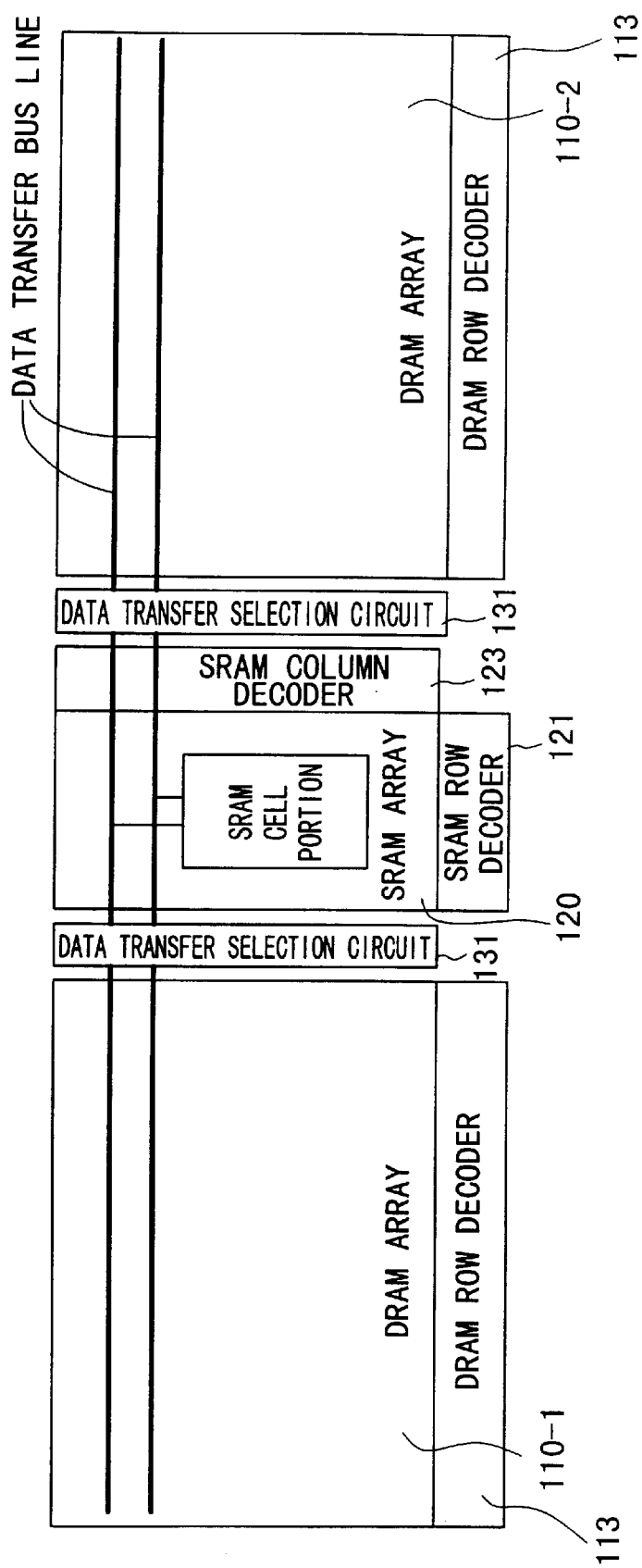
FIG. 29 is a layout of arrays schematically showing an array arrangement of a semiconductor memory device according to an embodiment of the present invention.
Figure 44:
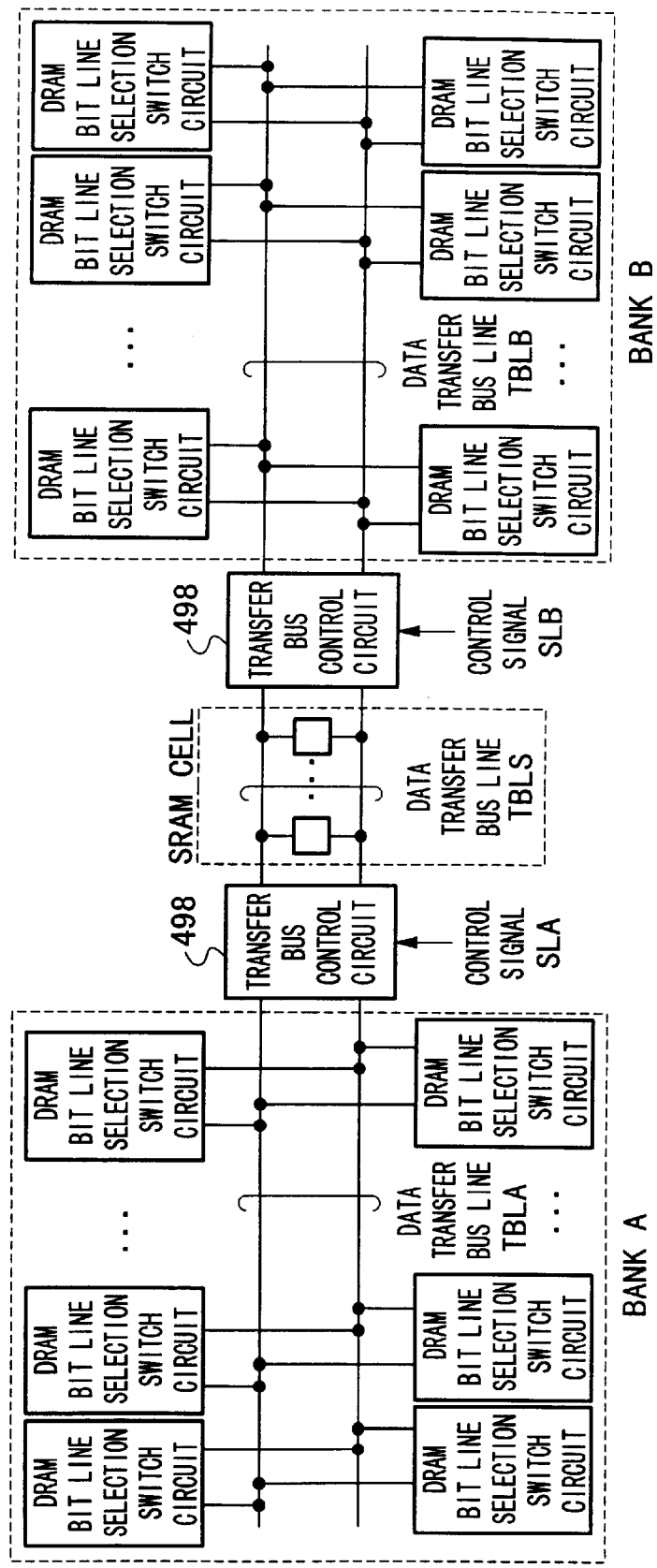
FIG. 44 shows a relation between a pair of data transfer bus lines, the DRAM bit line selection circuit, and the SRAM cells in the array layout shown in FIG. 29.
Figure 45:
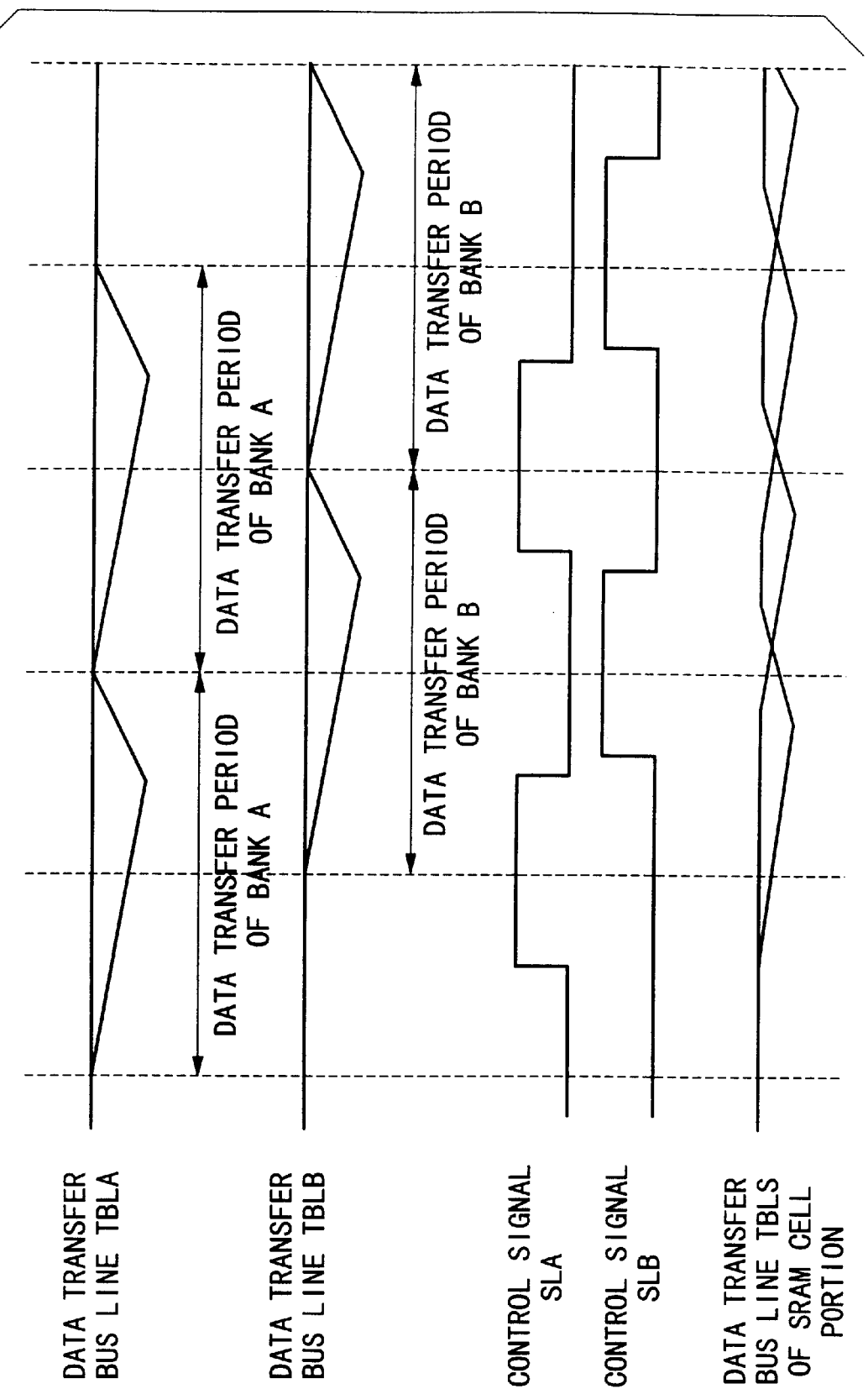
FIG. 45 shows signal waveforms showing an operation of the respective data transfer bus lines in FIG. 44.

FIG. 44 is a constructive diagram showing a relation between paired data transfer bus lines, the DRAM bit line selection circuit, and the SRAM cells in the layout shown in FIG. 29. In FIG. 44, memory cells on one column of the DRAM cell array are connected to the data transfer bus lines through the DRAM bit line selection circuit, so that data transfer between the cells and cells on one column of the SRAM cell array is possible. Further, the data transfer bus lines and the SRAM cell array are connected to each other through transfer bus control circuits 498. The data transfer bus control circuit 498 includes a circuit for selecting and connecting one of DRAM arrays (in this example, banks A and B) arranged on both sides of the SRAM cell array so that only an activated bank can be connected and, therefore, it is possible to realize a reduction of charging/discharging current and speeding up of data transfer by the reduction of THE load on the data transfer bus lines. Further, since, in performing data transfer of the both banks alternately (bank ping-pong operation), the data transfer bus line of one bank can be separated from the other as shown in FIG. 45, it is possible to execute the data transfers on the both banks simultaneously to thereby shorten an effective data transfer period.

As mentioned previously, since the number of bits which can be transmitted at once by the semiconductor memory device according to this embodiment is 1024 bits, and the load on the data transfer bus lines is very large, the peak current and current consumption become very large when the amplitude of the voltage of all data transfer bus lines is increased to the power source voltage level. In order to substantially reduce the peak current and current consumption, the amplitude of voltage of the data transfer bus lines is limited to a half of the power source voltage at most.

However, if the amplitude of the voltage of the data transfer bus line is small, the data of the SRAM cell must be amplified by such a small potential difference, and so the data transfer speed is lowered to some extent. In order to allow only the voltage of the data transfer bus line TBLS in the SRAM cell portion fully changed, a differential amplifier circuit connected to the gate of the data transfer bus line TBLA or TBLB in the DRAM bank for differentially amplifying may be provided in the transfer bus control circuits 498. Alternatively, a sense amplifier for amplifying only the voltage on the data transfer bit line TBLS in the DRAM bank in a state where the data transfer bus line TBLA or TBLB in the DRAM bank is separated may be provided. Alternatively, the transfer bus control circuit 498 includes a circuit for equilibrating or precharging.

3. SRAM portion

Construction of SRAM Portion and Data Input/ Output Terminal

Figure 46:
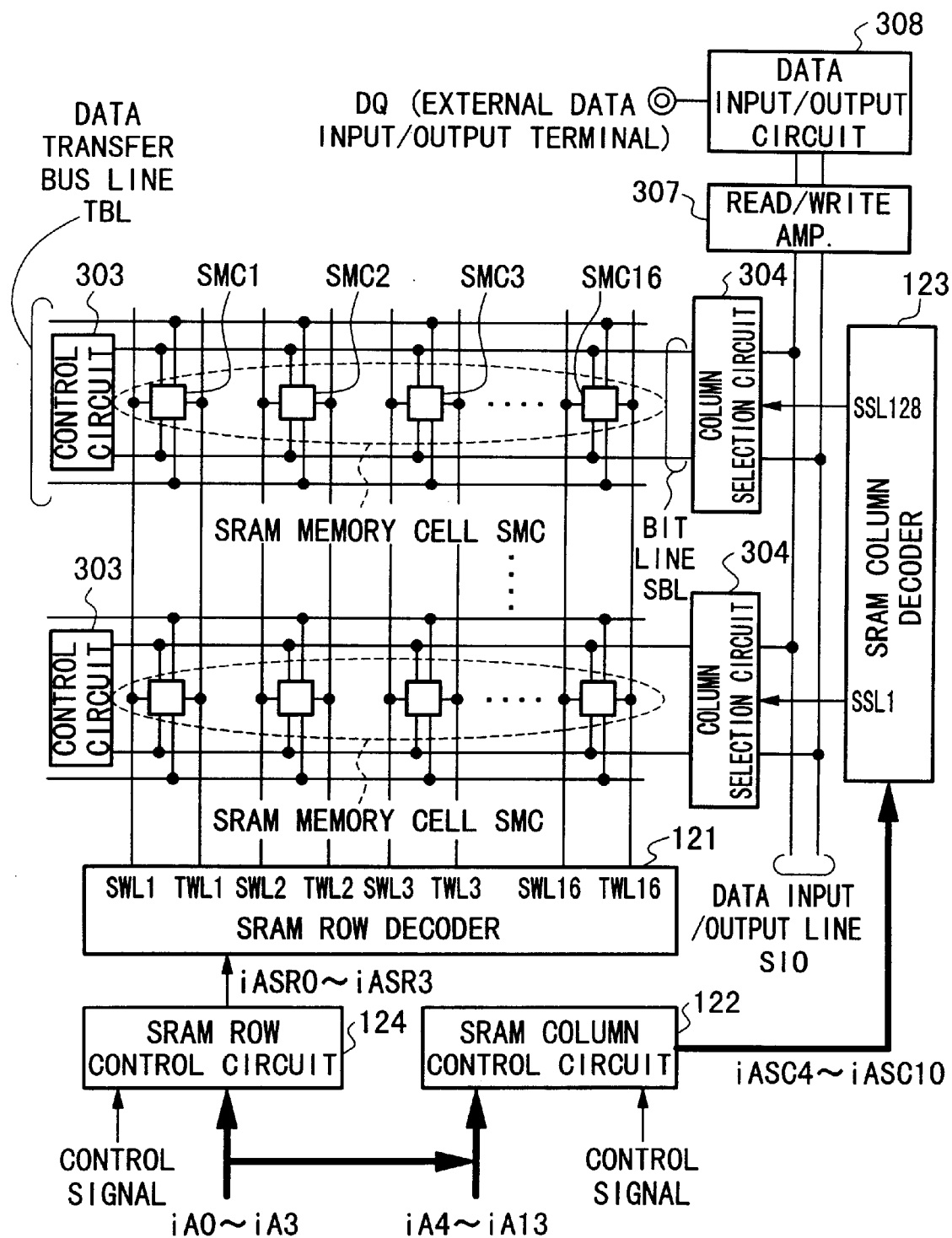
FIG. 46 shows a concrete example of the SRAM portion and the data input/output terminals shown in FIG. 1.

FIG. 46 shows an example of a concrete construction of the SRAM portion shown in FIG. 1 corresponding to one bit of the data input/output terminal DQ. Although this embodiment has the 16-Kbit, x8-bit construction, the present invention is not limited thereto and can take various constructions in combination of the construction of the main memory portion, with similar effect.

Figure 47:
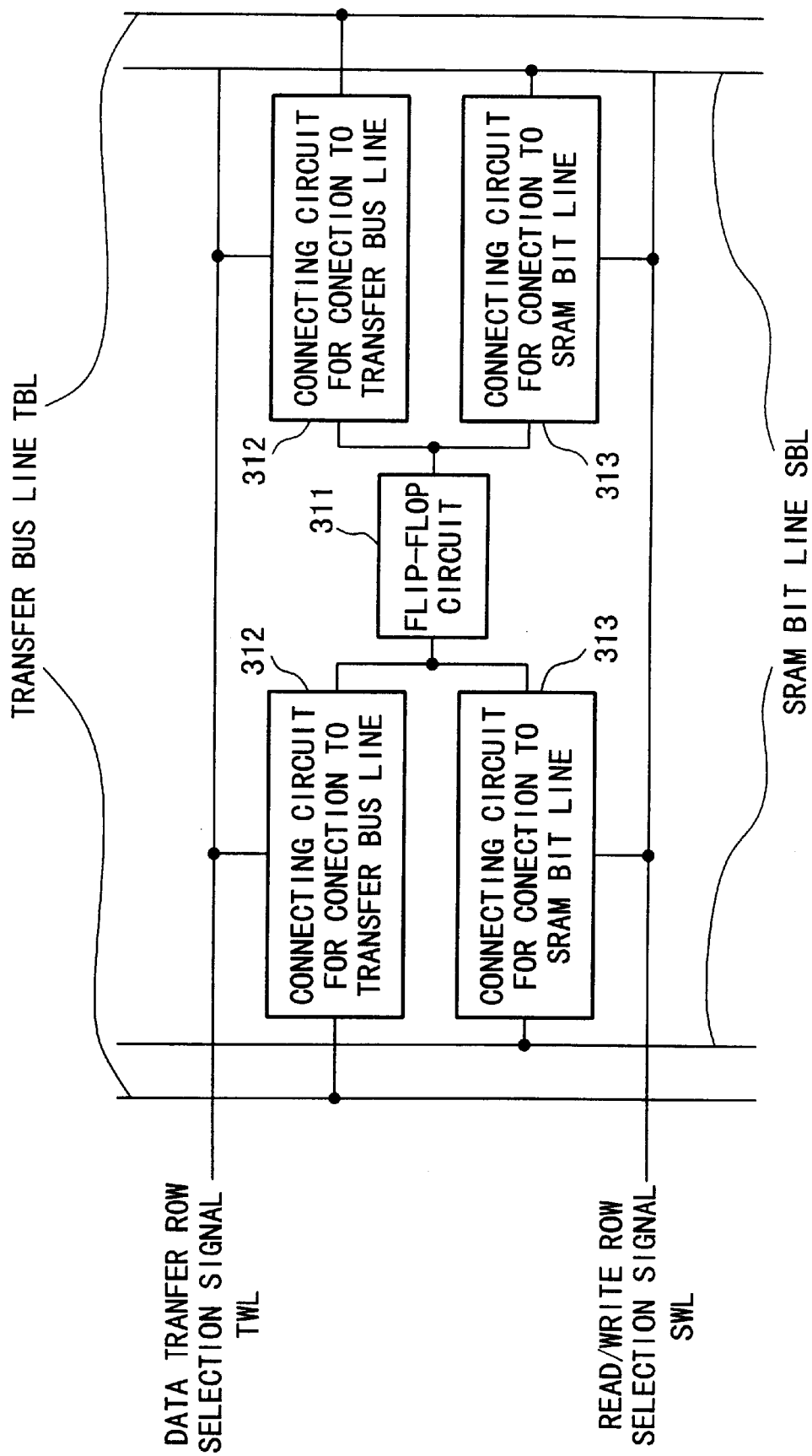
FIG. 47 shows an example of a construction of the SRAM memory cell.

In FIG. 46, the SRAM portion includes the SRAM memory cells SMC, each in turn including a flip-flop circuit 311, which may be any other circuit provided that it can store static data, connecting circuits 312 provided on both sides of the flip-flop circuit 311 for connection to the data transfer bus lines TBL and connecting circuits 313 also provided on the both sides of the flip-flop circuit 311 for connection to the SRAM bit lines SBL, as shown in FIG. 47. The SRAM portion further includes: the SRAM row decoder 121 for generating SRAM cell data transfer row selection signals TWL1 to TWL16 for activating the connecting circuits 312 in transferring data between the DRAM cell and the SRAM cell and the SRAM cell read/write row selection signals SWL1 to SWL16 in performing read or write; and the SRAM row control circuit 124 for generating the SRAM internal row address signals iASR0 to iASR3 input into the SRAM row decoder 121 on the basis of the internal address signals iA0 to iA3 and the SRAM portion control signal. It is, of course, possible to commonly use the SRAM cell data transfer row selection signals TWL and the SRAM cell read/write row selection signals SWL.

The SRAM bit lines SBL have the SRAM bit line control circuit 303 for equilibrating and/or precharging the bit lines, the SRAM column selection circuit 304 for connecting the data input/output line SIO to and the SRAM bit line SBL. The SRAM portion further includes: the SRAM column decoder 123 for generating the selection signals SSL1 to SSL128 input into the SRAM column selection circuit 304; and the SRAM column control circuit 122 for generating the SRAM internal column address signals iASC4 to IASC10 on the basis of the internal address signals iA0 to iA13, and the SRAM portion control signal. The SRAM bit line control circuit 303 may include sense amplifier circuits for detecting and amplifying levels of the SRAM bit lines SBL.

Further, the data input/output lines SIO are connected to the external data input/output terminals DQ through the data input/output circuit 308 and the read/write amplifier 307. The data input/output lines SIO may be provided for read and write separately. Since the transfer bus lines TBL for data transfer and the SRAM bit lines SBL for read are provided, it is possible to perform the read operation regardless of the data transfer operation.

SRAM Cell

FIGS. 48a to 48d show concrete circuits of the flip-flop circuit 311 of the SRAM cell shown in FIG. 47. FIG. 48a shows the flip-flop circuit constructed with P channel MOS transistors (referred to as PMOS transistors, hereinafter) P100 and P101 and NMOS transistors N100 and N101, and FIG. 48b shows a flip-flop circuit constructed with resistors R100 and R101 and NMOS transistors N100 and N101, both of which are usually employed in the SRAM. FIG. 48c shows a flip-flop circuit constructed with the construction shown in FIG. 48a added with a PMOS transistor P102 controlled by control signals PE and NE for power cut, an NMOS transistor N102 and a balancer circuit 315. One of the transistors P102 and N102 and the balancer circuit 315 may be omitted.

FIG. 48d shows a construction which is similar to a typical sense amplifier used in the DRAM, and includes a plurality of the flip-flop circuits each having the construction shown in FIG. 48a and arranged in the row direction, a PMOS transistor P103 for controlling a contact point 316 by the control signal SPE, an NMOS transistor N103 for controlling a contact point 317 by the control signal SNE, a balancer circuit 318 for balancing the contact points 316 and 317, and balancers 315 provided in each of the flip-flop circuit as in the case shown in FIG. 48c. The power source voltage may be an external power source voltage or an internal power source voltage generated by a power source voltage converter circuit. The PMOS transistor P102 for power cut and the PMOS transistor P103 for controlling the contact point 316 by the control signal SPE may be NMOS transistors, respectively, in which case, the levels of the control signals PE and SPE may be the level of an internally generated power source voltage which is higher than the power source voltage generated by the power source voltage converter circuit. By reducing a current flowing through the flip-flop by using the flip-flop circuit shown in FIG. 48c or 48d, it is possible to substantially reduce noise generated in the transfer operation. Further, by performing the data transfer while balancing the opposite contact points, it is possible to realize a stable, high speed transfer operation. The transistors constituting the flip-flop circuit are not special and may be identical to those used in the peripheral circuit or the DRAM sense amplifiers.

Connection Circuits for SRAM Bit Line and Data Transfer Bus Line

Figure 49:
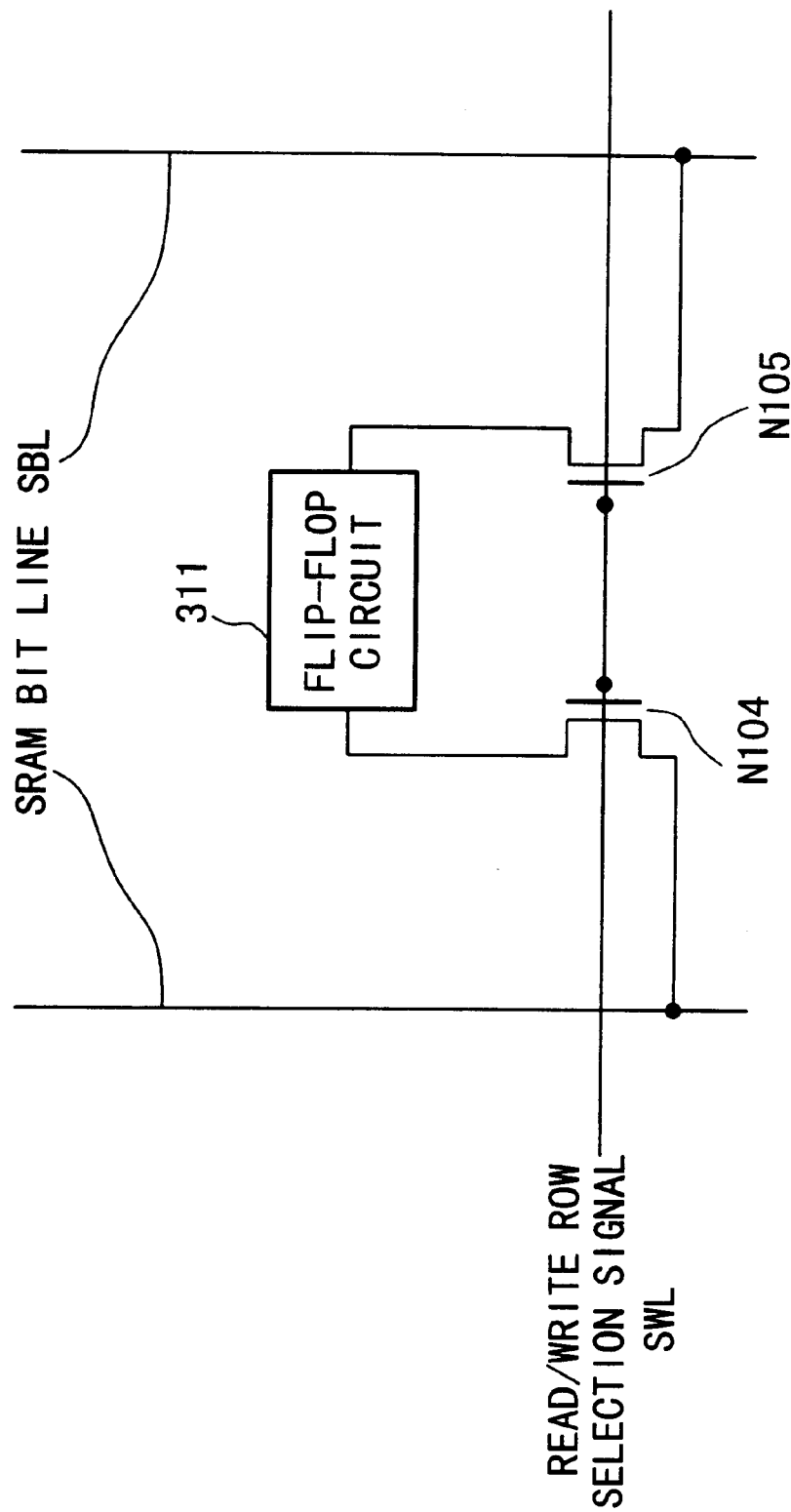
FIG. 49 shows a concrete example of a connecting circuit for connecting the SRAM bit lines shown in FIG. 47.
Figure 50:
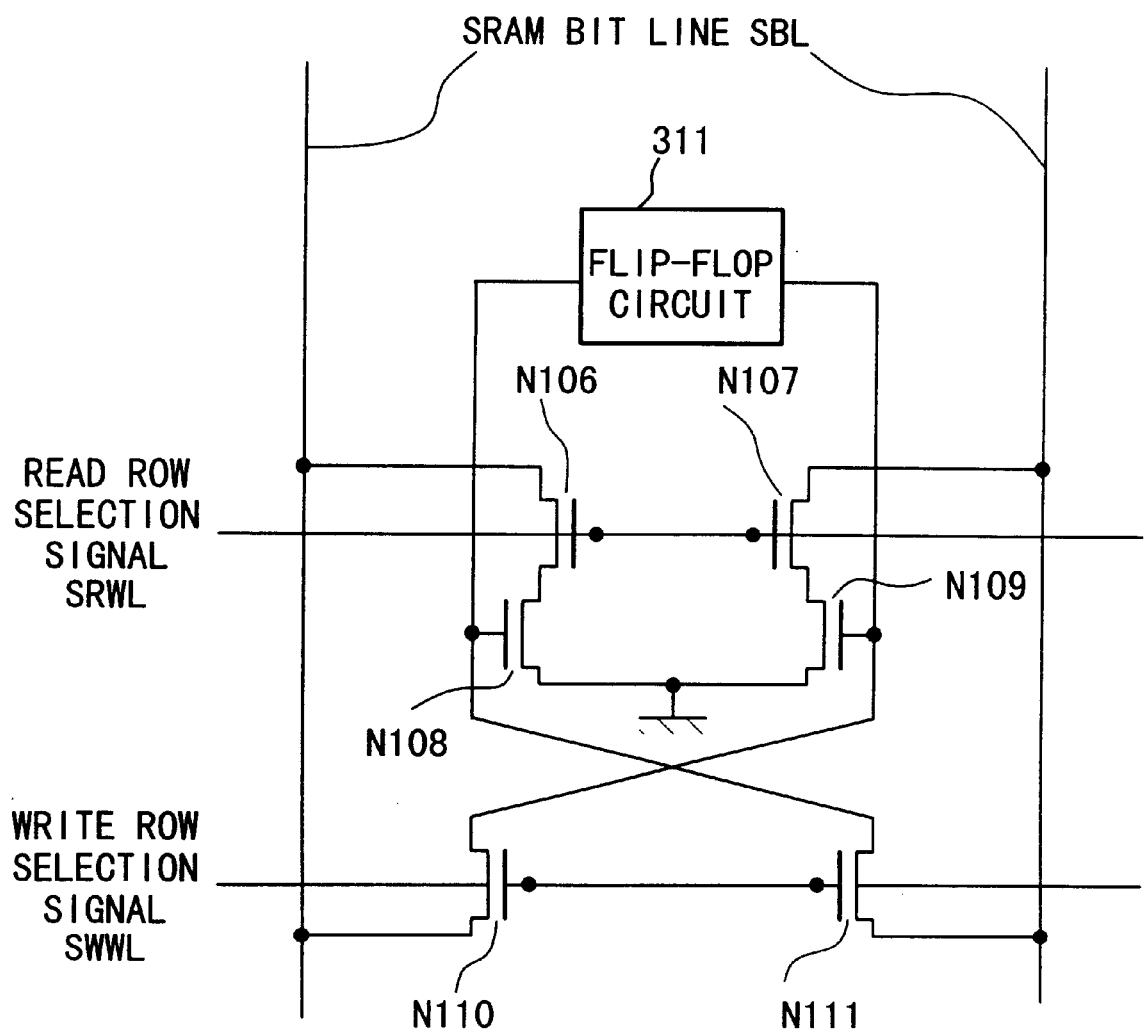
FIG. 50 shows a concrete example of a connecting circuit for connecting the SRAM bit lines shown in FIG. 47.
Figure 51:
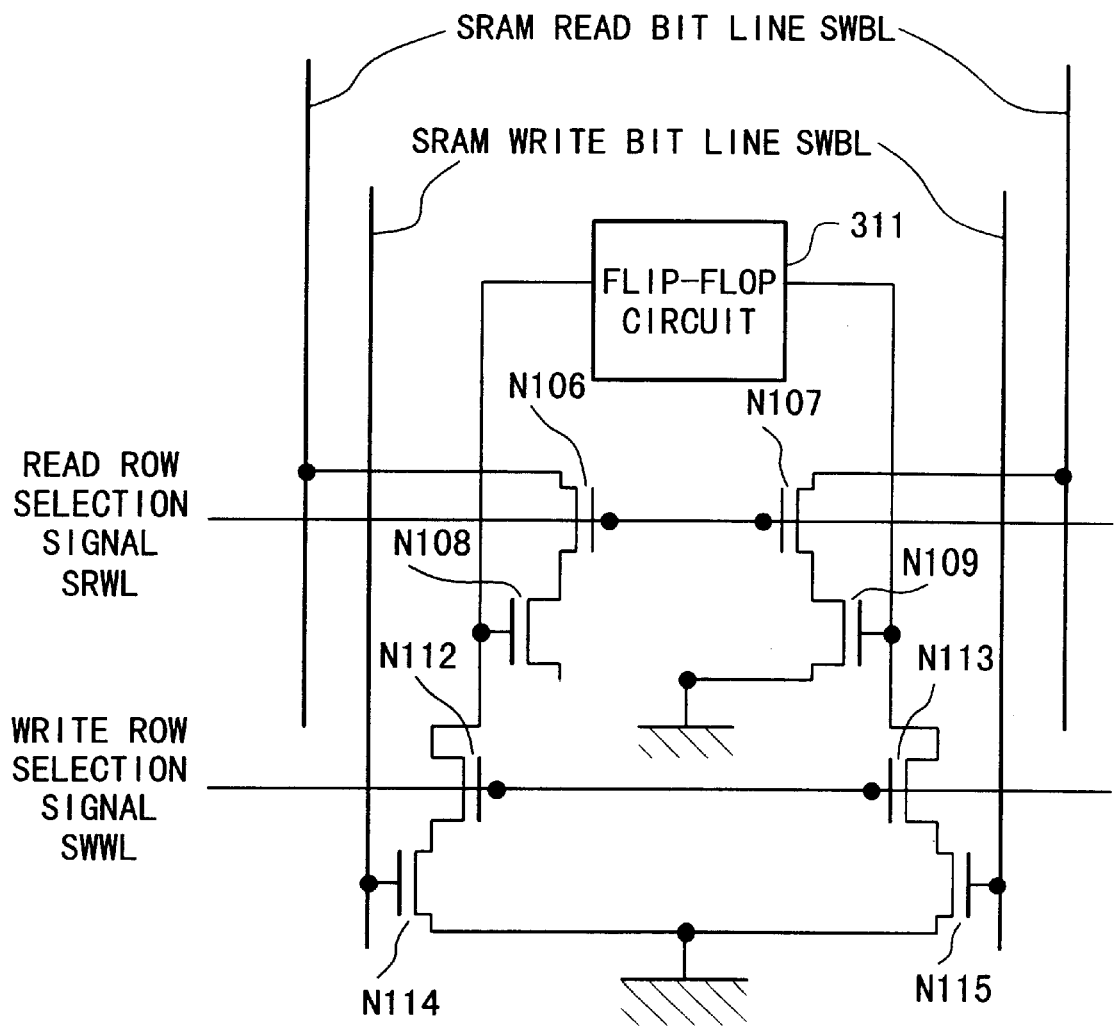
FIG. 51 shows a concrete example of a connecting circuit for connecting the SRAM bit lines shown in FIG. 47.

FIGS. 49 to 51 show circuit examples of the connection circuits for connection to the SRAM bit lines SBL.

FIG. 49 shows the simplest construction, which includes NMOS switching transistor N104 and N105, and is connected to the SRAM bit lines SBL by a read/write row selection signal SWL.

The construction shown in FIG. 50 includes a switching transistor circuit composed of: NMOS transistors N108 and N109 having gates connected to the respective opposite terminals of the flip-flop circuit for differentially amplifying signals on the terminals in reading data from the flip-flop circuit; and NMOS transistors N106 and N107 for transmitting the amplified signals to the SRAM bit lines SBL by a read row selection signal SRWL. One terminal of each of the NMOS transistors N108 and N109 is connected to a fixed potential such as ground potential. To write data in the flip-flop circuit, the construction shown in FIG. 50 further includes a switching transistor circuit composed of NMOS transistors N110 and N111, as shown in FIG. 49, which connect the SRAM bit lines SBL to the flip-flop circuit by a write row selection signal SWWL.

A construction shown in FIG. 51 includes a switching transistor circuit composed of: NMOS transistors N108 and N109 having gates connected to the respective opposite terminals of the flip-flop circuit for differentially amplifying signals on the terminals in reading data from the flip-flop circuit as in the case shown in FIG. 50; and NMOS transistors N106 and N107 for transmitting the amplified signals to the SRAM bit lines SRBL for SRAM read by a read row selection signal SRWL. One terminal of each of the NMOS transistors N108 and N109 is connected to a fixed potential such as ground potential.

To write data in the flip-flop circuit, the construction shown in FIG. 51 further includes a switching transistor circuit composed of: NMOS transistors N114 and N115 having gates connected to the SRAM write bit line pair for differentially amplifying the signals on the SRAM write bit lines SWBL to write data in the flip-flop circuit; and NMOS transistors N112 and N113 for transmitting the amplified signals to the opposite terminals of the flip-flop circuit by a write row selection signal SWWL. One terminal of each of the NMOS transistors N114 and N115 is connected to a fixed potential such as ground potential.

In the construction shown in FIG. 50 or 51 in which data is transferred by connecting the opposite ends of the flip-flop circuit or the SRAM bit lines SBL to the gates of the transistors, it is possible to completely separate the opposite terminals of the flip-flop circuit from the SRAM bit lines SBL. Therefore, noise generated in one side is hardly transmitted to the other and a high speed operation becomes possible. It is possible to construct the connection circuit to the data transfer bus lines TBL in the same manner as in the case shown in FIG. 49, 50 or 51.

SRAM Row Control Circuit

Figure 52:
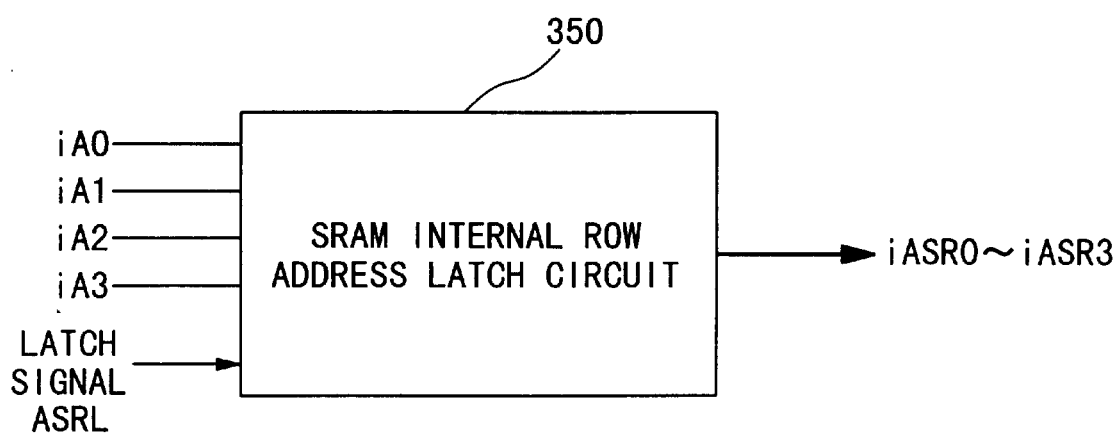
FIG. 52 shows a concrete example of a SRAM row control circuit shown in FIG. 46.

FIG. 52 shows, in detail, the circuit construction of the SRAM row control circuit shown in FIG. 46. In FIG. 52, the SRAM row control circuit is constructed with a SRAM internal row address latch circuit 350. SRAM internal row address signals iASR0 to iASR3 are generated from the internal address signals iA0 to iA3, and from a latch signal ASRL for accepting the internal address signals in a clock cycle of a read/write command input. The latch signal ASRL is one of the SRAM control signals generated by the operation control circuit shown in FIG. 32.

SRAM Column Control Circuit

Figure 53:
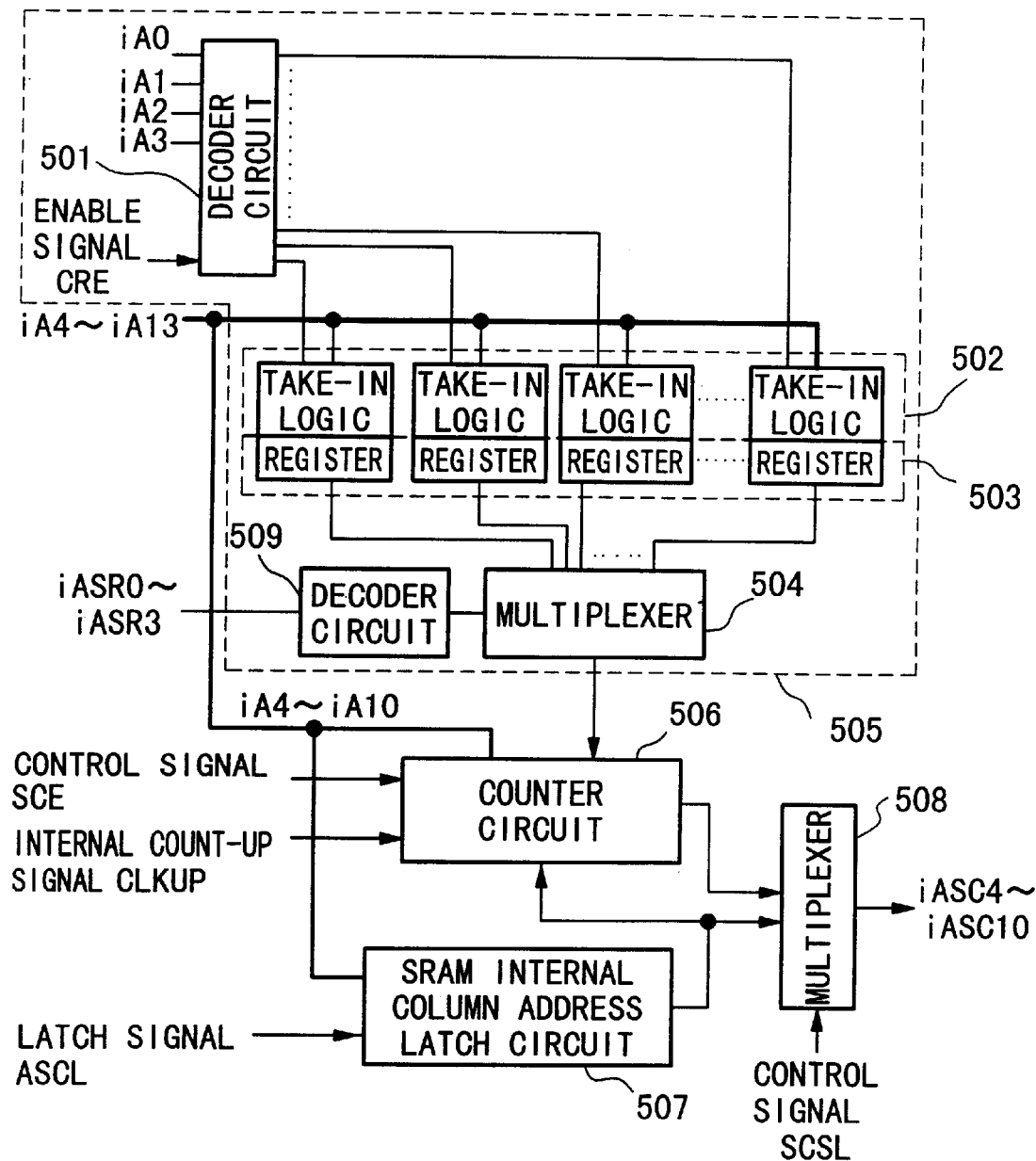
FIG. 53 shows a concrete example of a SRAM column control circuit shown in FIG. 46.

FIG. 53 shows, in detail, the construction of the SRAM column control circuit shown in FIG. 46. In FIG. 53, the SRAM column control circuit includes: an SRAM internal column address latch circuit 507 for latching the internal address signals iA4 to iA10 by a latch signal ASCL generated by the clock cycle at the read/write command input; and a counter circuit 506 for accepting the output of the SRAM internal column address latch circuit 507 by a control signal SCE and counting up in a predetermined sequence by an internal count-up signal CLKUP operable during a burst operation for performing read/write with respect to the SRAM. The SRAM internal column address signals iASC4 to iASC10 is output through a multiplexer 508 which passes the output of either the latch circuit 507 or the counter circuit 506. The multiplexer 508 selects the output of the latch circuit 507 in the clock cycle at the read/write command input, and is controlled by the control signal SCSL such that the SRAM internal column address signal can be output at a speed as high as possible.

Further, the SRAM column control circuit according to the present invention includes a data input/output mode memory portion 505 which, in order to set completely different data input/output modes, for example, burst length, data input/output address sequence and latency, etc., for a plurality of SRAM cell groups (in this example, SRAM cell groups divided every row), takes the data input/output modes according to the states of the internal address iA0 to iA13 in the previously mentioned mode register setting (2) command cycle (in this example, although only the burst length can be set for the respective SRAM cell groups, it is possible to set their data input/output address sequence, latency, etc., for them) and stores the data input/output modes.

The data input/output mode memory portion 505 includes: receiving logic 502 provided in respective divided SRAM cell groups for generating setting data to be input according to the states of the internal address iA0 to iA13; registers 503 provided for the respective receiving logic for accepting the setting data (outputs of the receiving logic 502) of the data input/output modes of the respective SRAM cell groups by an output of the decoder circuit 501 which is selected by the enable signal CRE generated in the previously mentioned mode register setting (2) command cycle; and a multiplexer 504 for passing one of the outputs of the registers 503 storing the setting data of the SRAM cell groups by selectively controlling the iASR0 to iASR3 output from the SRAM internal row address latch circuit 350 in the read/write command cycle by using the signal decoded by the decoder circuit 509.

The counter circuit 506 receives an output of the multiplexer 504 to operate the semiconductor memory device in the data input/output mode set in the respective SRAM cell groups. The data input/output mode memory portion 505 must be provided for each of the data input/output modes to be set. The internal count-up signal CLKUP, the enable signal CRE, the control signals SCE and SCSL, and the latch signal ASCL are the SRAM portion control signals generated by the operation control circuit shown in FIG. 32. Of course, it is possible to make the latch signal ASRL input into the SRAM internal row address latch circuit 350 and the latch signal ASCL input into the SRAM internal column address latch circuit 507 common.

Instead of the setting of the data input/output mode memory portion 505 performed for the respective SRAM cell groups by the mode register setting (2) command cycle, it is possible to set the same setting data of two or more SRAM cell groups at once or to set a logic of addresses A4 and A5 in setting the SRAM row data of the mode register setting (2) command shown in FIG. 5. For example, when A4=L and A5=L, the data input/output mode is set in every SRAM cell group, when A4=H and A5=L, the data input/output mode is set in two SRAM cell groups neglecting the last bit of the SRAM row data, and when A4=L and A5=H, the data input/output mode is set in four SRAM cell groups neglecting the last 2 bits of the SRAM row data. In such manner, the data input/output mode memory portion 505 can be set in various combinations.

In the data input/output mode memory portion 505, the number of the receiving logic 502 as well as the registers 503 is not always the same as that of the divided SRAM cell groups, and it is possible to use one set of the receiving logic 502 and the register 503 commonly for a plurality of SRAM cell groups. Further, the addresses iASR0 to iASR3, which are input into the decoding circuit 509, are not always the signals from the SRAM internal row address latch circuit 350 and it is possible to provide a separate circuit therefore.

Figure 54:
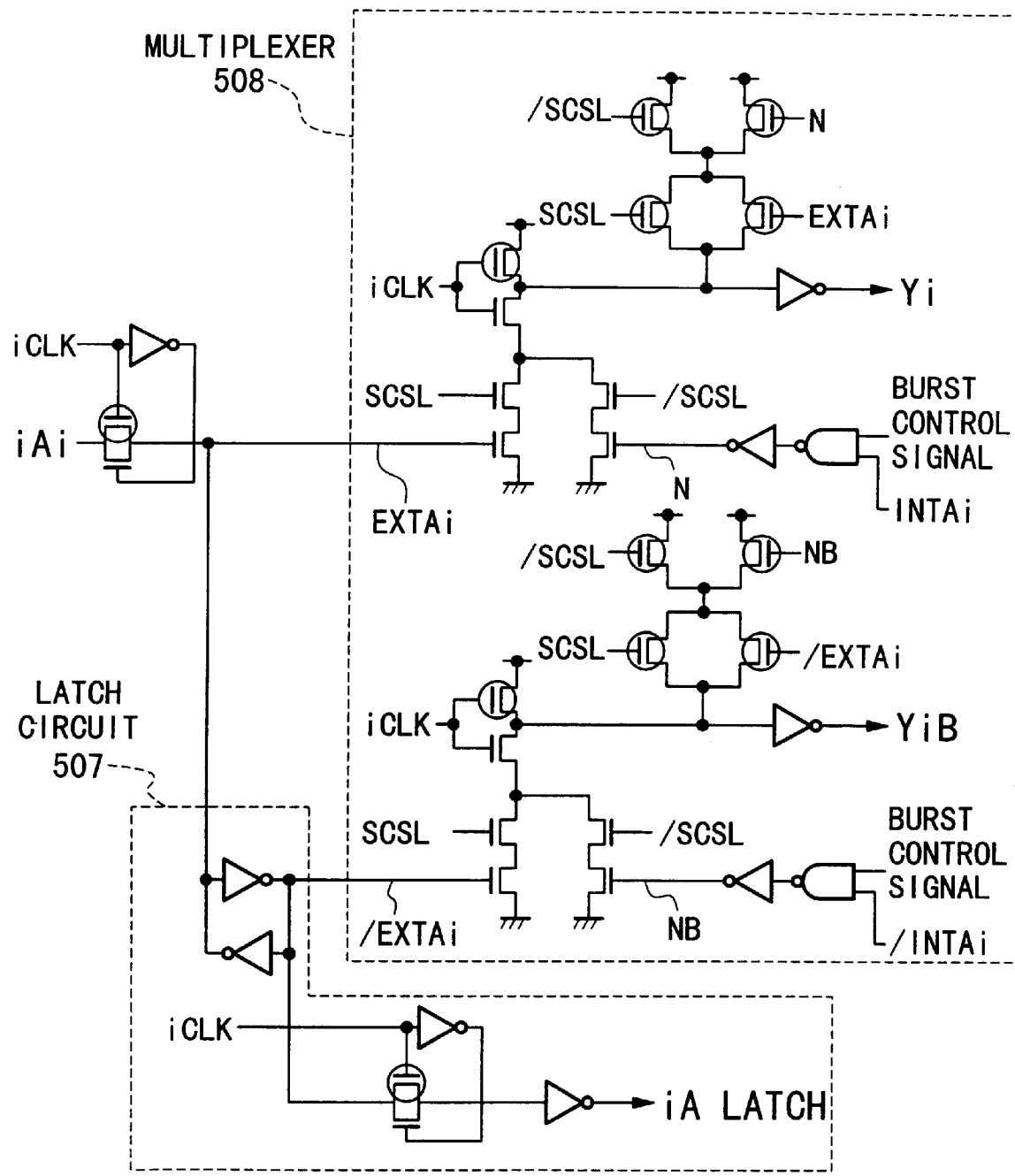
FIG. 54 shows a concrete example of a multiplexer and latch circuit shown in FIG. 53.
Figure 55:
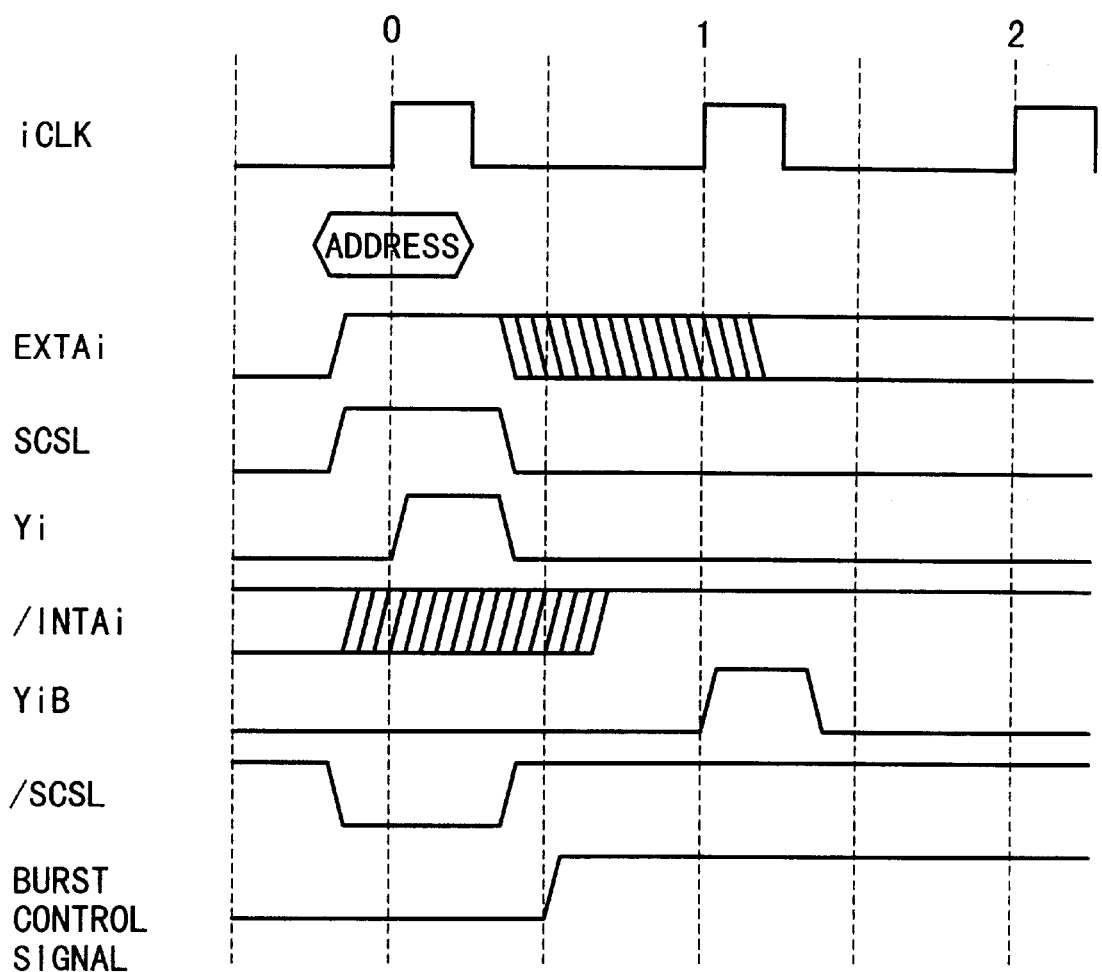
FIG. 55 shows signal waveforms showing an operation of the multiplexer shown in FIG. 54.

Further, it is possible to generate the internal address signals at high speed by constructing the SRAM internal column address latch circuit 507 and the multiplexer 508 such that the internal address is output immediately after a logic between the internal address and the internal clock signal iCLK synchronized with the external reference clock signal, as shown in FIG. 54. In FIG. 54, INTAi and /INTAi are address signals from the counter circuit 506 and EXTAi and /EXTAi are address signals generated from the internal address signal iAi. These signals are switched by the control signals SCSL and /SCSL and the burst control signal. SCSL is the control signal and /SCSL is a control signal having a phase opposite to that of the control signal SCSL. FIG. 55 shows an example of operation of this circuit. In this circuit construction, a delay from the internal clock iCLK to a time at which the internal address signal Yi is output corresponds to one stage of inverter and is minimized. The internal address signals Yi and YiB are output as address pulse signals.

Next, another construction for generating an internal address signal will be discussed.

Figure 56:
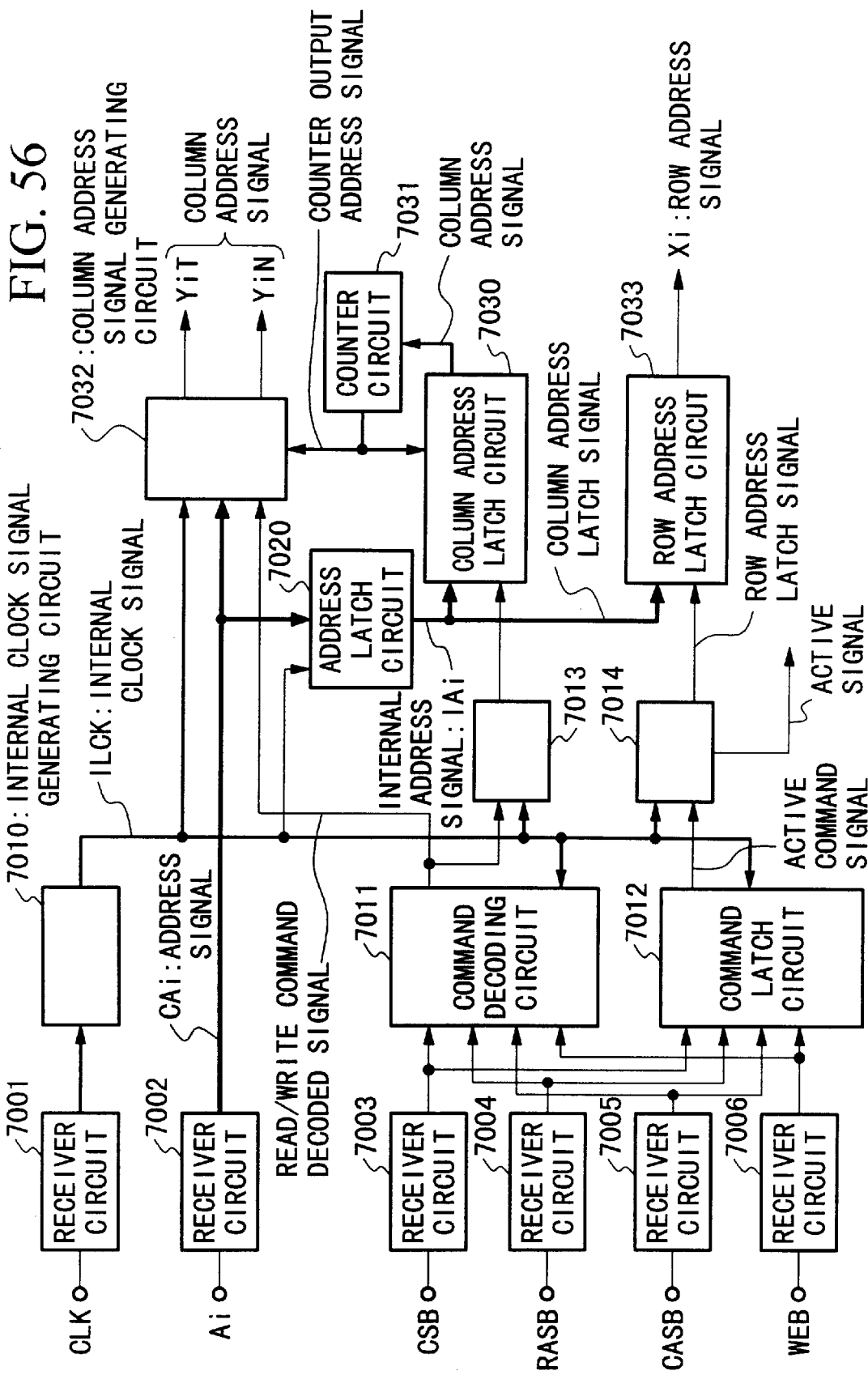
FIG. 56 is a block diagram showing another embodiment (for accelerating an address signal) of an internal address generating circuit system.

FIG. 56 shows the overall construction of an internal address generating circuit system. The circuit shown in FIG. 56 is a part of the operation control circuit 150. The circuit system shown in FIG. 56 includes receiver circuits 7001 to 7006 for accepting a clock signal CLK which is the reference for the entire operation of the device, an external address signal Ai, various control signals CSB, RASB, CASB, and WEB. The receiver circuits converts the signals, which are externally provided, into signals suitable to handle within the device, and receive them.

An internal clock signal generating circuit 7010 is connected to the receiver circuit 7001. The receiver circuit 7001 detects a rising edge of the external clock signal CLK, and generates an internal clock signal ICLK having a predetermined pulse width (or duty). A column address signal generating circuit 7032 is connected to the receiver circuit 7002. This column address signal circuit 7032 is the feature of this invention, receives an address signal CAi from the receiver circuit 7002, which has input the address signal Ai, and outputs pulses of column address signals YiT and YiN.

The receiver circuits 7003 to 7006 for accepting the various control signals CSB, RASB, CASB, and WEB are provided. The various control signals CSB, RASB, CASB, and WEB are input into a command decoding circuit 7011 and a command latch circuit 7012. The command decoding circuit 7011 decodes the control signals according to the internal clock signal ICLK, and outputs a read/write command decoded signal. The command latch circuit 7012 generates an active command signal by latching the various control signals according to the internal clock signal ICLK.

A read/write signal generating circuit 7013 is connected to the command decoding circuit 7011, receives the read/write command decoded signal from the command decoding circuit 7011 according to the internal clock signal ICLK, and generates a column address signal. An active signal generating circuit 7014 is connected to the command latch circuit 7012, receives the active command signal from the command latch circuit 7012 according to the internal clock signal ICLK, and generates an active signal and a row address latch signal.

An address latch circuit 7020 is connected to the receiver circuit 7002, uses the internal clock signal ICLK as the trigger, latches the address signal CAi from the receiver circuit 7002, and supplies the signal CAi to a column address latch circuit 7030 and a row address latch circuit 7033. The column address latch circuit 7030 is connected to an address latch circuit 7020, uses the column address latch signal from the read/write signal generating circuit 7013 as the trigger, and latches the address signal, which is latched in the address latch circuit 7020, as a column address signal. A counter circuit 7031 is connected to the column address latch circuit 7030. For example, in a burst mode, the counter circuit 7031 generates a continuous counter output address signal (signal which is to be used as column address signal) which is started by the column address signal latched in the column address latch circuit 7030. The counter output address signal is sent to the column address signal generating circuit 7032 and the column address latch circuit 7030.

The column address signal generating circuit 7032 is connected to the receiver circuit 7002, receives the address signal CAi, and outputs the pulse of the column address signals YiT and YiN according to the internal clock signal ICLK and the read/write command decoded signal. The row address latch circuit 7033 is connected to the address latch circuit 7020, uses the row address latch signal from the active signal generating circuit 7014 as the trigger, and latches and outputs the address signal, which is latched in the address latch circuit 7020, as a row address signal Xi.

Figure 57:
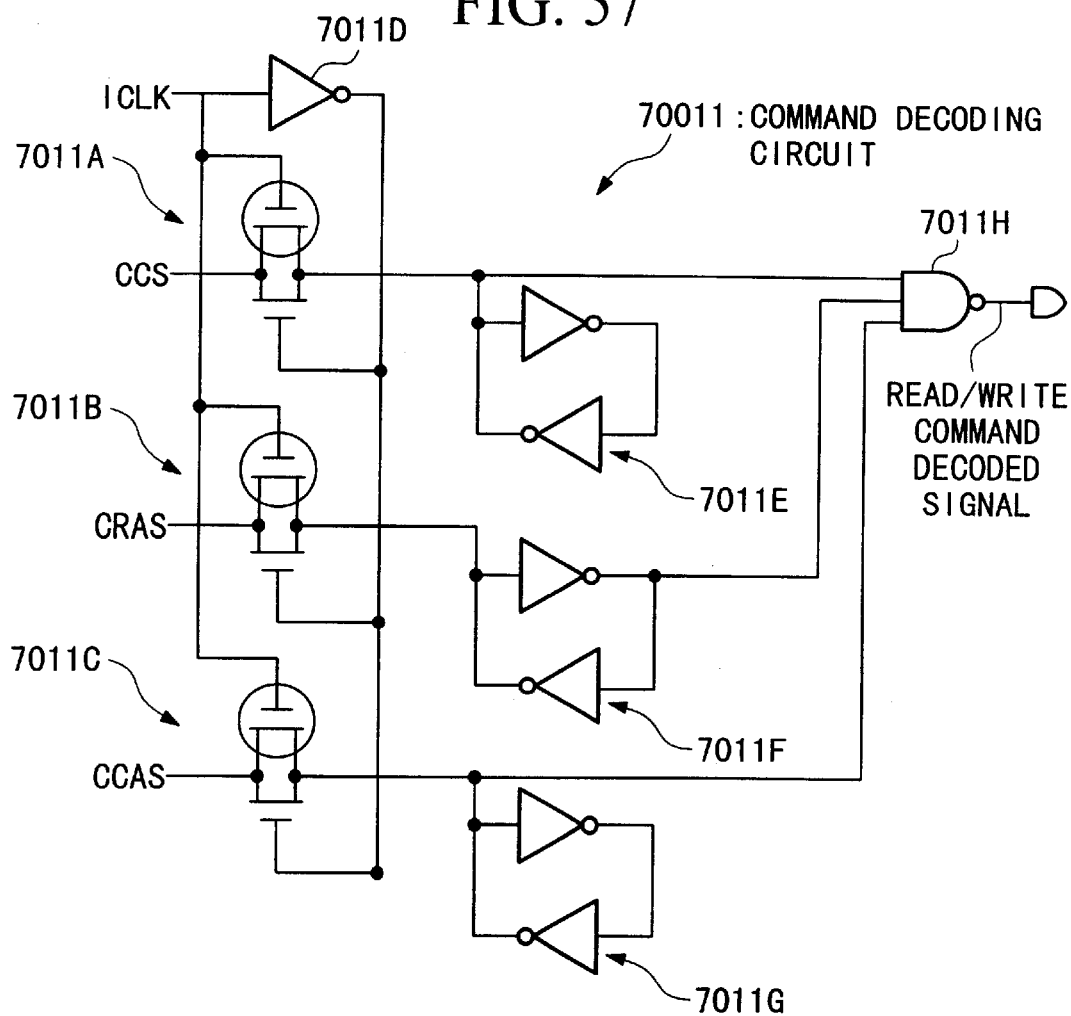
FIG. 57 shows a construction of a command decoding circuit shown in FIG. 56.

FIG. 57 shows the construction of the command decoding circuit 7011.

As shown in FIG. 57, the command decoding circuit 7011 comprises: an inverter 7011D for generating an inverted signal of the internal clock signal ICLK; transfer gates 7011A, 7011B, and 7011C for transferring the control signals CCS, CRAS, and CCAS input from the receiver circuits 7003 to 7006; flip-flops 7011E, 7011F, and 7011G for storing the various control signals transferred from the transfer gates; and a NAND circuit 7011H for performing the NAND operation of the various control signals transferred from the transfer gates and outputting the result as the read/write command decoded signal. That is, the command decoding circuit 7011 decodes the various control signals and outputs the read/write command decoded signal.

Figure 58:
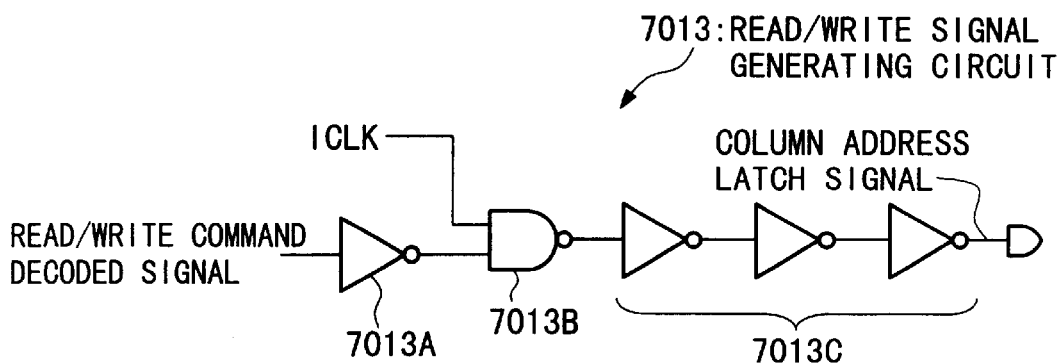
FIG. 58 shows a construction of a read/write signal generating circuit shown in FIG. 56.

FIG. 58 shows the construction of the read/write signal generating circuit 7013.

The read/write signal generating circuit 7013 comprises: an inverter 7013A for receiving the read/write command decoded signal from the above-described command decoding circuit 7011 and generating an inverted signal of the read/write command decoded signal; a NAND circuit 7013B for receiving the internal clock signal ICLK and the read/write command decoded signal; and an inverter chain 7013C for delaying the signal. The delay caused by the inverter chain 7013C is adjusted so that the column address latch signal is activated after the internal address signal IAi shown in FIG. 56 is set.

Figure 59:
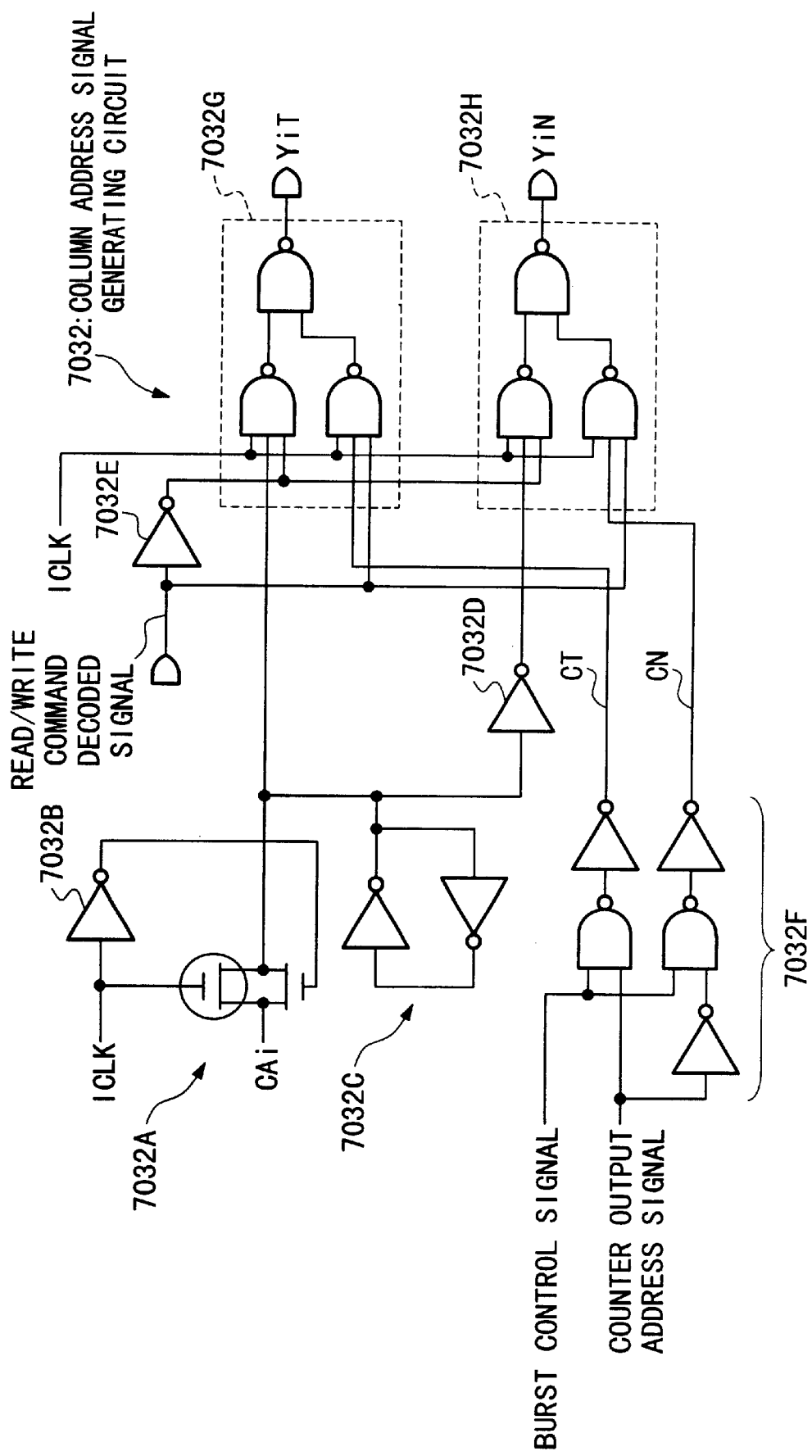
FIG. 59 shows a construction of a column address signal generating circuit shown in FIG. 56.

FIG. 59 shows the construction of the column address signal generating circuit 7032.

In the first stage of the column address signal generating circuit 7032, a transfer gate 7032A for transferring the address signal CAi from the receiver circuit 7002 is provided. The internal clock signal ICLK is input into the gate of a P-type transistor constituting the transfer gate 7032A. Further, the internal clock signal ICLK is inverted by an inverter 7032B, and is input into the gate of an N-type transistor constituting the transfer gate 7032A. When the internal clock signal ICLK is at the L level, the transfer gate 7032A becomes conductive, and transfers the address signal CAi. That is, the column address signal generating circuit 7032 does not latch the column address signal, and directly generates the pulse of the column address signal from the address signal CAi, the read/write command decoded signal, and the internal clock signal ICLK A flip-flop 7032C is connected to the output terminal of the transfer gate 7032A, and stores the transferred address signal CAi. An inverter 7032D is connected to the output terminal of the transfer gate 7032A, and inverts the transferred address signal CAi. The output terminal of the transfer gate 7032A is connected to one input terminal of a gate circuit 7032G as a selector, and the output terminal of the inverter 7032D is connected to one input terminal of a gate circuit 7032H.

The column address signal generating circuit 7032 further includes a gate circuit 7032F for outputting complementary signals, which are a positive phase signal CT and a negative phase signal CN with respect to the counter output address signal, according to a burst control signal which is activated in the burst mode. The positive phase signal CT with respect to the counter output address signal is input into the other input terminal of the gate circuit 7032G, and the negative phase signal CN is input into the other input terminal of the gate circuit 7032H. An inverter 7032E generates an inverted signal of the read/write command decoded signal, and the positive phase signal and the inverted signal are input into the gate circuits.

According to the read/write command decoded signal, the gate circuits 7032G and 7032H select as the address signals YiT and YiN which are a pair of complementary signals, and output one of a pair of the address signal CAi, which appears at the output terminal of the transfer gate 7032A, and the inverted signal thereof, and a pair of the positive phase signal CN and the negative phase signal CT with respect to the counter output address signal, according to the internal clock signal ICLK.

In this embodiment, the gate circuits 7032G and 7032H have the function of the selector, and also as the gate circuit which allows the address signal CAi to pass according to the internal clock signal ICLK. That is, the column address signal generating circuit 7032 receives the external address signal CAi, allows the address signal CAi according to the internal clock signal ICLK, and generates the internal address signals YiT and YiN.

Figure 60:
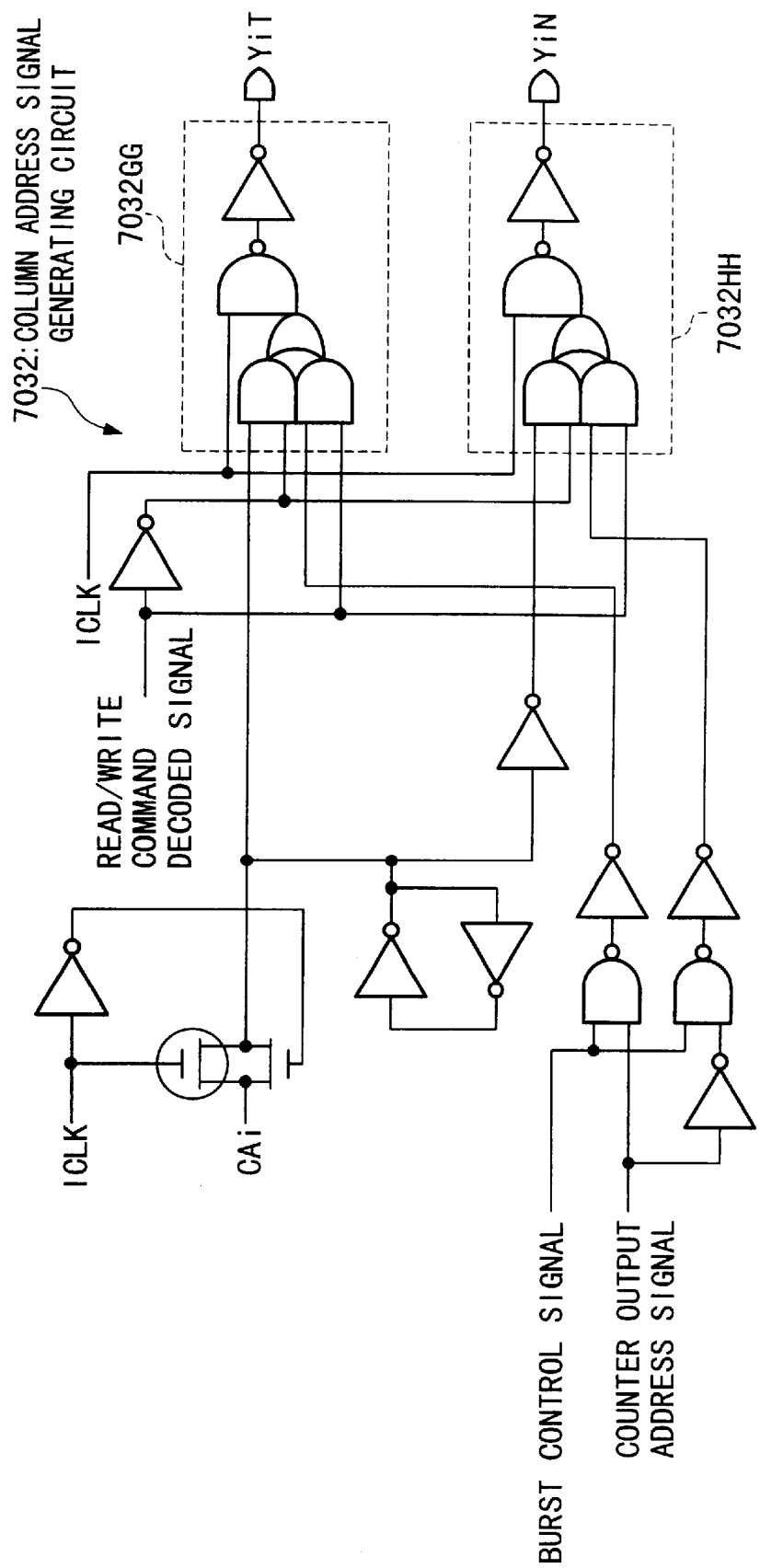
FIG. 60 shows another example of the construction of the column address signal generating circuit shown in FIG. 59.

FIG. 60 shows gate circuits 7032GG and 7032HH which have the same functions as the gate circuits 7032G and 7032H shown in FIG. 59. This invention is not limited to these embodiments, and may employ other gate circuits which allow the address signal CAi according to the internal clock signal ICLK.

Figure 61:
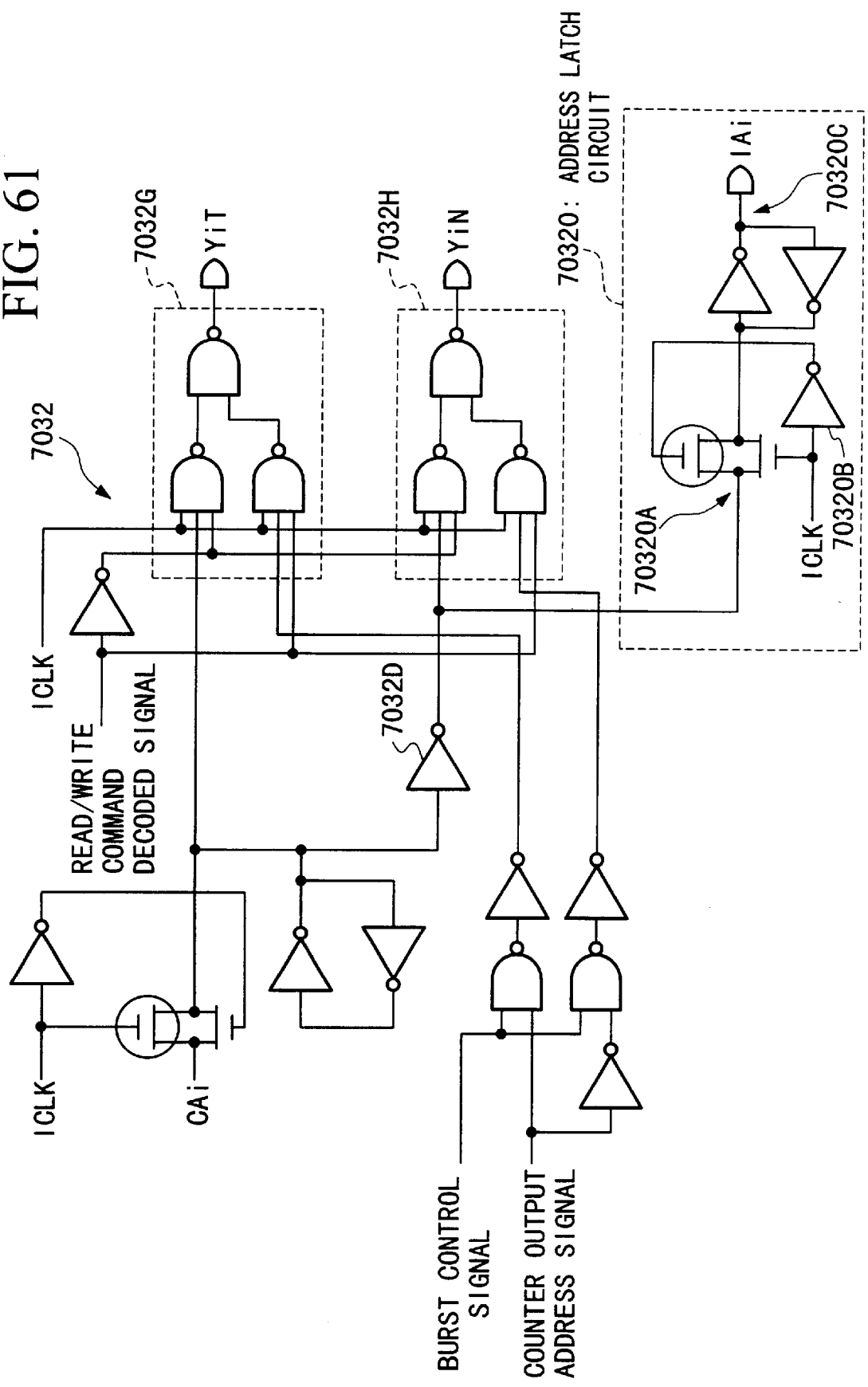
FIG. 61 shows a construction in which an address latch circuit is added to the column address signal generating circuit shown in FIG. 59.

FIG. 61 shows the construction in which an address latch function is added to the column address generating circuit 7032 shown in FIG. 59. As described below, according to the construction shown in FIG. 59, the internal address signals YiT and YiN are pulses which reflect the internal address signal ICLK. To obtain the constant internal address signal, an address latch circuit 70320 may be provided at the output terminal of the inverter 7032D in parallel to the gate circuits 7032G and 7032H.

Figure 62:
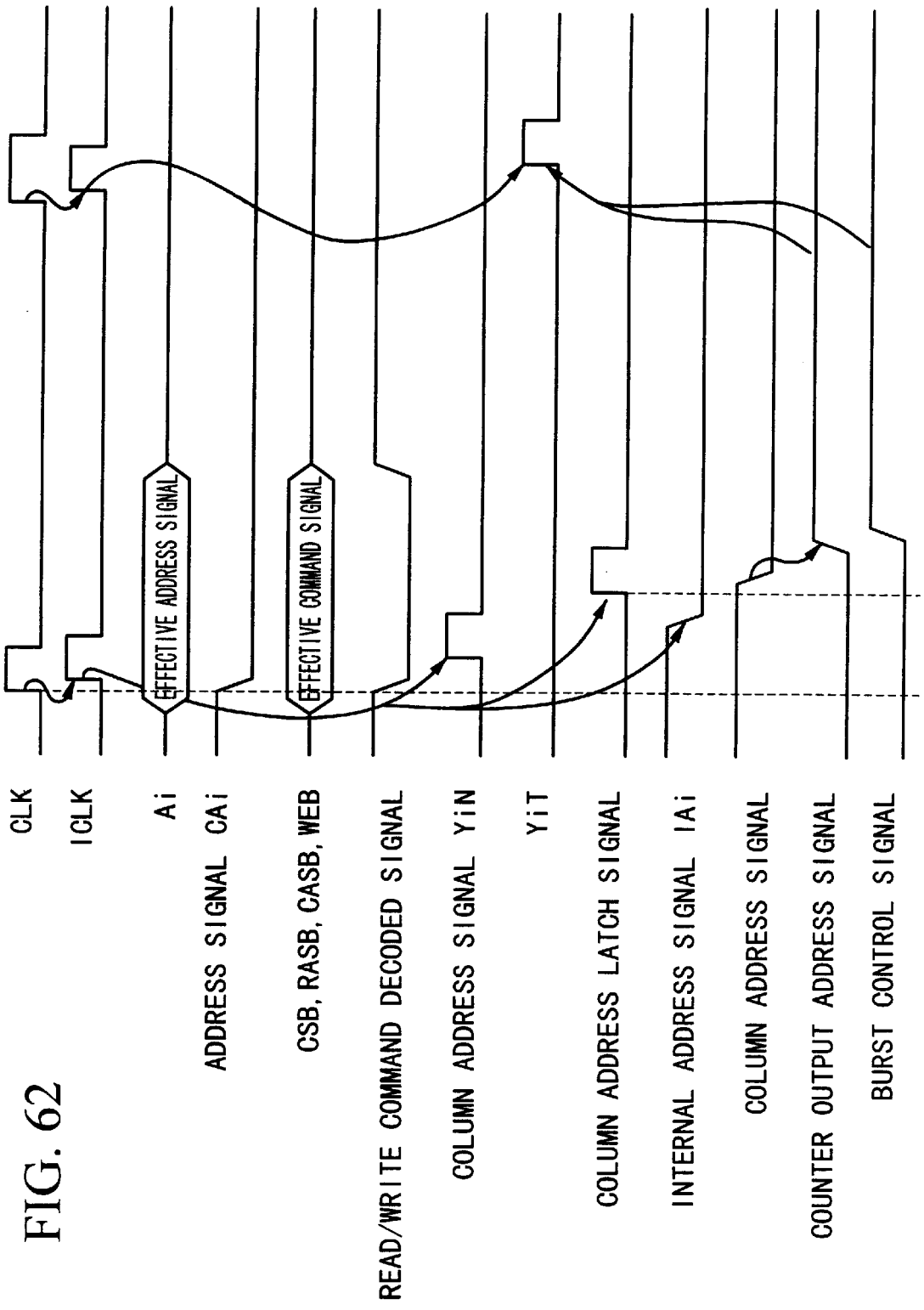
FIG. 62 is a waveform chart for explaining the operation of the internal address generating circuit system shown in FIG. 59.

The operation of the internal address generating circuit system shown in FIGS. 56 to 59 for generating the column address signals YiT and YiN will be explained with reference to the waveform chart of FIG. 62.

The internal clock signal generating circuit 7010 detects the rising edge of the external clock signal CLK, and generates the internal clock signal ICLK having a predetermined pulse width. The receiver circuit 7002 receives the external address signal Ai, and outputs the address signal CAi to the column address signal generating circuit 7032. The command decoding circuit 7011 decode the control signals CCS (CSB), CRAS (RASB), CCAS (CASB), and CWE (WEB), which are input through the receiver circuits 7003 to 7006, and outputs the read/write command decoded signal which reflects the logic of the control signals.

The column address signal generating circuit 7032 receives the address signal CAi, and allows the address signal CAi to pass through only according to the internal clock signal ICLK only when the read/write command decoded signal is set. In the embodiment shown in FIG. 62, the pulse signal (having the same pulse width as the internal clock signal ICLK and having the logic value of the address signal CAi, that is, Ai) is output. The signal period of the signal YiN depends on the pulse width of the internal clock signal ICLK In other words, only when the control signal is set, the internal clock signal ICLK appears as the address signal YiN. Whether the pulse of the internal clock signal ICLK appears in the address signal YiT or YiN depends on the logic state of the address signal CAi (address signal Ai).

Then, according to the read/write command decoded signal from the command decoding circuit 7011 and the internal clock signal ICLK, the read/write signal generating circuit 7013 outputs the pulse of the column address latch signal. This signal also reflects the internal clock signal ICLK.

The address latch circuit 7020 uses the internal clock signal ICLK as the trigger, latches the address signal CAi, and outputs the address signal IAi. The column address latch circuit 7030 uses the address signal as the trigger, and latches the address signal, which is latched in the address latch circuit 7020, as the column address signal. Next, the counter circuit 7031 outputs the counter output address signal. Then, the burst control signal is activated, and the counter circuit 7031 generates the continuous column address signal started from the address latched in the column address latch circuit 7030.

According to the internal address generating circuit system, the column address signal generating circuit 7032 receives the address signal to be output in advance, and immediately allows the signal to pass through when the internal clock signal ICLK. Therefore, a delay is caused by the gate circuits 7032G and 7032H, shown in FIG. 59, only in the signal transfer path between the input of the internal clock signal ICLK and the output of the column addresses YiT and YiN. Thus, as the internal clock signal ICLK is input, the internal address signals YiT and YiN are quickly output.

While the embodiment includes the column address latch circuit for generating the column address in the next cycle for the burst access, a column address may be provided if necessary. The construction for the speeding up of the address generation, which is described above, is not always applied to all the address, and may be applied to a part of addresses which cause a delay in access time.

Another embodiment of the construction of the internal address generating circuit system will be explained.

Figure 63:
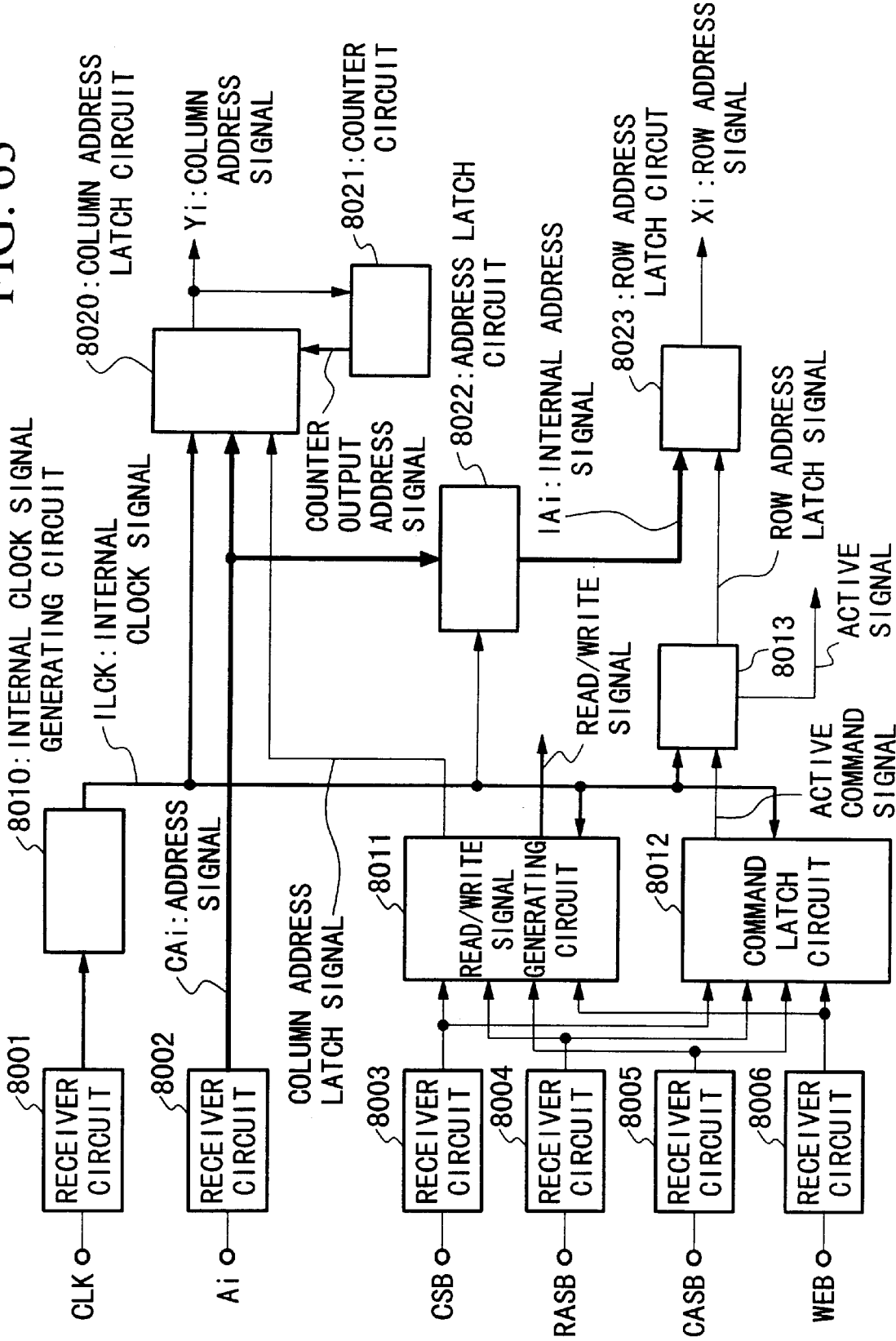
FIG. 63 is a block diagram showing another embodiment of the internal address generating circuit system (for accelerating a control signal).

FIG. 63 shows the entire construction. While in the above-described embodiment shown in FIG. 56 achieves the speeding up of the operation for accepting the address signal with respect to the clock signal, the embodiment shown in FIG. 63 achieves the speeding up of the address signal by accelerating the operation of accepting the control signals with respect to the clock signal.

In FIG. 63, receiver circuits 8001 to 8006 are the same as the above-described receiver circuits 7001 to 7006, the internal clock signal generating circuit 8010 is the same as the above-described internal clock generating circuit 7010, and the address latch circuit 8022 is the same as the above-described address latch circuit 7020. Further, the command latch circuit 8012 is the same as the above-described command latch circuit 7012, the active signal generating circuit 8013 is the same as the above-described active signal generating circuit 7014, and the row address latch circuit 8023 is the same as the above-described row address latch circuit 7033.

A read/write signal generating circuit 8011 is the main feature of the embodiment, and generates the pulse of the column address latch signal at high speed from the control signal according to the internal clock signal ICLK. The column address latch circuit 8020 uses the column address latch signal as the trigger, latches the address signal CAi, and outputs it as the column address signal Yi. The counter circuit 8021 generates the continuous addresses in the burst mode.

Figure 64:
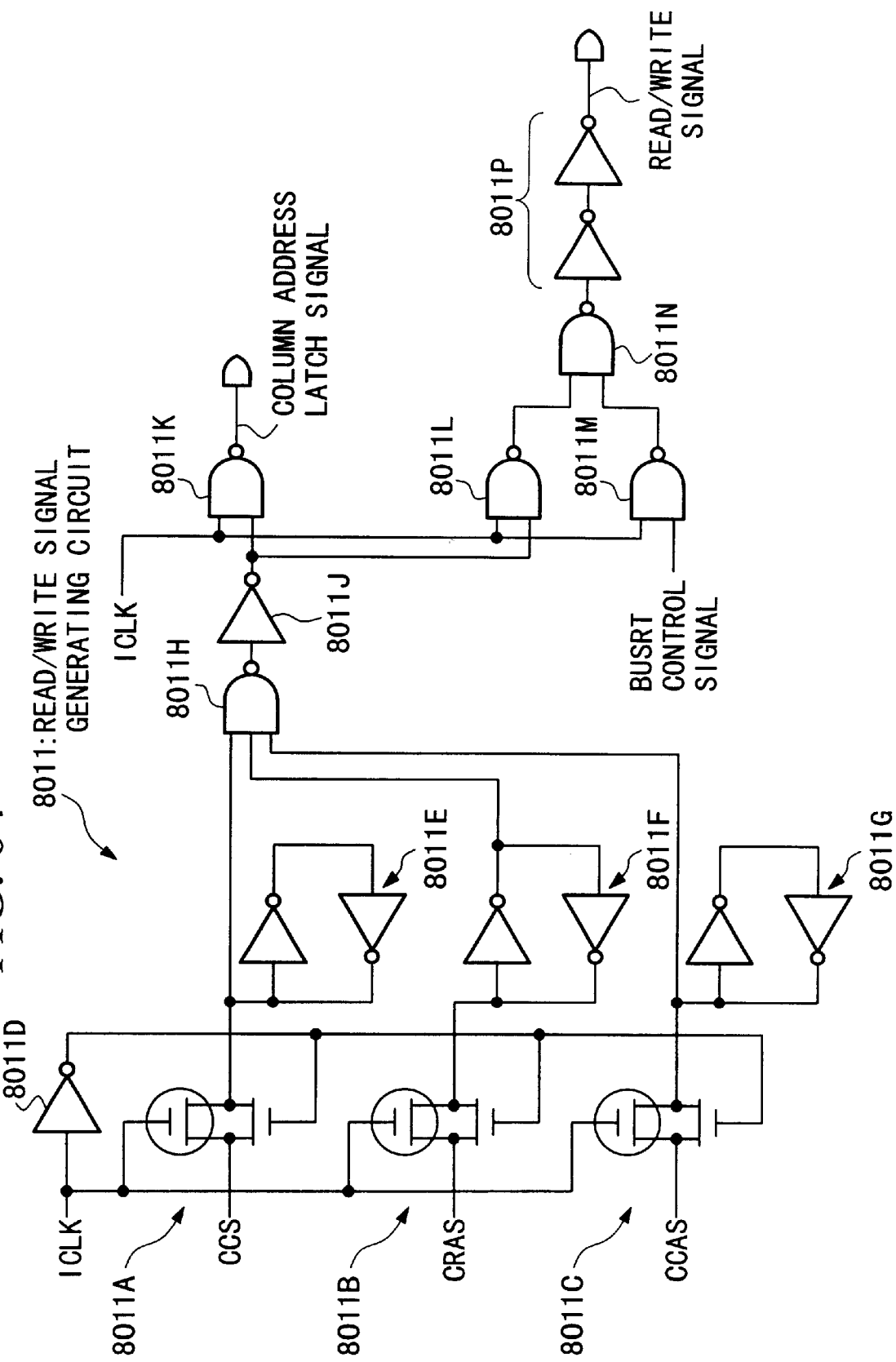
FIG. 64 shows a construction of the read/write signal generating circuit shown in FIG. 63.

FIG. 64 shows the construction of the read/write signal generating circuit 8011. The read/write signal generating circuit 7032 has a construction similar to that of the column address signal generating circuit 7032 shown in FIG. 59. According to the internal clock signal ICLK, the transfer gates 8011A to 8011C become conductive, and transfer the control signals CCS (CSB), CRAS (RASB), and CCAS (CASB). That is, the read/write signal generating circuit 8011 does not latch the control signal, and directly generates the column address latch signal from the signal into which the control signals are decoded (from the signal which reflects the logic state of the control signals) according to the internal clock signal ICLK. Thus, the column address latch signal is quickly generated.

Flip-flops 8011E to 8011G are connected to the output terminals of the transfer gates. The output terminals of the transfer gates 8011A to 8011C are connected to the input terminals of a NAND circuit 8011H. According to the internal clock signal ICLK, a NAND circuit 8011K allows the signal, which is output from the NAND circuit 8011H and is inverted by an inverter 8011J, to pass through, and thus functions as a gate circuit for generating the column address latch signal. NAND circuits 8011L and 8011M, and a buffer 8011P constitute a circuit for generating the read/write signal from the burst control signal.

Figure 65:
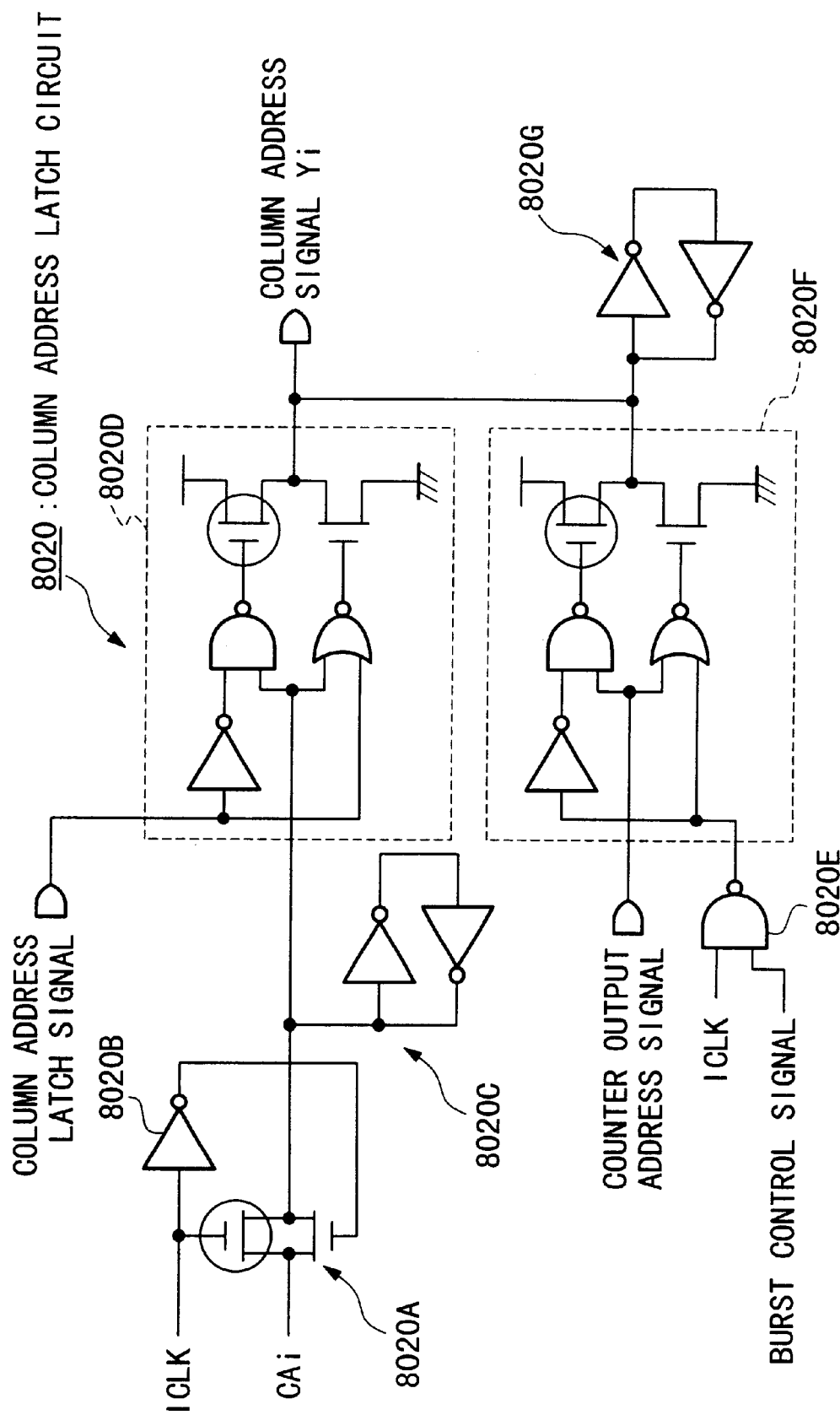
FIG. 65 shows a construction of the column address latch circuit shown in FIG. 63.

FIG. 65 shows the construction of a column address latch circuit 8020. The column address latch circuit 8020 includes a transfer gate 8020A for accepting the address signal CAi according to the internal clock signal ICLK, and an inverter 8020B. The output terminal of the transfer gate 8020A is connected to a flip-flop 8020C. Further, the output terminal of the transfer gate 8020A is connected to the input terminal of a tristate buffer circuit 8020D whose output impedance state is controlled by the column address latch signal.

The internal clock signal ICLK and the burst control signal are input into a NAND circuit 8020E, and the output therefrom is input into a tristate buffer circuit 8020F whose output impedance state is controlled by the counter output address signal. The outputs from the tristate buffer circuits 8020D and 8020F are connected in common to a flip-flop 8020G.

According to the column address latch circuit 8020, when the column address latch signal makes the buffer circuit 8020D active, the address signal CAi is output as the column address signal Yi. Then, when the buffer 8020D is activated, the output from the buffer 8020D enters the high impedance state, and the column address Yi is held in the flip-flop 8020G. That is, based on the column address signal Yi as the trigger, the address signal CAi is latched, and is output as the column address signal Yi. Similarly, in the burst mode, the counter output address signal is latched, and is output as the column address signal Yi.

This embodiment includes, in parallel to the column address latch circuit 8020 for latching the column address, the address latch circuit 8022 for latching the other addresses (which do not require being quickly generated). The address signal CAi may be input in common to the address latch circuits, in a manner similar to the address latch circuit 70320 shown in FIG. 61.

Figure 66:
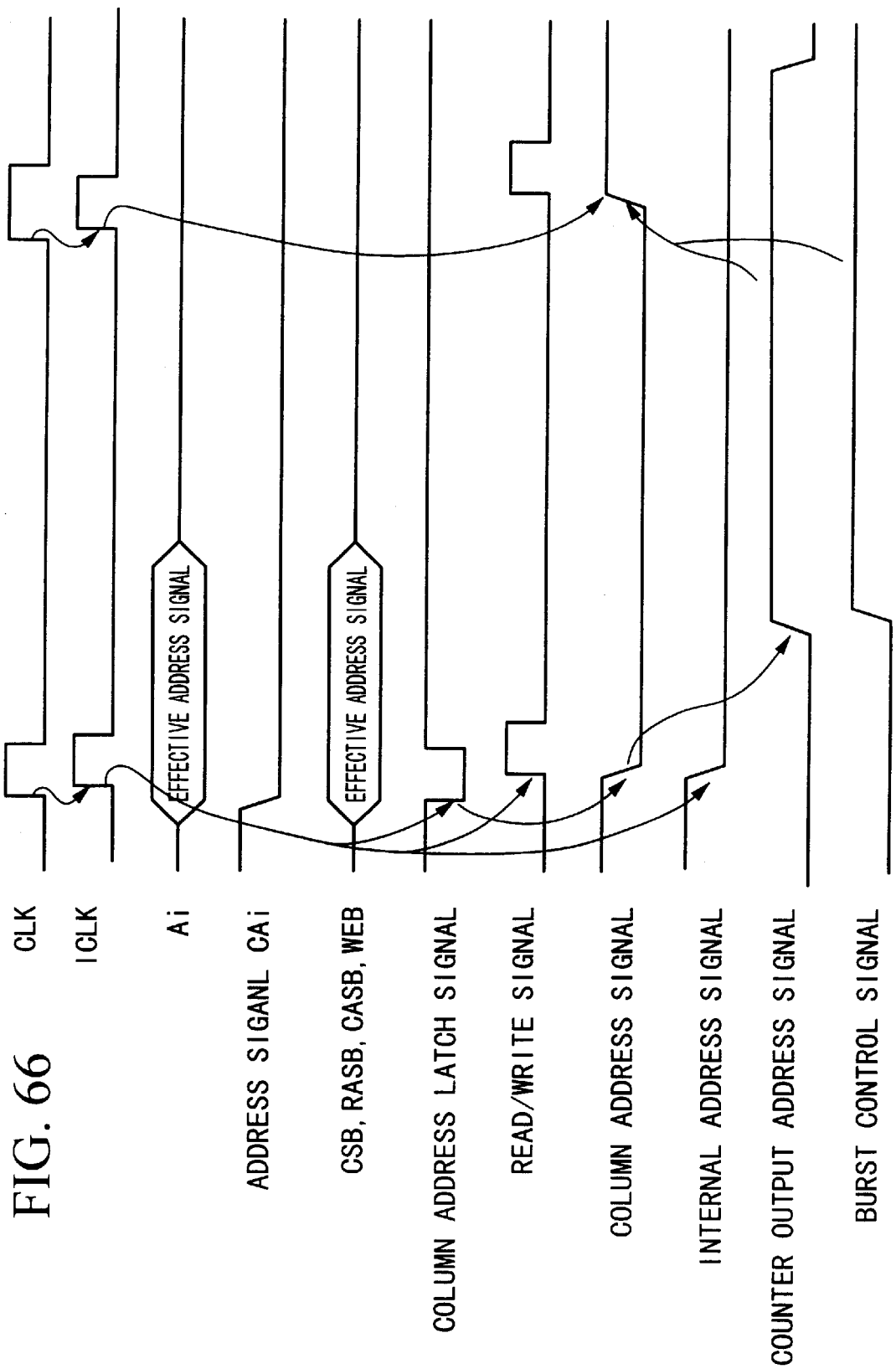
FIG. 66 is a waveform chart for explaining the operation of the internal address generating circuit system shown in FIG. 63.

Only the main feature of the operation of the internal address generating circuit system shown in FIGS. 63 to 65 will be explained with reference to the waveform chart of FIG. 66.

According to this construction, from the control signals CSB, RAB, CAB, WEB, and the internal clock signal ICLK, the pulse of the column address latch signal (which has the same pulse width as the internal clock signal ICLK and have the logic value which reflects the logic state of the control signals) is generated at high speed. The column address latch circuit 8020 uses the column address latch signal as the trigger, latches the address signal CAi, which is input beforehand, and outputs the address signal CAi as the column address signal Yi. This column address signal Yi is at the constant level. Similarly, in the burst mode, the column address latch circuit 8020 successively generates the column address signals from the counter output address signal and the burst control signal.

According to the embodiment, the internal address signal is set at high speed, the read/write signal is also set at high speed, and thus the access time for data read/write operation is shortened.

SRAM Column Decoder and Data Control Circuit Construction

Figure 67:
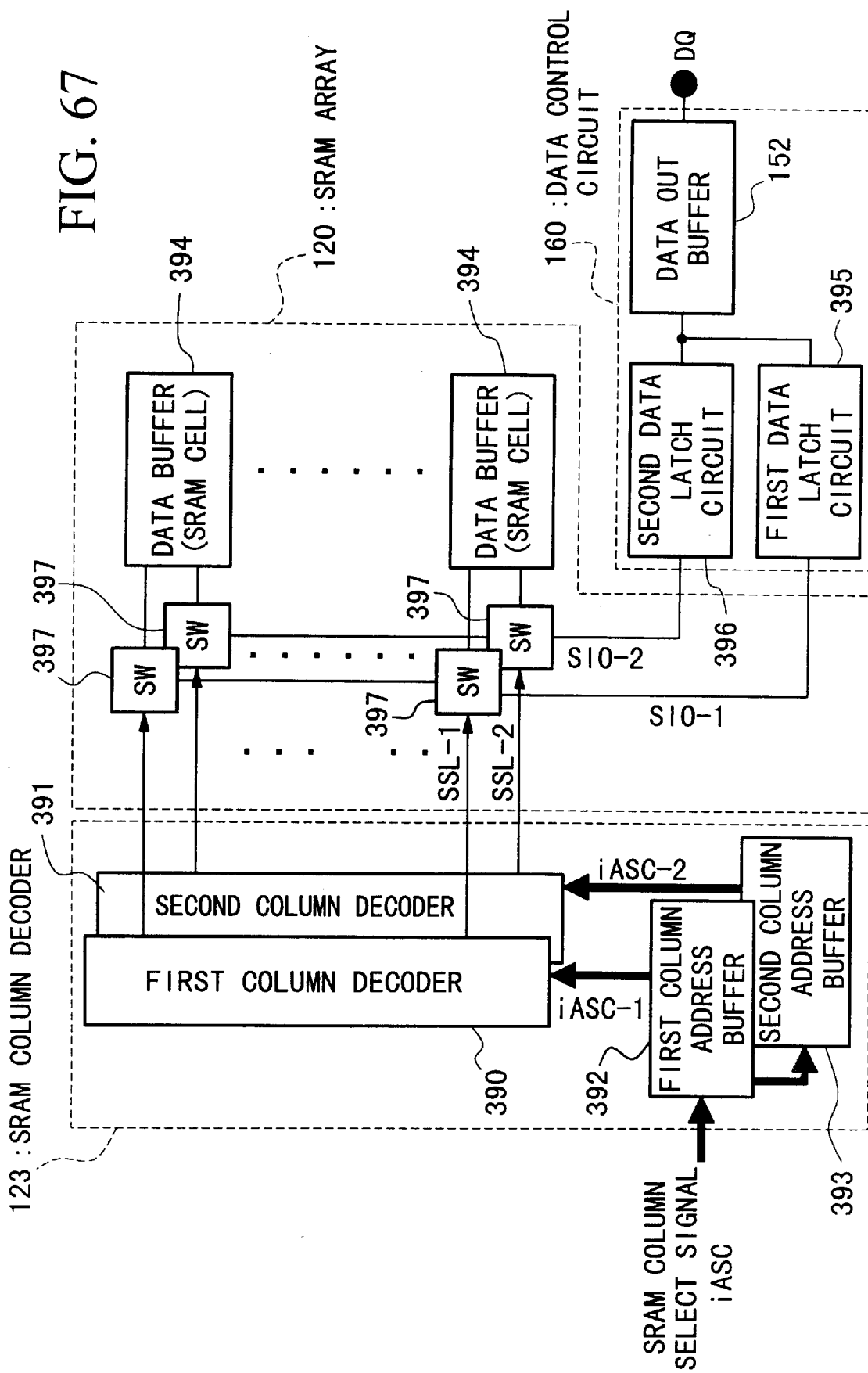
FIG. 67 is a block diagram showing the SRAM row decoder, the data control circuit and the DRAM array shown in FIG. 1.

FIG. 67 shows an example of construction of the SRAM column decoder 123 and the data control circuit. The circuit construction includes a first column decoder 390 and a second column decoder 391, and the SRAM column selection signal IASC is transmitted to these column decoders sequentially. In order to operate the first and second column decoders by one address selection data IASC, the first and second column decoders are connected to a first column address buffer 392 and a second column address buffer 393, respectively. Selection signal lines SSL from the first and second column decoders are juxtaposed in column direction, and a first data latch circuit 395 associated with a data input/output line SIO and a second data latch circuit 396 associated with a data input/output line SIO are also provided correspondingly.

Figure 68:
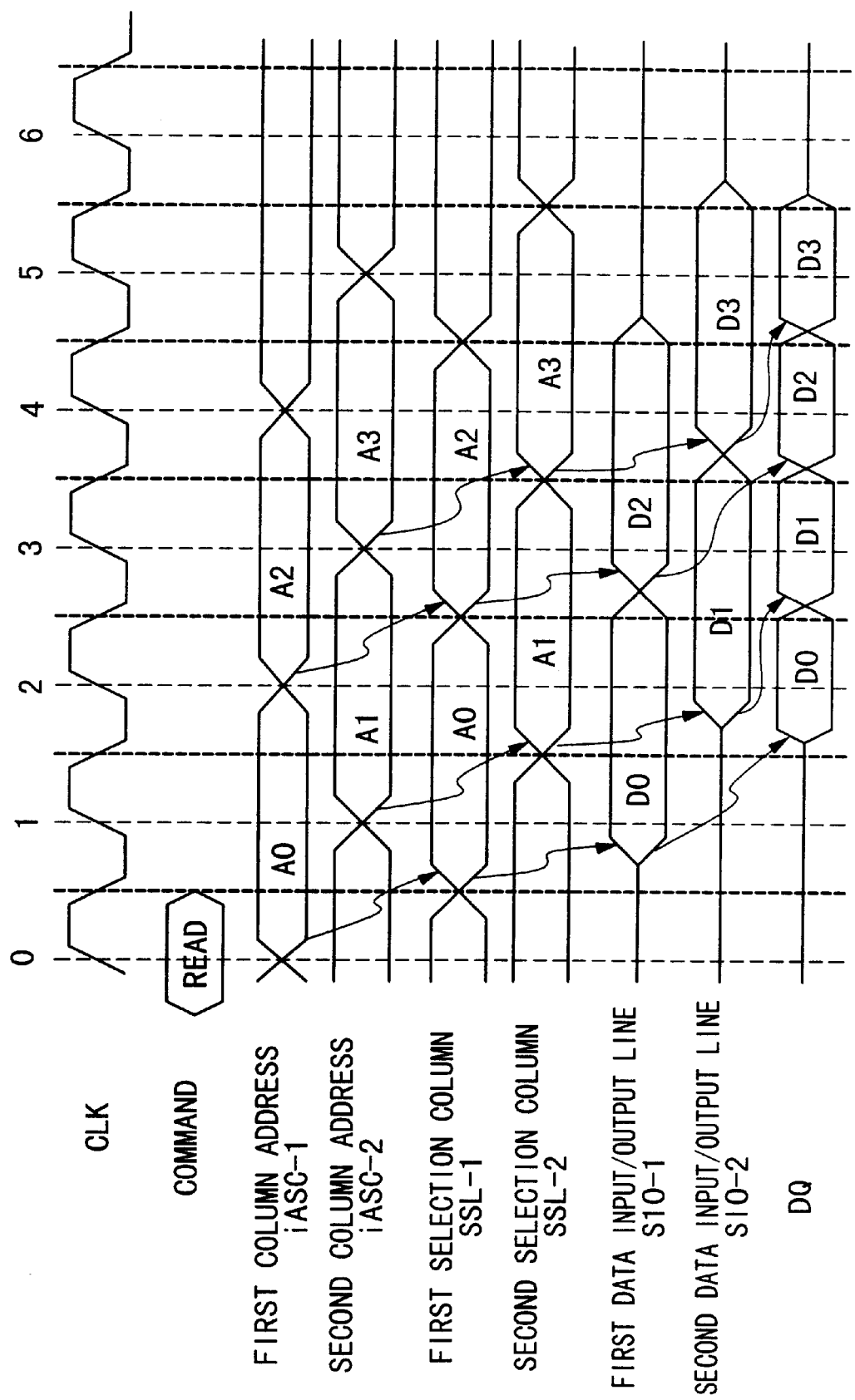
FIG. 68 shows signal waveforms showing the operation of the SRAM row decoder, the data control circuit, and the SRAM array shown in FIG. 67.

FIG. 68 shows an internal operation timing of the SRAM column decoders. The respective column address buffers perform the control of column decoder selection signals (iASC-1 and iASC-2) sequentially on the back of the CLK signal. That is, when the column address selection is successively performed as in the burst mode, the first column decoder and the second column decoder operate alternately. Data of the columns (SSL-1 and SSL-2) selected by the respective column decoders are output sequentially to the corresponding data input/output lines (SIO-1 and SIO-2). These data input/output lines operate with a cycle time which is twice a request cycle time, and the first data latch circuit 395 and the second data latch circuit 396 store the data temporarily. These two sets of data are synthesized upstream to the data out buffer and output from the data input/output terminals DQ in the requested cycle time.

With using the above mentioned construction, it is possible to increase the cycle speed of the successive data output and/or successive data write without increasing the internal operation cycle speed. This is also true in the synchronous DRAM of DOUBLE DATA RATE (DDR).

Another Construction of SRAM Portion including Data Input/Output Terminals

Figure 69:
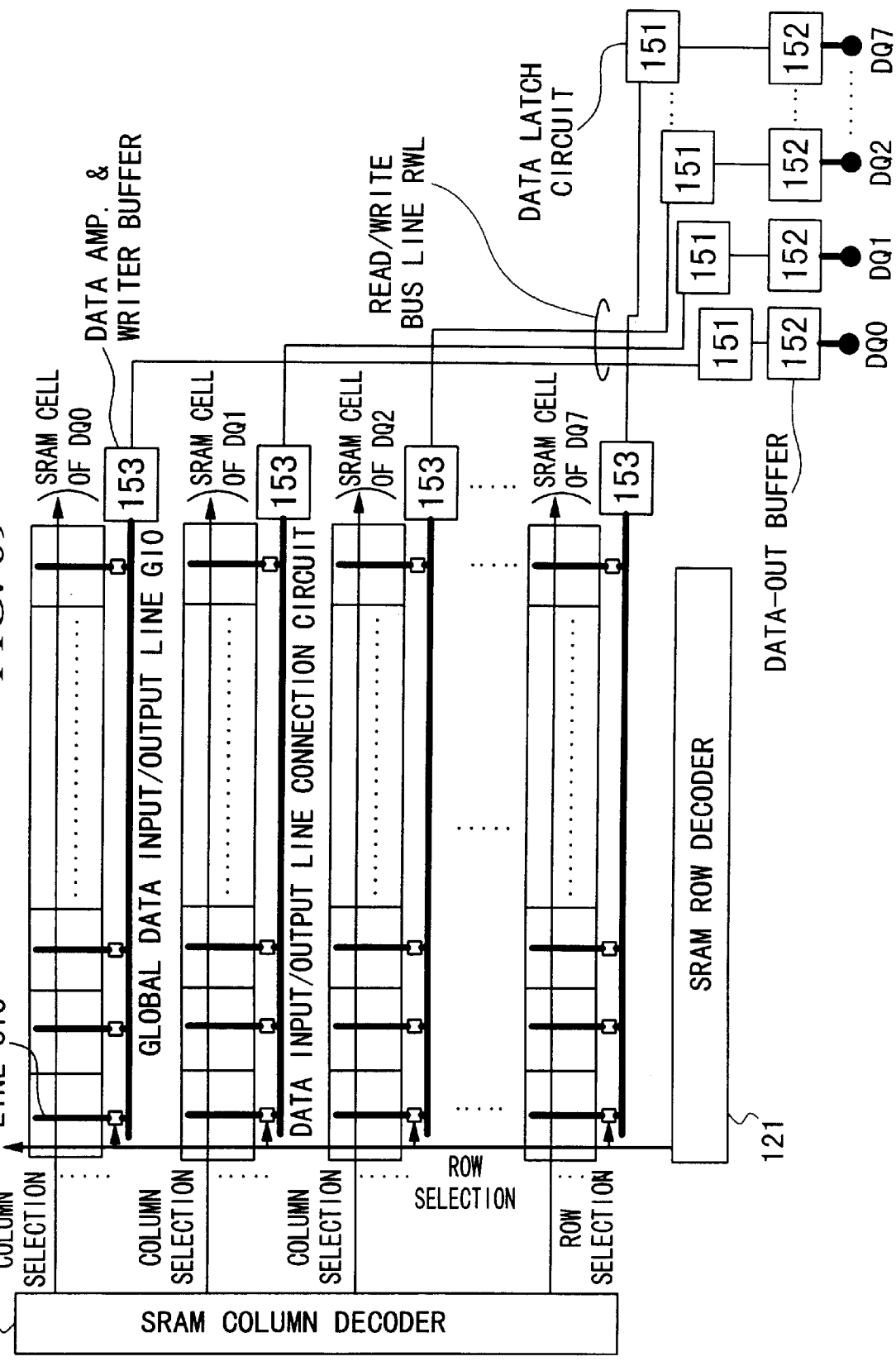
FIG. 69 shows a concrete example of a construction of the SRAM portion and the data input/output terminal.
Figure 70:
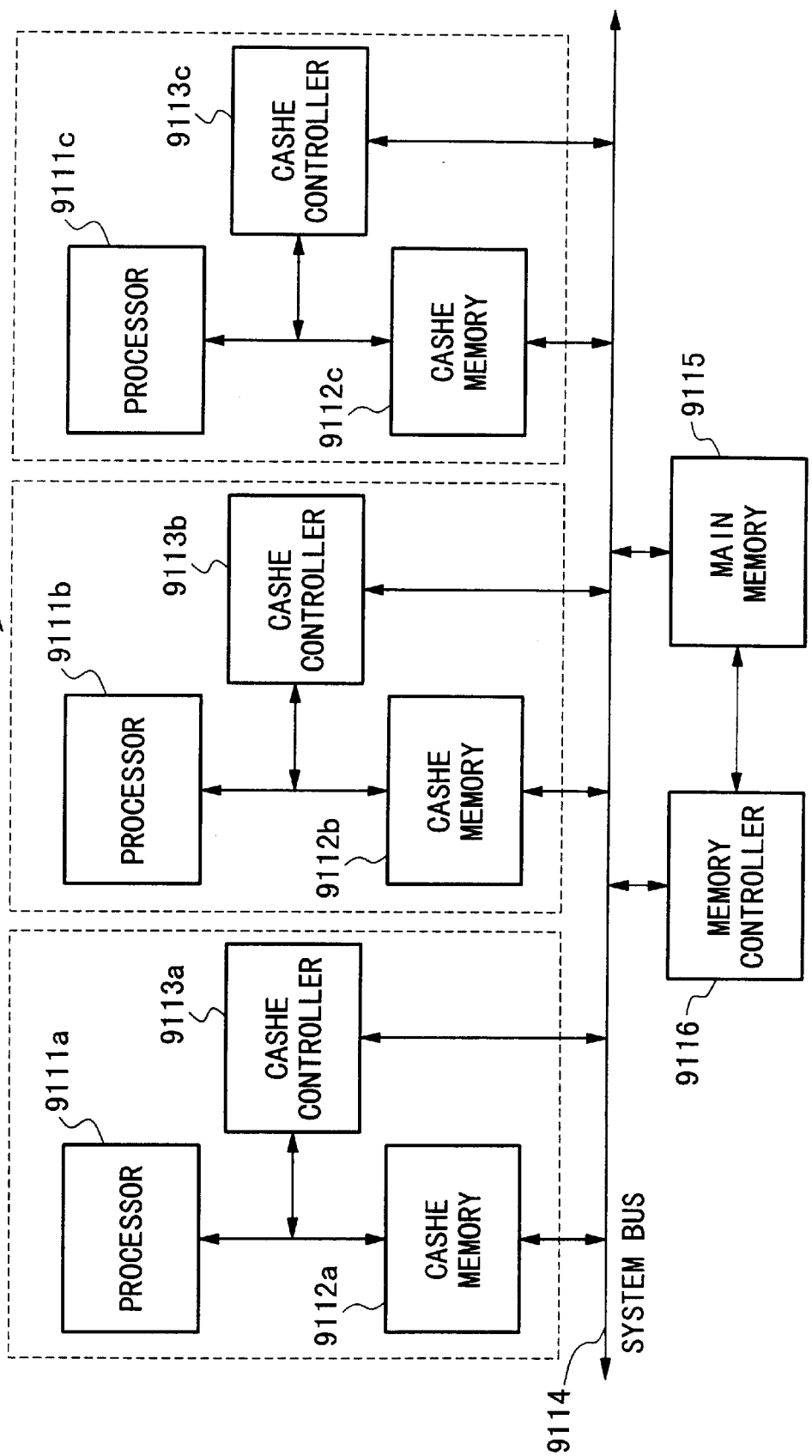
FIG. 70 is a block diagram schematically showing a construction of the memory system having a plurality of processing devices.
Figure 71:
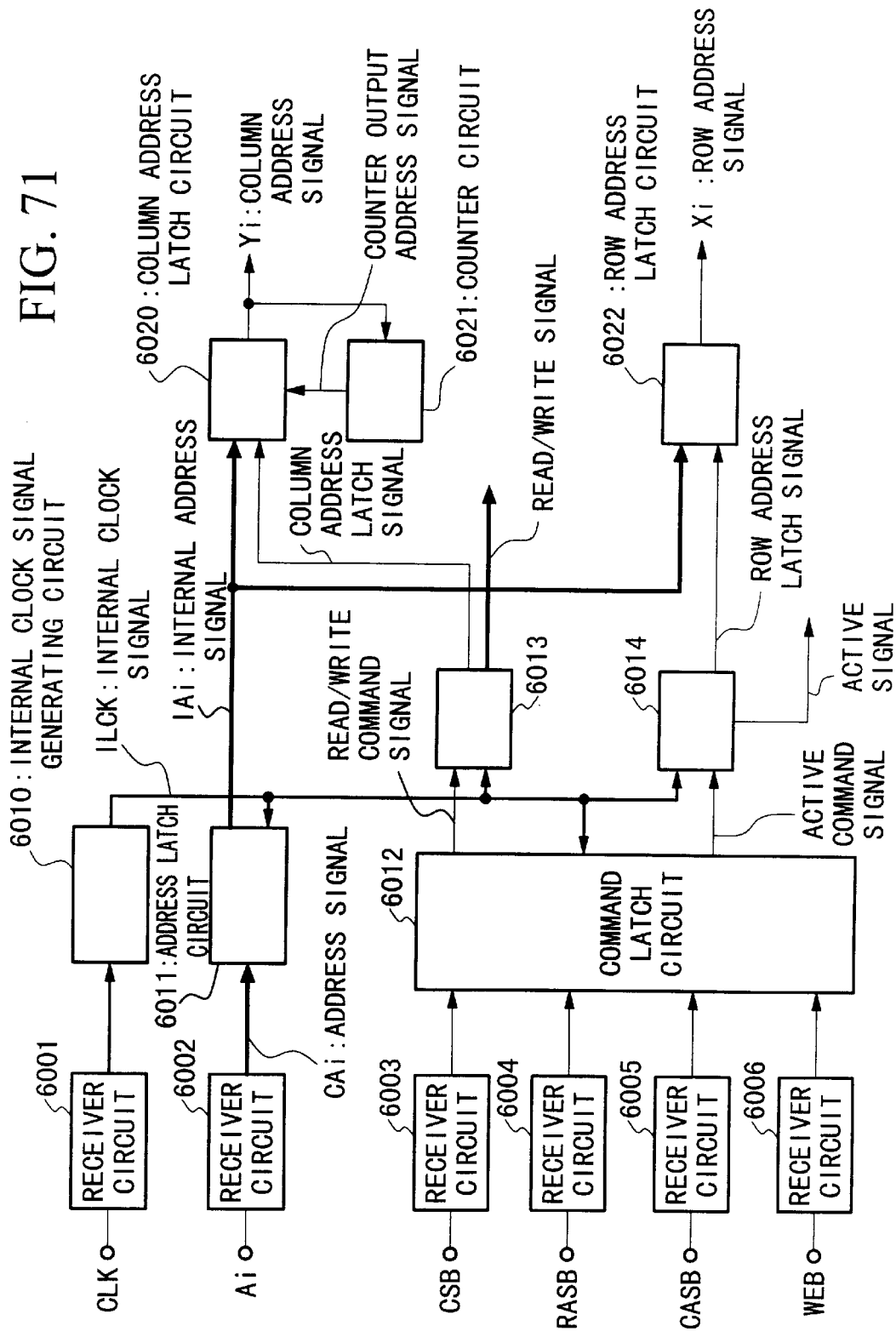
FIG. 71 shows a conventional internal address generating circuit system.
Figure 72:
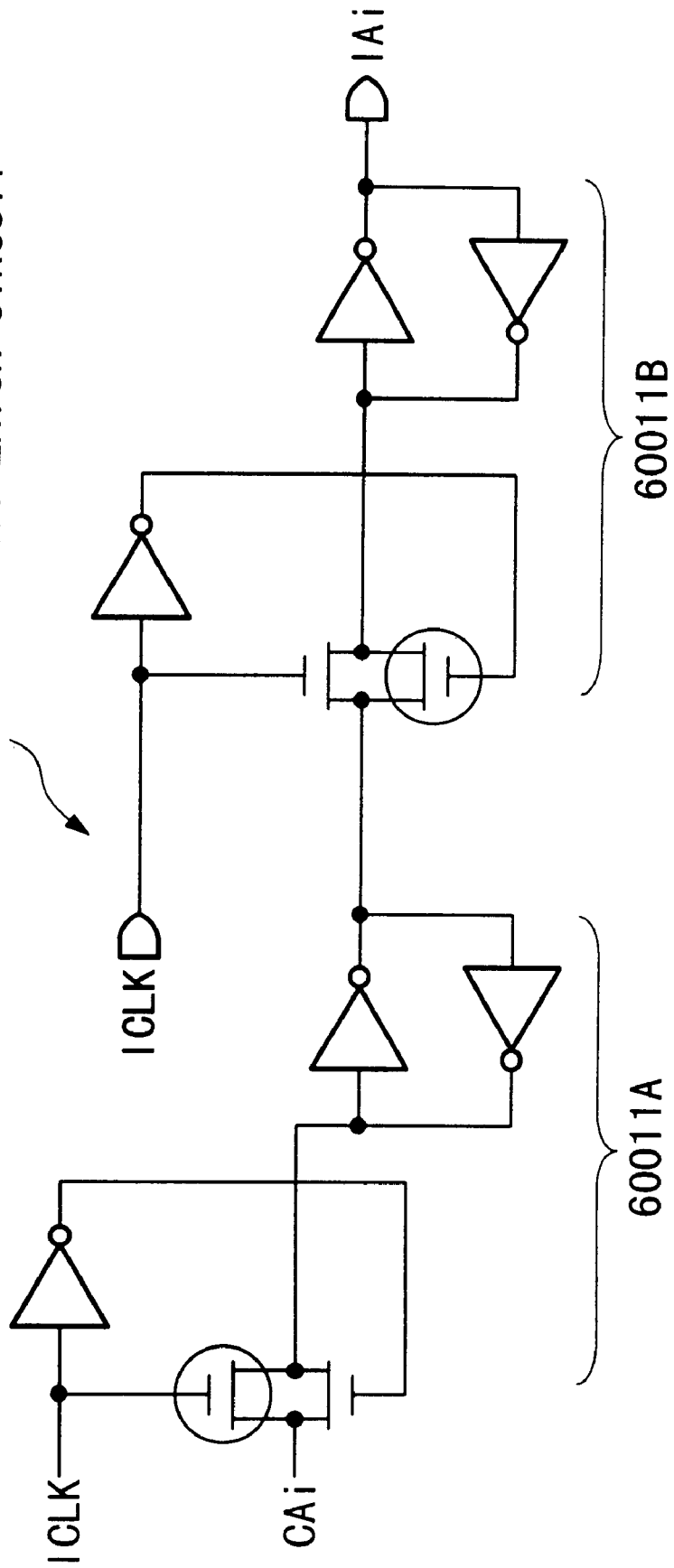
FIG. 72 shows a construction of the address latch circuit shown in FIG. 71.
Figure 73:
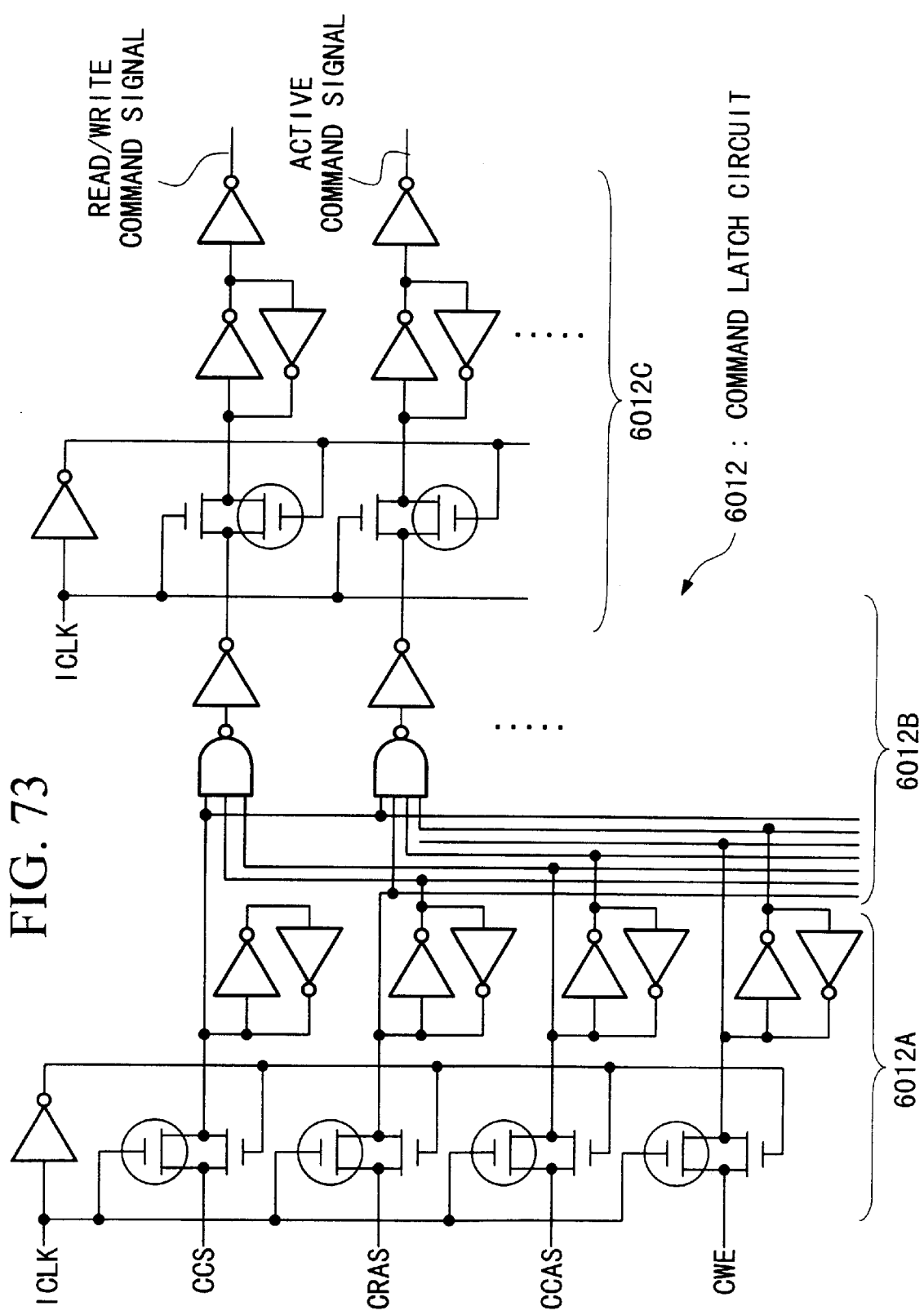
FIG. 73 shows a construction of the command latch circuit shown in FIG. 71.
Figure 74:
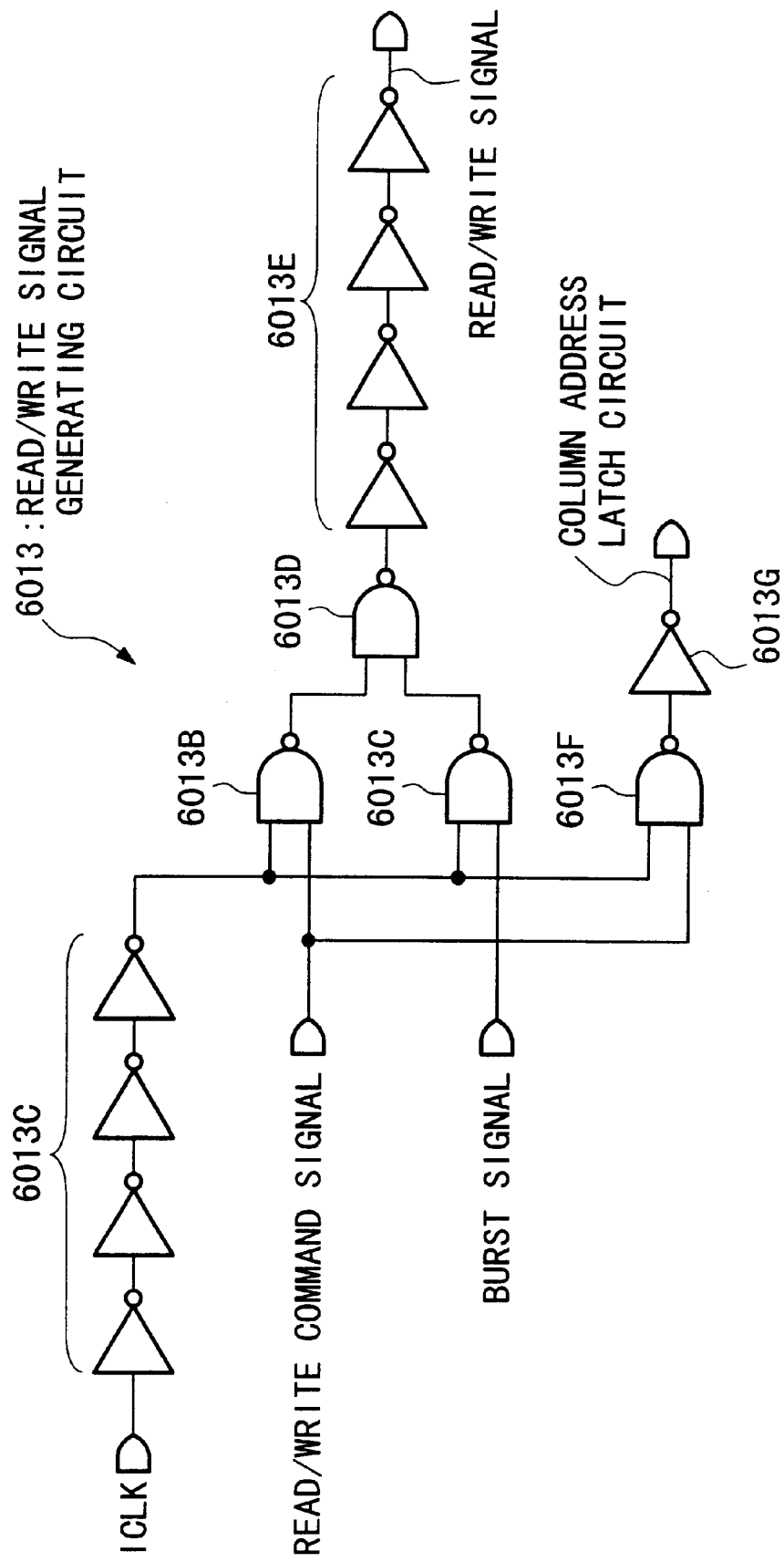
FIG. 74 shows a construction of the read/write signal generating circuit shown in FIG. 71.
Figure 75:
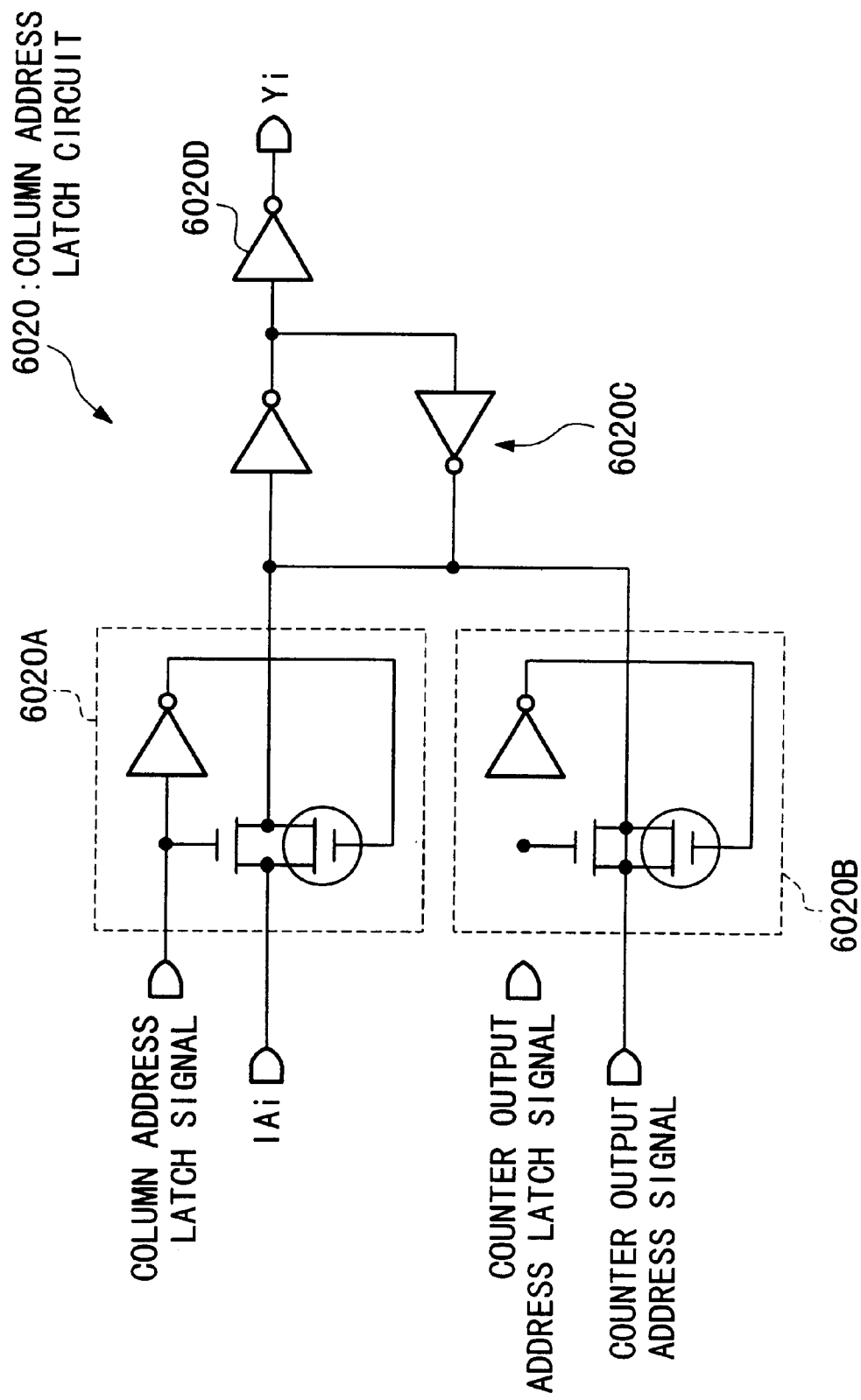
FIG. 75 shows a construction of the column address latch circuit shown in FIG. 71.
Figure 76:
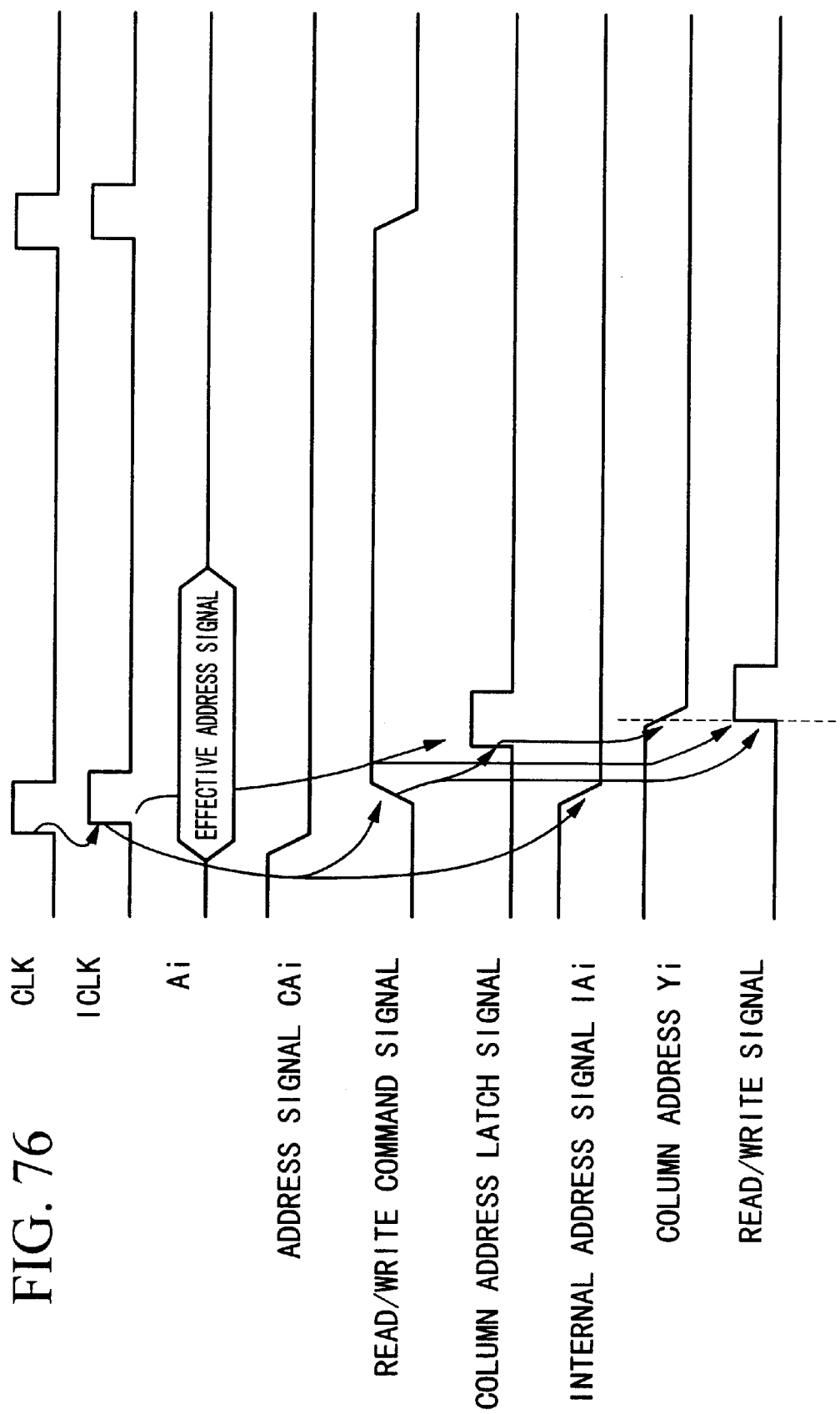
FIG. 76 is a waveform chart for explaining the operation of the conventional internal address generating circuit system shown in FIG. 71.

FIG. 69 schematically shows another example of construction of the SRAM portion including the data input/output terminals in a case where it has the x8-bit construction. In a case of the data output from the SRAM, data of the SRAM cells of a selected column are output to the respective data input/output lines SIO. The data input/output lines SIO of the selected row is connected to the global data input/output line GIO, and the data are sent to a corresponding data amplifier 153. Thereafter, the data pass through a read/write bus line RWL, a data latch circuit 151, and a data buffer 152 to the data input/output terminal DQ. Since the SRAM portion has the x8-bit construction, 8 sets of data input/output circuits operate simultaneously and output 8 data. Data are written in the SRAM cells along a path reverse to the data read path.

With using this circuit construction having the data input/output lines SIO and the global data input/output lines GIO, the SRAM row selection of every SRAM cell becomes unnecessary, the load on the SRAM row selection signal lines is reduced, and a high speed data input/output of the SRAM cells becomes possible. Further, by using this construction, the load on the data input/output lines SIO is not increased, thus realizing high speed operation even when the number of rows of the SRAM cells is increased.

According to a first aspect of the invention, the semiconductor integrated circuit device detects the change in the external clock signal, generates the internal clock signal having a predetermined pulse width, receives the external signal, and allows the external signal to pass through, according to the internal clock signal, to thereby generate the internal signal having the predetermined pulse width. Therefore, the device can receive an external address and various external control signals according to the external clock signal at high speed, and can generate the internal address at high speed.

According to a second aspect of the invention, the semiconductor integrated circuit device can transfer the data bi-directionally between a main memory and a sub memory, detects the change in the external clock signal, generate the internal clock signal having a predetermined pulse width, receive the external address signal, and allow the address signal to pass through, according to the internal clock signal, to thereby generate the address signal for the access to the main memory. Therefore, the device can quickly respond to access requests from a plurality of memory masters. Further, the device can receive the external address signal according to the external clock signal at high speed, and can generate the internal address at high speed.

According to a third aspect of the invention, the semiconductor integrated circuit device can transfer the data bi-directionally between a main memory and a sub memory, detect the change in the external clock signal, generate the internal clock signal having a predetermined pulse width, receive the external control signal, allow the signal, which reflects the logic state of the control signal, to pass through, according to the internal clock signal, generate the latch signal for latching the external address signal, and use the latch signal as the trigger to latch the address signal. Therefore, the device can quickly respond to access requests from a plurality of memory masters. Further, the device can receive the external control signal according to the external clock signal at high speed, and can generate the internal address at high speed.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A semiconductor integrated circuit device for accepting an external signal synchronously with an external clock signal, comprising:

an internal clock signal circuit for detecting a change in the external clock signal and generating an internal clock signal having a predetermined pulse width;

a latch circuit for receiving the external signal and the internal clock signal and latching the external signal for a period of time corresponding to the predetermined pulse width according to the internal clock signal; and an internal signal generating circuit for receiving the external signal from the latch circuit and the internal clock signal and generating an internal signal which reflects the logic of the external signal and has the predetermined pulse width, according to the internal clock signal.

2. A semiconductor integrated circuit device for accepting an external control signal synchronously with an external clock signal, comprising:

an internal clock signal circuit for detecting a change in the external clock signal and generating an internal clock signal having a predetermined pulse width;

a latch circuit for receiving the external control signal and the internal clock signal and latching the external control signal for a period of time corresponding to the predetermined pulse width according to the internal clock signal; and an internal control signal generating circuit for receiving the external control signal from the latch circuit and the internal clock signal and generating an internal control signal which reflects the logic of the external control signal and has the predetermined pulse width, according to the internal clock signal.

3. A semiconductor integrated circuit device according to claim 2, further comprising:

an external address signal latch circuit for receiving an external address signal and the internal clock signal and latching the external address signal for the period of time corresponding to the predetermined pulse width according to the internal clock signal; and an internal address signal generating circuit for receiving the external address signal from the external address latch circuit and the internal clock signal and generating an internal address signal which reflects the logic of the external address signal latched in said external address signal latch circuit, according to the internal control signal.

4. A semiconductor integrated circuit device according to claim 2, further comprising:

an external address signal latch circuit for receiving an external address signal and the internal clock signal and latching the external address signal for the period of time corresponding to the predetermined pulse width of the internal clock signal; and an internal address signal generating circuit for receiving the external address signal from the external address latch circuit and the internal clock signal and generating an internal address signal which reflects the logic of the external address signal latched in said external address signal latch circuit and which has the predetermined pulse width, according to the internal control signal.

5. A semiconductor integrated circuit device according to claim 3 or 4, further comprising:
- a first latch circuit for accepting the external address signal in parallel with said internal address signal generating circuit, and for latching the external address signal for the period of time corresponding to the predetermined pulse width, according to the internal clock signal; and
- a second latch circuit for latching a signal having the phase opposite to that of the external address signal latched in said first latch circuit, according to the internal clock signal.

6. A semiconductor integrated circuit device according to claim 3 or 4, further comprising:
- a latch circuit for latching a signal having the phase opposite to that of the external address signal latched in said internal address signal generating circuit, according to the internal clocks signal.

* * * * *